(12) United States Patent
Fujita

(10) Patent No.: US 9,704,893 B2
(45) Date of Patent: Jul. 11, 2017

(54) SEMICONDUCTOR DEVICE AND ELECTRONIC DEVICE

(71) Applicant: Semiconductor Energy Laboratory Co., Ltd., Atsugi-shi, Kanagawa-ken (JP)

(72) Inventor: Masashi Fujita, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/227,009

(22) Filed: Aug. 3, 2016

(65) Prior Publication Data

US 2017/0040344 A1    Feb. 9, 2017

(30) Foreign Application Priority Data

Aug. 7, 2015   (JP) .................................. 2015-157174
Jun. 23, 2016  (JP) .................................. 2016-124397

(51) Int. Cl.
  *G09G 3/00*   (2006.01)
  *H01L 27/32*  (2006.01)
  *H01L 27/12*  (2006.01)

(52) U.S. Cl.
  CPC ........ *H01L 27/124* (2013.01); *H01L 27/1225* (2013.01); *H01L 27/1255* (2013.01)

(58) Field of Classification Search
  CPC ......... G09G 3/3233; G09G 2300/0861; G09G 2300/0819; G09G 2310/0286; G09G 2300/0852
  USPC .................................................... 345/75, 204
  See application file for complete search history.

(56) References Cited

U.S. PATENT DOCUMENTS

| | | | |
|---|---|---|---|
| 6,987,413 B2 * | 1/2006 | Kawasaki | G09G 3/3233 326/81 |
| 7,046,220 B2 | 5/2006 | Tagawa et al. | |
| 7,199,771 B2 | 4/2007 | Yamazaki et al. | |
| 7,405,713 B2 | 7/2008 | Koyama | |
| 7,468,485 B1 | 12/2008 | Swanson | |
| 7,768,485 B2 | 8/2010 | Uchino et al. | |
| 7,924,246 B2 * | 4/2011 | Hara | G09G 3/325 345/76 |
| 7,961,160 B2 | 6/2011 | Kimura et al. | |
| 8,058,675 B2 | 11/2011 | Kimura | |
| 8,300,031 B2 | 10/2012 | Kimura | |
| 8,446,397 B2 | 5/2013 | Kimura | |

(Continued)

FOREIGN PATENT DOCUMENTS

| | | | |
|---|---|---|---|
| JP | 2007-310311 A | 11/2007 | |
| JP | 2009-265459 A | 11/2009 | |

(Continued)

*Primary Examiner* — David Vu
*Assistant Examiner* — Jonathan Han
(74) *Attorney, Agent, or Firm* — Fish & Richardson P.C.

(57) ABSTRACT

A low-power-consumption semiconductor device or the like is provided. Charge is accumulated in a node connected to a capacitor for a certain period to perform a current-voltage conversion. A gate of a transistor is connected to the node and the potential of one of a source and a drain of the transistor is changed gradually or continuously so that the potential is read when the transistor is turned on. The threshold voltage of the transistor and the capacitance value of the node are measured, so that the current-voltage conversion is performed more precisely.

16 Claims, 36 Drawing Sheets

(56) References Cited

U.S. PATENT DOCUMENTS

| | | |
|---|---|---|
| 8,514,165 B2 | 8/2013 | Yoshida |
| 8,692,743 B2 | 4/2014 | Tsai et al. |
| 8,816,942 B2 | 8/2014 | Schwanenberger et al. |
| 2003/0090446 A1 | 5/2003 | Tagawa et al. |
| 2006/0114193 A1* | 6/2006 | Kwak .................. G09G 3/3233 345/76 |
| 2006/0271757 A1* | 11/2006 | Kim ..................... G09G 3/3266 711/167 |
| 2008/0062112 A1* | 3/2008 | Umezaki ................ G09G 3/342 345/100 |
| 2009/0160742 A1 | 6/2009 | Mizukoshi et al. |
| 2010/0289782 A1 | 11/2010 | Yamamoto et al. |
| 2012/0287177 A1 | 11/2012 | Koyama et al. |
| 2013/0063413 A1 | 3/2013 | Miyake |
| 2013/0092930 A1 | 4/2013 | Kimura |
| 2013/0169170 A1 | 7/2013 | Shih |
| 2013/0241431 A1 | 9/2013 | Toyotaka et al. |
| 2013/0320848 A1 | 12/2013 | Miyake et al. |
| 2014/0176622 A1 | 6/2014 | Jung et al. |
| 2014/0354698 A1 | 12/2014 | Lee et al. |
| 2015/0061533 A1 | 3/2015 | Miyake et al. |
| 2015/0077411 A1 | 3/2015 | Miyake |
| 2016/0191052 A1 | 6/2016 | Kimura et al. |
| 2016/0232834 A1 | 8/2016 | Kimura et al. |

FOREIGN PATENT DOCUMENTS

| | | |
|---|---|---|
| JP | 2014-126873 A | 7/2014 |
| JP | 2015-079241 A | 4/2015 |

\* cited by examiner

FIG. 9A
FIG. 9B
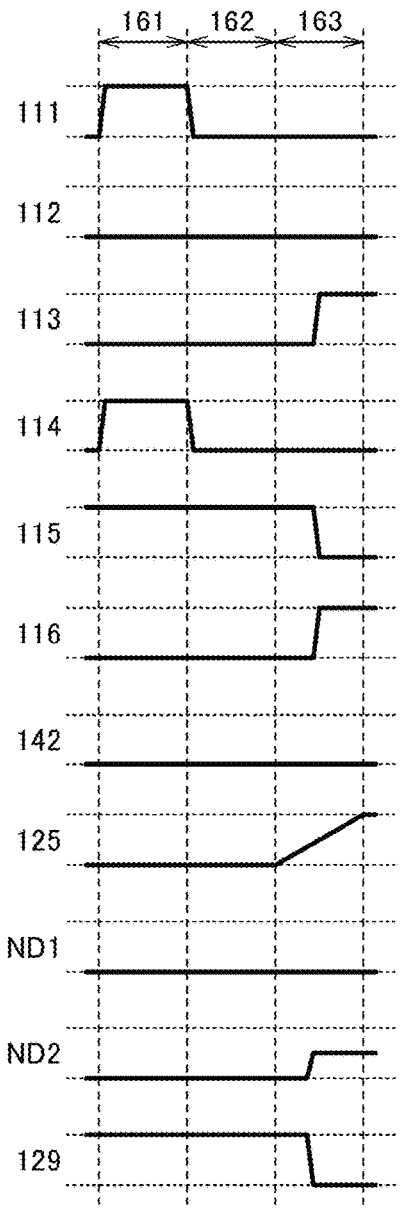
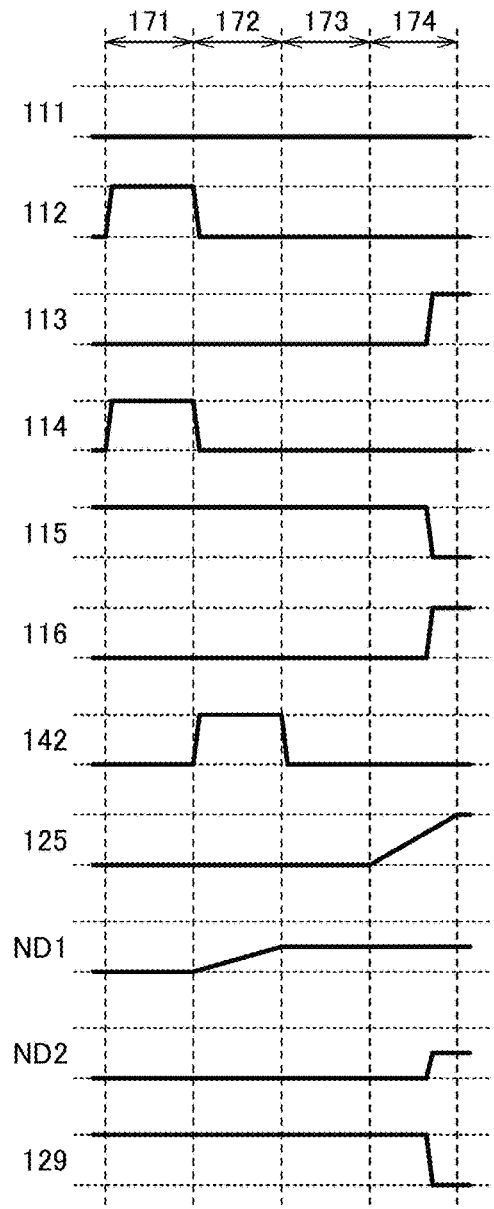

FIG. 17A1
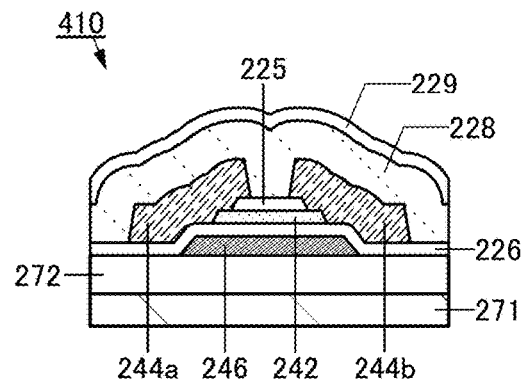
FIG. 17A2
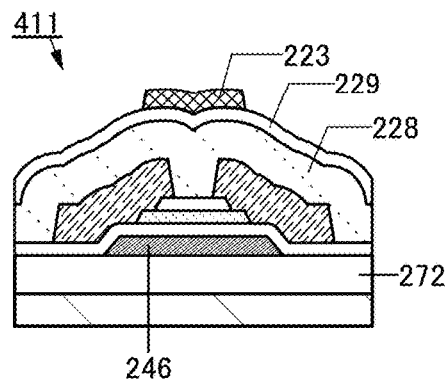
FIG. 17B1
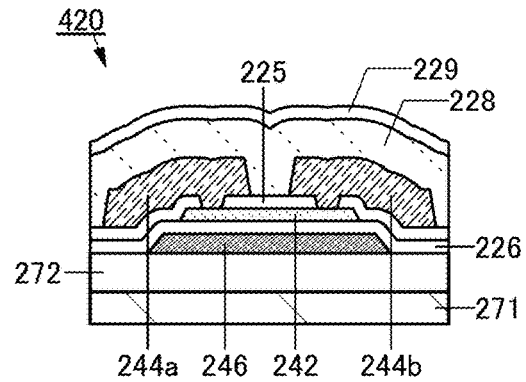
FIG. 17B2
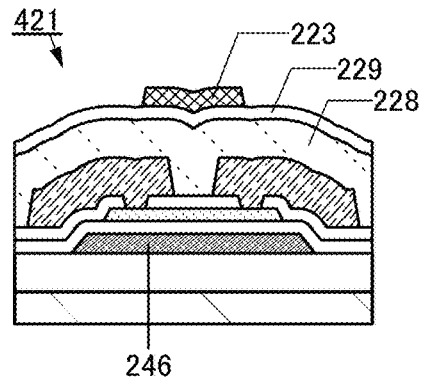
FIG. 17C1
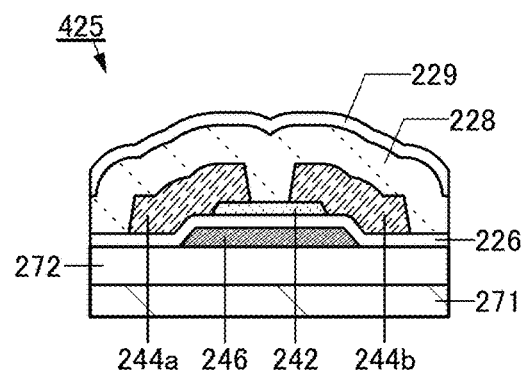
FIG. 17C2
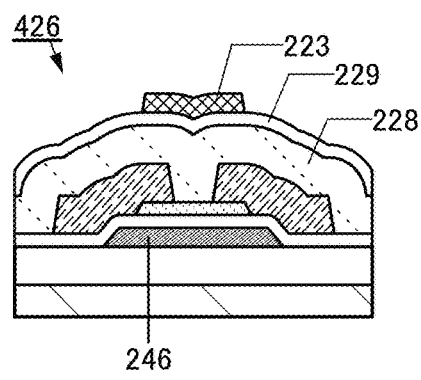

FIG. 18A1
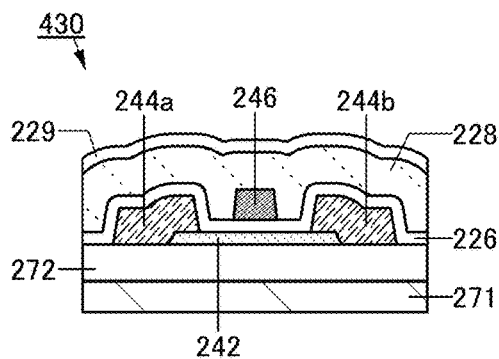
FIG. 18A2
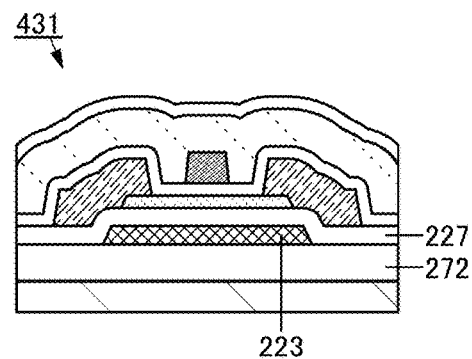
FIG. 18A3
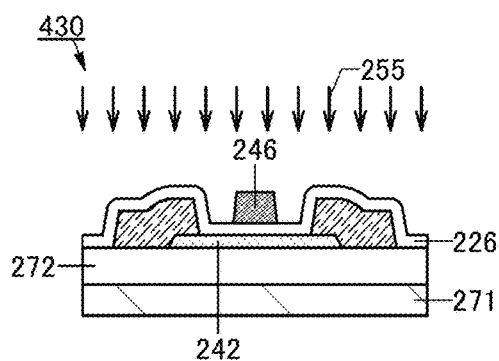
FIG. 18B1
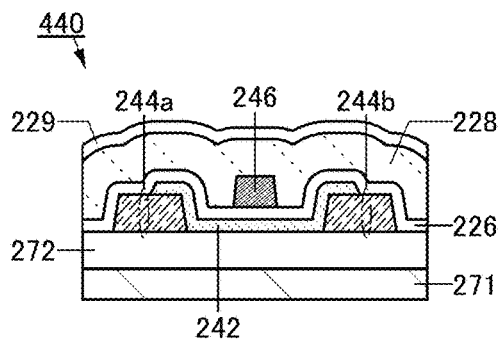
FIG. 18B2
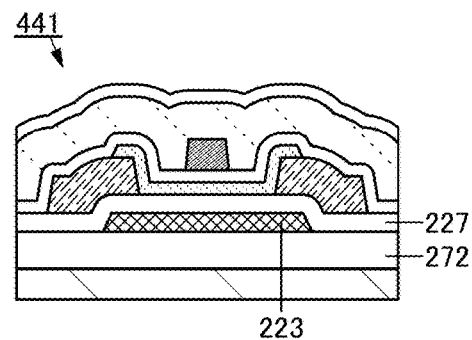

FIG. 19A1
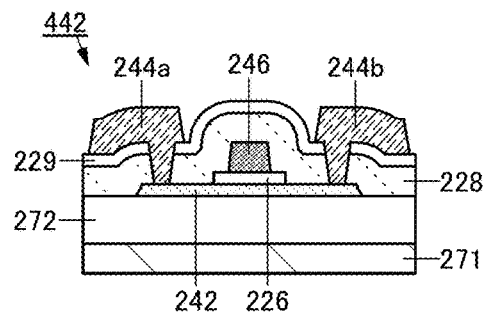
FIG. 19A2
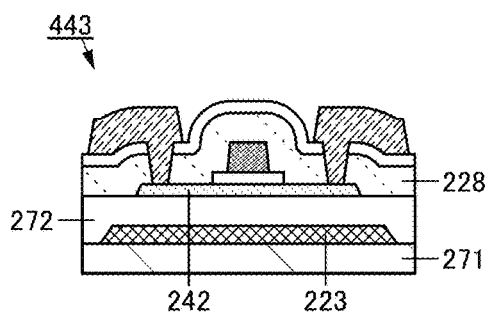
FIG. 19A3
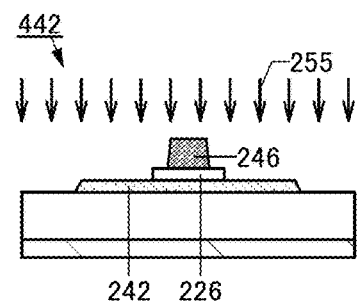
FIG. 19B1
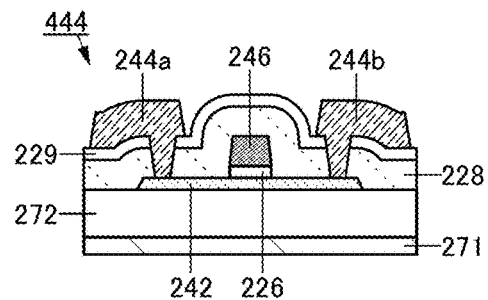
FIG. 19B2
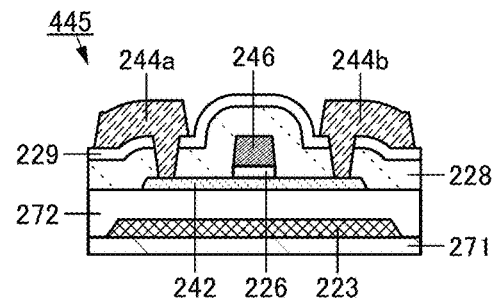
FIG. 19C1
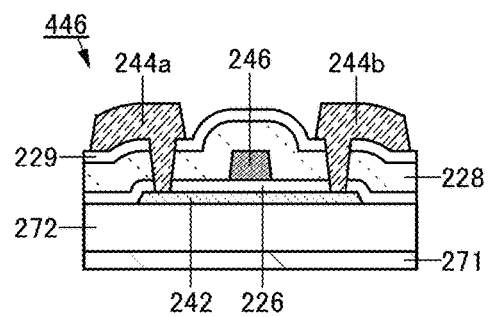
FIG. 19C2
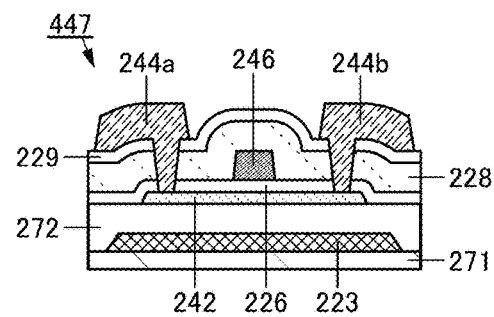

FIG. 20A
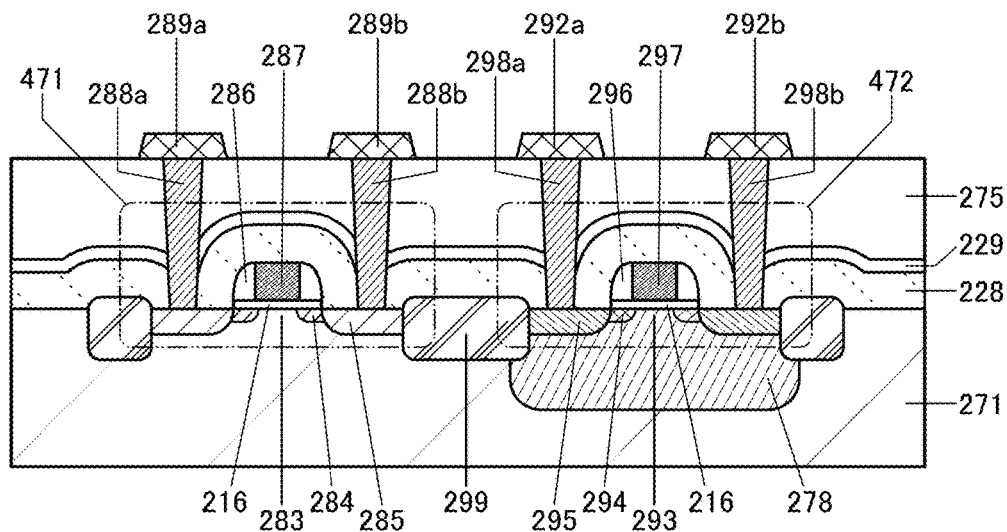
FIG. 20B1         FIG. 20B2
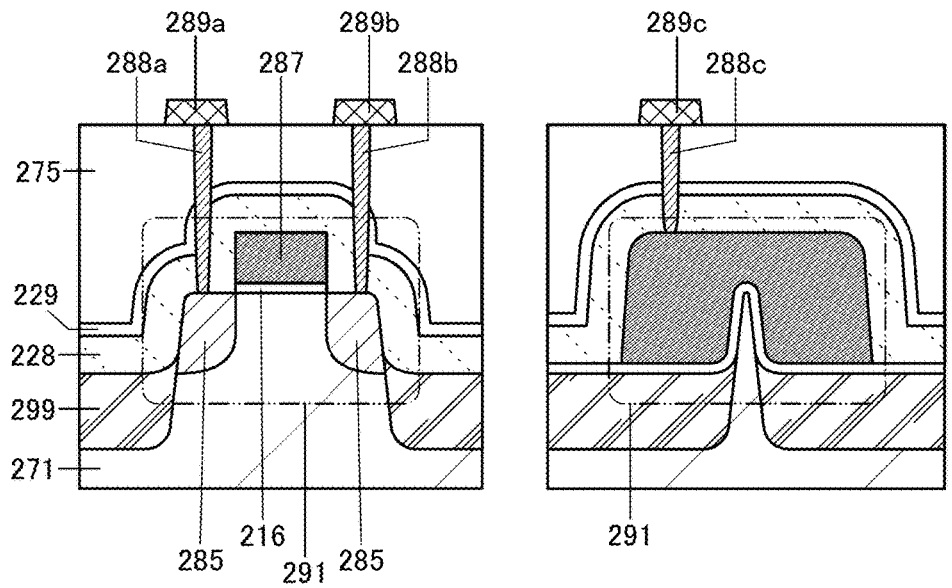

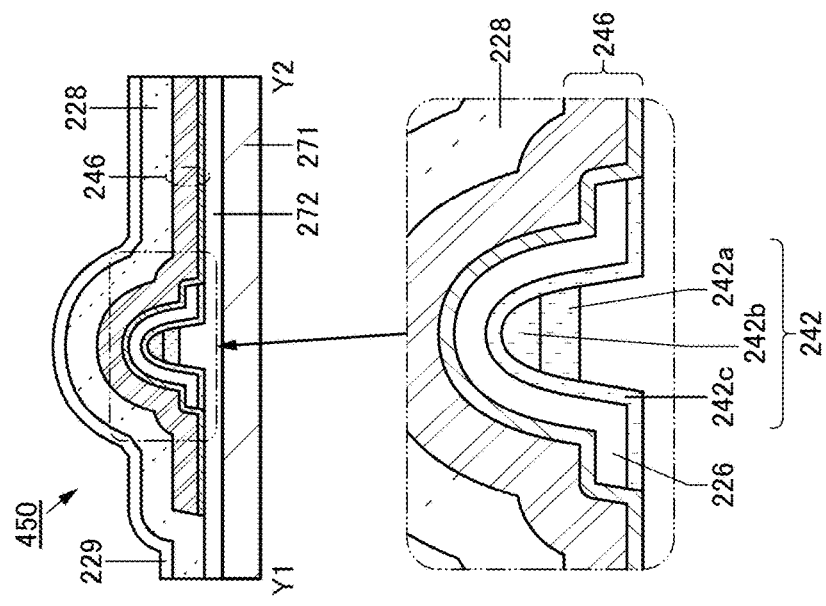
FIG. 21C
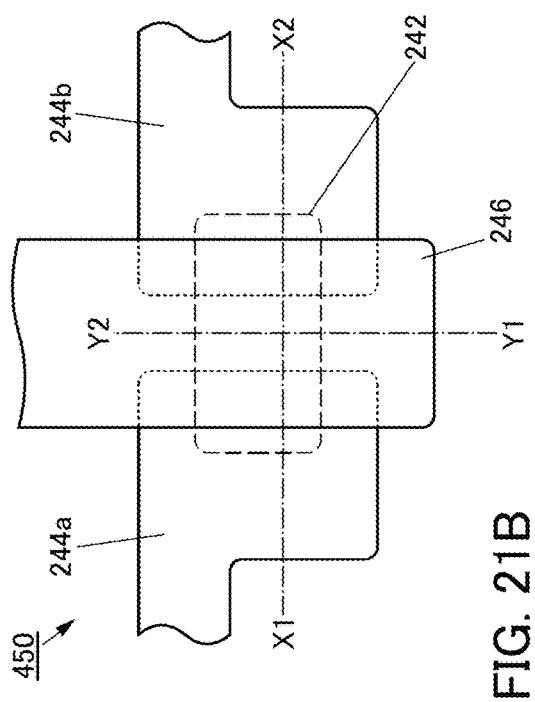
FIG. 21A
FIG. 21B plan-view TEM image cross-sectional TEM image

SEMICONDUCTOR DEVICE AND ELECTRONIC DEVICE

BACKGROUND OF THE INVENTION

1. Field of the Invention

One embodiment of the present invention relates to an object, a method, or a manufacturing method. One embodiment of the present invention relates to a process, a machine, manufacture, or a composition of matter. One embodiment of the present invention particularly relates to a semiconductor device and a driving method thereof. Another embodiment of the present invention relates to a display device including a semiconductor device and a driving method thereof.

In this specification and the like, a semiconductor device refers to any device that can function by utilizing semiconductor characteristics. Thus, a semiconductor element such as a transistor or a diode and a semiconductor circuit are semiconductor devices. A display device, a light-emitting device, a lighting device, an electro-optical device, an imaging device, an electronic device, and the like may include a semiconductor element or a semiconductor circuit. Therefore, a display device, a light-emitting device, a lighting device, an electro-optical device, an imaging device, an electronic device, and the like include a semiconductor device in some cases.

2. Description of the Related Art

An active-matrix display device where a transistor for driving a display element is provided in each pixel is known. For example, an active-matrix liquid crystal display device that includes a liquid crystal element as a display element, an active-matrix light-emitting display device that includes a light-emitting element, such as an organic EL element, as a display element, and the like are known. These active-matrix display devices are easier to increase in display size or definition than simple-matrix display devices, and have an advantage in reduced power consumption and the like.

In light-emitting display devices, if the threshold voltage or mobility varies among transistors that control the values of currents supplied to light-emitting elements in accordance with image signals (driver transistors), the luminance also varies among the light-emitting elements. To prevent the variation in the luminance of the light-emitting elements due to the variation in threshold voltage or mobility, a display device in which the threshold voltage or mobility of transistors is corrected inside pixels and a display device in which a variation in the threshold voltage or mobility of transistors is obtained and correction is made outside pixels are disclosed in Patent Document 1.

REFERENCE

Patent Document

[Patent Document 1] Japanese Published Patent Application No. 2015-79241

SUMMARY OF THE INVENTION

In Patent Document 1, information on the threshold voltage or mobility of a driver transistor is obtained using a monitor circuit including an operational amplifier. However, the need for continuous current supply to an operational amplifier makes it difficult to reduce power consumption. Furthermore, since an increase in the resolution of a display device requires more monitor circuits, it is difficult to achieve both high resolution and low power consumption of the display device.

An object of one embodiment of the present invention is to provide a low-power-consumption semiconductor device or the like. Another object is to provide a highly reliable semiconductor device or the like. Another object is to provide a novel semiconductor device or the like.

Note that the descriptions of these objects do not exclude the existence of other objects. Note that one embodiment of the disclosed invention does not necessarily achieve all the objects listed above. Other objects will be apparent from and can be derived from the description of the specification, the drawings, the claims, and the like.

Charge is accumulated in a node to which a capacitor is connected for a certain period to perform a current-voltage conversion. A gate of a transistor is connected to the node and the potential of one of a source and a drain of the transistor is changed gradually or continuously so that the potential is read when the transistor is turned on. The threshold voltage of the transistor and the capacitance value of the node are measured, so that the current-voltage conversion can be performed more precisely.

One embodiment of the present invention is a semiconductor device including a first transistor, a second transistor, a third transistor, a fourth transistor, a fifth transistor, a sixth transistor, and a capacitor. One of a source and a drain of the first transistor is electrically connected to a first wiring. The other of the source and the drain of the first transistor is electrically connected to a first node. A gate of the first transistor is electrically connected to a second wiring. One of a source and a drain of the second transistor is electrically connected to the first node. The other of the source and the drain of the second transistor is electrically connected to a third wiring. A gate of the second transistor is electrically connected to a fourth wiring. One of a source and a drain of the third transistor is electrically connected to a fifth wiring. The other of the source and the drain of the third transistor is electrically connected to a second node. A gate of the third transistor is electrically connected to the first node. One of a source and a drain of the fourth transistor is electrically connected to the second nod. The other of the source and the drain of the fourth transistor is electrically connected to a sixth wiring. A gate of the fourth transistor is electrically connected to a seventh wiring. One of a source and a drain of the fifth transistor is electrically connected to an eighth wiring. The other of the source and the drain of the fifth transistor is electrically connected to a ninth wiring. A gate of the fifth transistor is electrically connected to the second node. One of a source and a drain of the sixth transistor is electrically connected to the ninth wiring. The other of the source and the drain of the sixth transistor is electrically connected to a tenth wiring. A gate of the sixth transistor is electrically connected to the second node. The capacitor is electrically connected to the first node.

One embodiment of the present invention is a semiconductor device including a first transistor, a second transistor, a third transistor, a fourth transistor, a fifth transistor, a sixth transistor, a seventh transistor, a capacitor, and a current source. One of a source and a drain of the first transistor is electrically connected to a first wiring. The other of the source and the drain of the first transistor is electrically connected to a first node. A gate of the first transistor is electrically connected to a second wiring. One of a source and a drain of the second transistor is electrically connected to the first node. The other of the source and the drain of the second transistor is electrically connected to a third wiring.

A gate of the second transistor is electrically connected to a fourth wiring. One of a source and a drain of the third transistor is electrically connected to a fifth wiring. The other of the source and the drain of the third transistor is electrically connected to a second node. A gate of the third transistor is electrically connected to the first node. One of a source and a drain of the fourth transistor is electrically connected to the second nod. The other of the source and the drain of the fourth transistor is electrically connected to a sixth wiring. A gate of the fourth transistor is electrically connected to a seventh wiring. One of a source and a drain of the fifth transistor is electrically connected to an eighth wiring. The other of the source and the drain of the fifth transistor is electrically connected to a ninth wiring. A gate of the fifth transistor is electrically connected to the second node. One of a source and a drain of the sixth transistor is electrically connected to the ninth wiring. The other of the source and the drain of the sixth transistor is electrically connected to a tenth wiring. A gate of the sixth transistor is electrically connected to the second node. The capacitor is electrically connected to the first node. One of a source and a drain of the seventh transistor is electrically connected to the current source. The other of the source and the drain of the seventh transistor is electrically connected to the first node. A gate of the seventh transistor is electrically connected to an eleventh wiring.

At least one of the first to seventh transistors preferably includes an oxide semiconductor.

A low-power-consumption semiconductor device or the like can be provided. A highly reliable semiconductor device or the like can be provided. A novel semiconductor device or the like can be provided.

Note that the description of these effects does not exclude the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

In the accompanying drawings:

FIGS. 9A and 9B are timing charts showing operations the semiconductor device;

FIGS. 17A1, 17A2, 17B1, 17B2, 17C1, and 17C2 each illustrate a semiconductor device;

FIGS. 18A1, 18A2, 18A3, 18B1, and 18B2 each illustrate a semiconductor device;

FIGS. 19A1, 19A2, 19A3, 19B1, 19B2, 19C1, and 19C2 each illustrate a semiconductor device;

FIGS. 20A, 20B1, and 20B2 illustrate semiconductor devices;

FIGS. 21A to 21C illustrate a semiconductor device;

DETAILED DESCRIPTION OF THE INVENTION

Figure 1A:
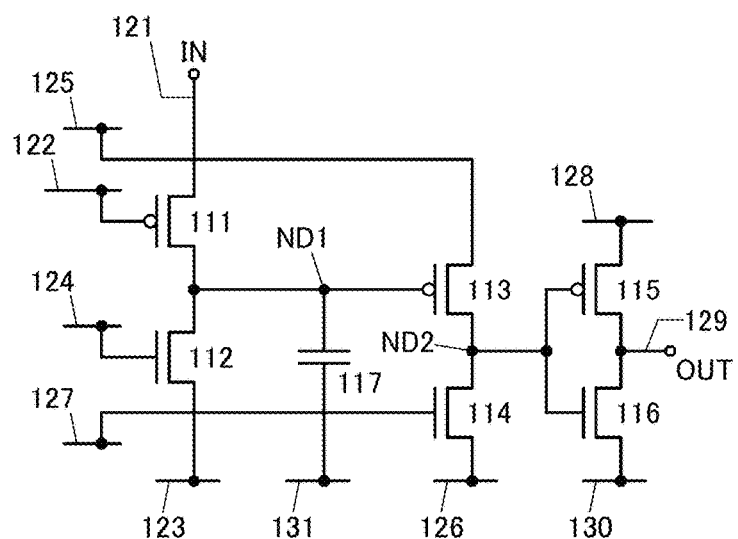
FIGS. 1A and 1B are circuit diagrams showing a semiconductor device.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below. Note that in the structures of the invention described below, the same portions or portions having similar functions are denoted by the same reference numerals in different drawings, and description of such portions is not repeated in some cases.

The position, size, range, and the like of each component illustrated in the drawings are not accurately represented in some cases to facilitate understanding of the invention. Therefore, the present invention is not necessarily limited to the position, size, range, or the like disclosed in the drawings.

In the drawings, some components might not be illustrated for easy understanding of the invention. In addition, some hidden lines and the like might not be shown.

Note that ordinal numbers such as "first" and "second" in this specification and the like are used in order to avoid confusion among components and do not denote the priority or the order such as the order of steps or the stacking order. A term without an ordinal number in this specification and the like might be provided with an ordinal number in a claim in order to avoid confusion among components. In addition, a term with an ordinal number in this specification and the like might be provided with a different ordinal number in a claim. Moreover, a term with an ordinal number in this specification and the like might not be provided with any ordinal number in a claim.

In addition, in this specification and the like, the term such as an "electrode" or a "wiring" does not limit a function of a component. For example, an "electrode" is used as part of a "wiring" in some cases, and vice versa. Further, the term "electrode" or "wiring" can also mean a combination of a plurality of "electrodes" and "wirings".

Note that the term "over" or "under" in this specification and the like does not necessarily mean that a component is placed "directly on" or "directly below" and "directly in contact with" another component. For example, the expression "electrode B over insulating layer A" does not necessarily mean that the electrode B is on and in direct contact with the insulating layer A and can mean the case where another component is provided between the insulating layer A and the electrode B.

Furthermore, functions of the source and the drain might be switched depending on operation conditions, e.g., when a transistor having a different polarity is employed or a direction of current flow is changed in circuit operation. Thus, the terms "source" and "drain" can be replaced with each other in this specification and the like.

In this specification and the like, when it is explicitly described that X and Y are connected, the case where X and Y are electrically connected, the case where X and Y are functionally connected, and the case where X and Y are directly connected are included therein. Accordingly, without being limited to a predetermined connection relation, for example, a connection relation shown in drawings or text, another connection relation is included in the drawings or the text.

Note that in this specification and the like, the expression "electrically connected" includes the case where components are connected through an "object having any electric function". There is no particular limitation on an "object having any electric function" as long as electric signals can be transmitted and received between components that are connected through the object. Accordingly, even when the expression "to be electrically connected" is used in this specification, there is a case in which no physical connection is made and a wiring is just extended in an actual circuit.

Note that a channel length refers to, for example, a distance between a source (source region or source electrode) and a drain (drain region or drain electrode) in a region where a semiconductor (or a portion where a current flows in a semiconductor when a transistor is on) and a gate electrode overlap with each other or a region where a channel is formed (also referred to as a "channel formation region") in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

A channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions do not necessarily have the same value. In other words, a channel width of one transistor is not fixed to one value in some cases. Therefore, in this specification, a channel width is any one of values, the maximum value, the minimum value, or the average value in a region where a channel is formed.

Note that depending on transistor structures, a channel width in a region where a channel is actually formed (also referred to as an "effective channel width") is different from a channel width shown in a top view of a transistor (also referred to as an "apparent channel width") in some cases. For example, in a transistor having a gate electrode covering side surfaces of a semiconductor layer, an effective channel width is greater than an apparent channel width, and its influence cannot be ignored in some cases. For example, in a miniaturized transistor having a gate electrode covering a side surface of a semiconductor, the proportion of a channel region formed in a side surface of a semiconductor may be increased. In that case, an effective channel width is greater than an apparent channel width.

In such a case, an effective channel width is difficult to measure in some cases. For example, to estimate an effective channel width from a design value, it is necessary to assume that a semiconductor has a known shape. Therefore, when the shape of a semiconductor is unclear, it is difficult to measure an effective channel width accurately.

In this specification, an apparent channel width is referred to as a surrounded channel width (SCW) in some cases. Furthermore, in this specification, when the term "channel width" is simply used, it may denote a surrounded channel width or an apparent channel width. Alternatively, in this specification, when the term "channel width" is simply used, it may denote an effective channel width in some cases. Note that a channel length, a channel width, an effective channel width, an apparent channel width, a surrounded channel width, and the like can be determined by analyzing a cross-sectional TEM image and the like.

Note that in the case where electric field mobility, a current value per channel width, and the like of a transistor are obtained by calculation, a surrounded channel width may be used for the calculation. In that case, a value different from one in the case where an effective channel width is used for the calculation is obtained in some cases.

Note that an impurity in a semiconductor refers to, for example, elements other than the main components of the semiconductor. For example, an element with a concentration lower than 0.1 atomic % can be regarded as an impurity. When an impurity is contained, the density of states (DOS) in a semiconductor may be increased, the carrier mobility may be decreased, or the crystallinity may be decreased. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components of the oxide semiconductor; the specific examples are hydrogen (included also in water), lithium, sodium, silicon, boron, phosphorus, carbon, nitrogen, and the like. In the case of an oxide semiconductor, oxygen vacancy may be formed by entry of impurities such as hydrogen. Furthermore, when the semiconductor is silicon, examples of an impurity which changes characteristics of the semiconductor include oxygen, Group 1 elements except hydrogen, Group 2 elements, Group 13 elements, and Group 15 elements.

In this specification and the like, a variety of switches can be used as a switch. That is, the switch has a function of determining whether current flows or not by being turned on or off (being brought into an on state or an off state). Alternatively, the switch has a function of selecting and changing a current path. For example, the switch has a function of determining whether current can flow through a path 1 or a path 2 and switching the paths. For example, an electrical switch, a mechanical switch, or the like can be used as a switch. That is, any element can be used as a switch as long as it can control current, without limitation to a certain element. For example, a transistor (e.g., a bipolar transistor or a field effect transistor (FET)), a diode (e.g., a PN diode, a PIN diode, a Schottky diode, a metal-insulator-metal (MIM) diode, a metal-insulator-semiconductor (MIS) diode, or a diode-connected transistor), a logic circuit in which such elements are combined, or the like can be used as a switch. An example of a mechanical switch is a switch formed using micro electro mechanical systems (MEMS) technology, such as a digital micromirror device (DMD). Such a switch includes an electrode which can be moved mechanically, and operates by controlling conduction and non-conduction in accordance with movement of the electrode.

An FET described in this specification and the like is an enhancement-mode (normally-off) transistor unless otherwise specified.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" or "orthogonal" indicates that the angle formed between two straight lines is greater than or equal to 80° and less than or equal to 100°, and accordingly also includes the case where the angle is greater than or equal to 85° and less than or equal to 95°. The term "substantially perpendicular" indicates that the angle formed between two straight lines is greater than or equal to 60° and less than or equal to 120°.

In the specification and the like, the terms "identical," "the same," "equal," "uniform," and the like (including synonyms thereof) used in describing calculation values and actual measurement values allow for a margin of error of ±20% unless otherwise specified.

In this specification, when an etching step is performed after a photolithography process, a resist mask formed in the photolithography process is removed after the etching step, unless otherwise specified.

In this specification and the like, a high power supply potential VDD (also referred to as VDD or H potential) is a power supply potential higher than a low power supply potential VSS. The low power supply potential VSS (also referred to as VSS or L potential) is a power supply potential lower than the high power supply potential VDD. A ground potential (also referred to as "GND" or a "GND potential") can be used as VDD or VSS. For example, when a ground potential is used as VDD, VSS is lower than the ground potential, and in the case where a ground potential is used as VSS, VDD is higher than the ground potential.

Note that the terms "film" and "layer" can be interchanged with each other depending on the case or circumstances. For example, the term "conductive layer" can be changed into the term "conductive film" in some cases. The term "insulating film" can also be changed into the term "insulating layer" in some cases.

In this specification and the like, trigonal and rhombohedral crystal systems are included in a hexagonal crystal system.

Embodiment 1

A semiconductor device 100 of one embodiment of the present invention is described with reference to drawings. FIG. 1A is a circuit diagram showing a configuration of the semiconductor device 100.

<<Configuration Example of Semiconductor Device 100>>

The semiconductor device 100 includes transistors 111 to 116 and a capacitor 117. One of a source and a drain of the transistor 111 is electrically connected to a wiring 121, the other is electrically connected to a node ND1, and a gate thereof is electrically connected to a wiring 122. One of a source and a drain of the transistor 112 is electrically connected to the node ND1, the other is electrically connected to a wiring 123, and a gate thereof is electrically connected to a wiring 124. One of a source and a drain of the transistor 113 is electrically connected to a wiring 125, the other is electrically connected to a node ND2, and a gate thereof is electrically connected to the node ND1. One of a source and a drain of the transistor 114 is electrically connected to the node ND2, the other is electrically connected to a wiring 126, and a gate thereof is electrically connected to a wiring 127. One of a source and a drain of the transistor 115 is electrically connected to a wiring 128, the other is electrically connected to a wiring 129, and a gate thereof is electrically connected to the node ND2. One of a source and a drain of the transistor 116 is electrically connected to the wiring 129, the other is electrically connected to a wiring 130, and a gate thereof is electrically connected to the node ND2. One of electrodes of the capacitor 117 is electrically connected to the node ND1, and the other is electrically connected to a wiring 131.

Figure 1B:
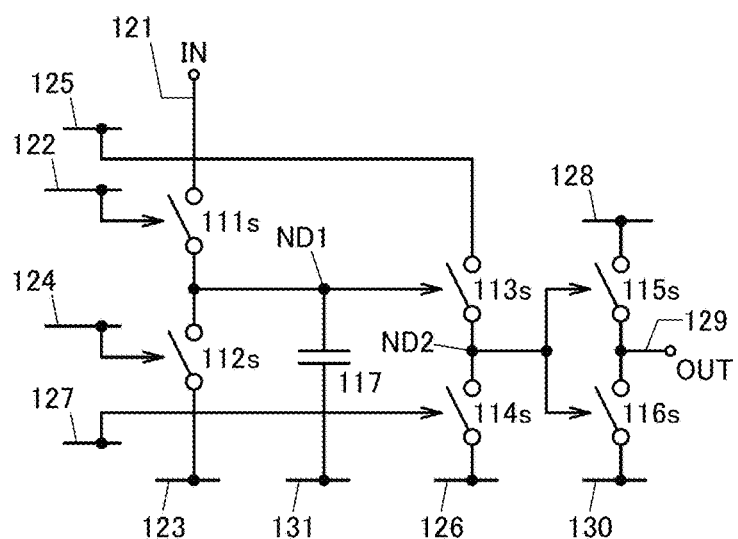

The transistors 111 to 116 function as switches. Hence, the circuit diagram of the semiconductor device 100 can be shown as in FIG. 1B. In FIG. 1B, the transistors 111, 112, 113, 114, 115, and 116 correspond to switches 111s, 112s, 113s, 114s, 115s, and 116s, respectively.

Although the transistors 111, 113, and 115 are p-channel transistors (FETs) and the transistors 112, 114, and 116 are n-channel transistors (FETs) in FIG. 1A, one embodiment of the present invention is not limited to this example.

<<Operation Example 1 of Semiconductor Device 100>>

Figure 2:
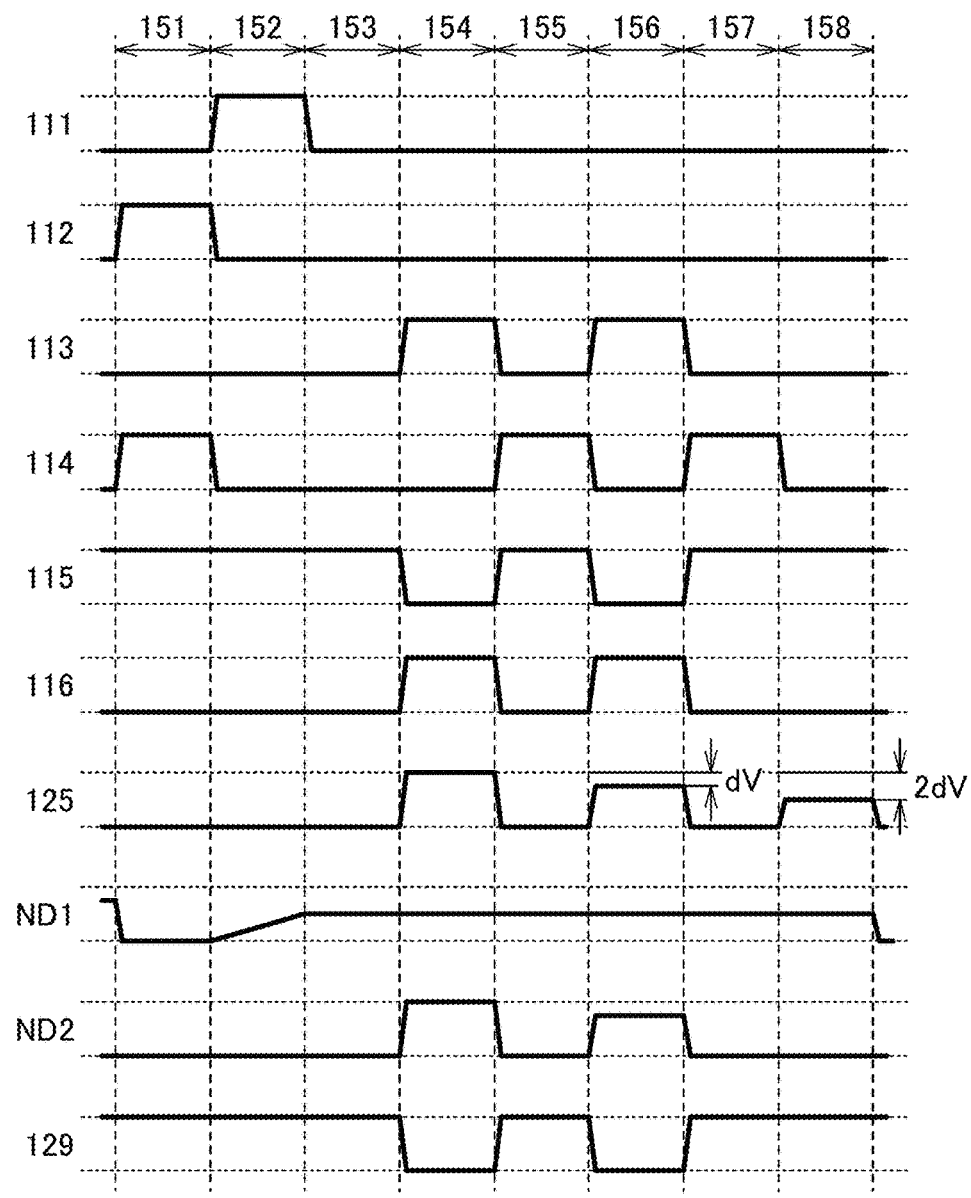
FIG. 2 is a timing chart showing operations of the semiconductor device.
Figure 3A:
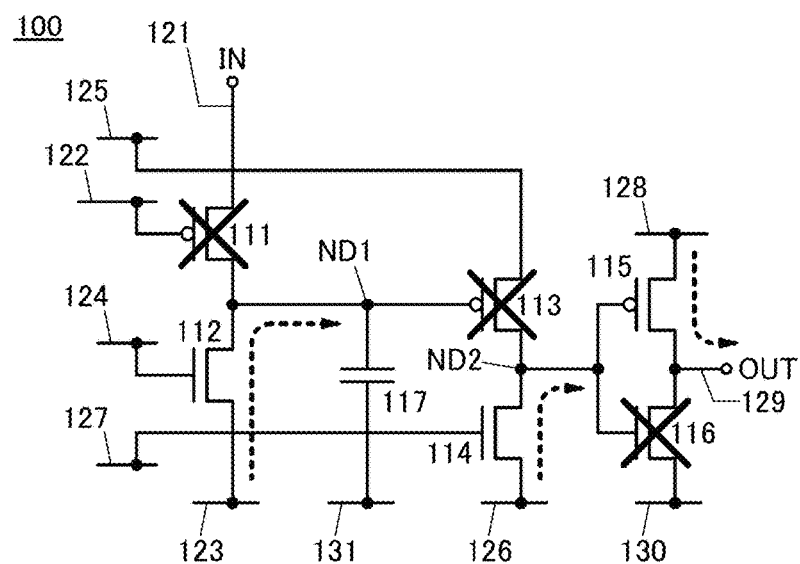
FIGS. 3A and 3B show operations of the semiconductor device.
Figure 3B:
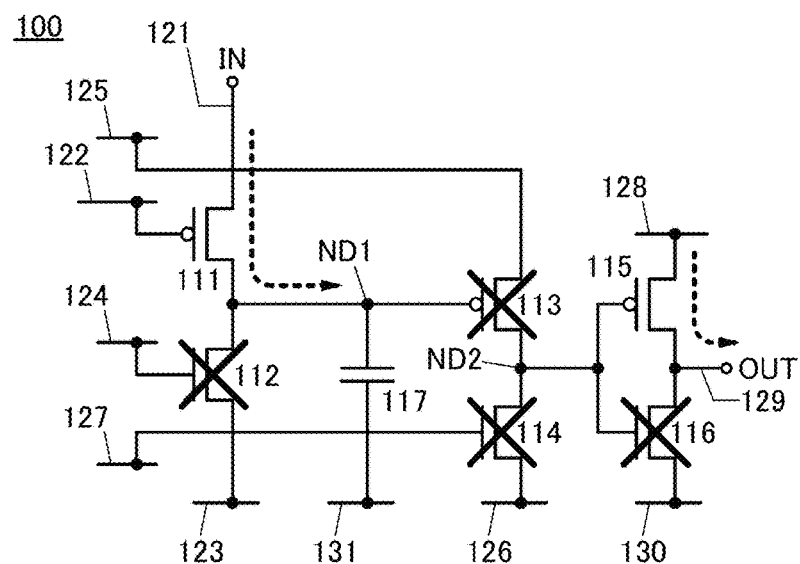
Figure 4A:
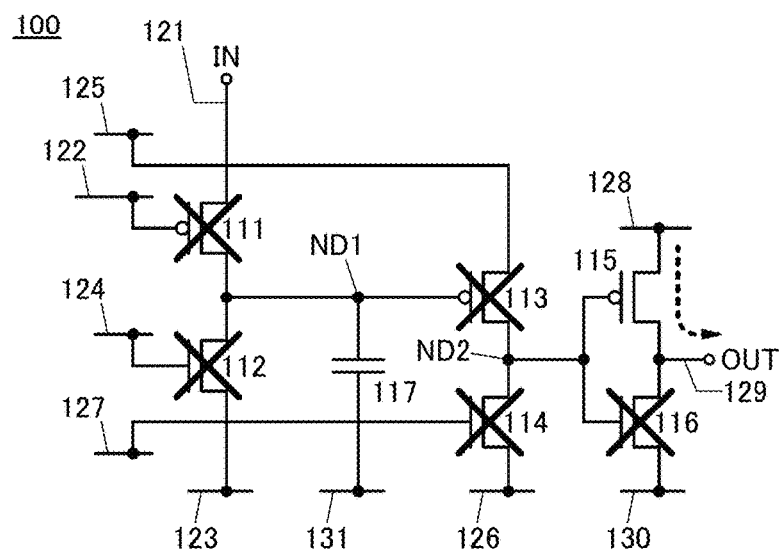
FIGS. 4A and 4B show operations of the semiconductor device.
Figure 4B:
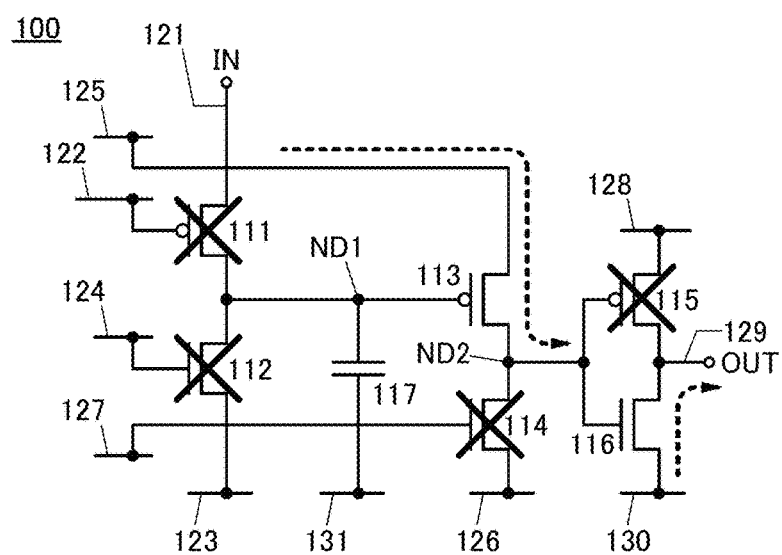
Figure 5A:
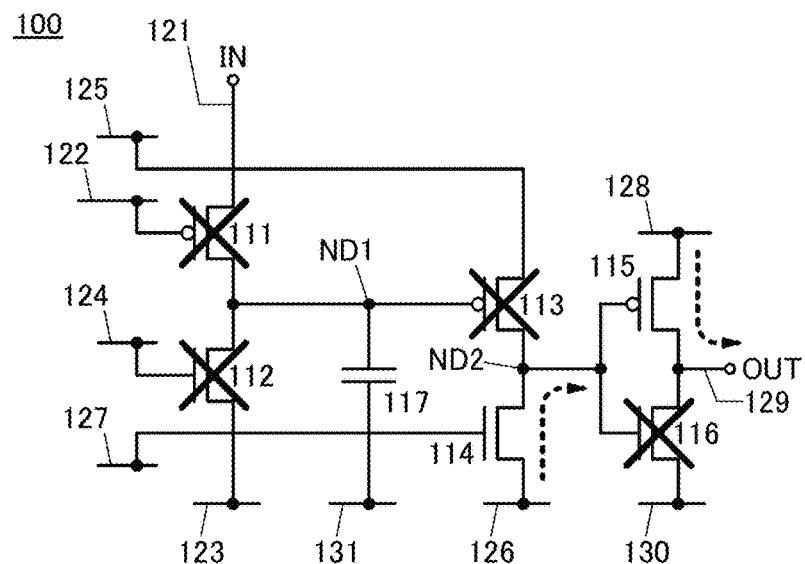
FIGS. 5A and 5B show operations of the semiconductor device.
Figure 5B:
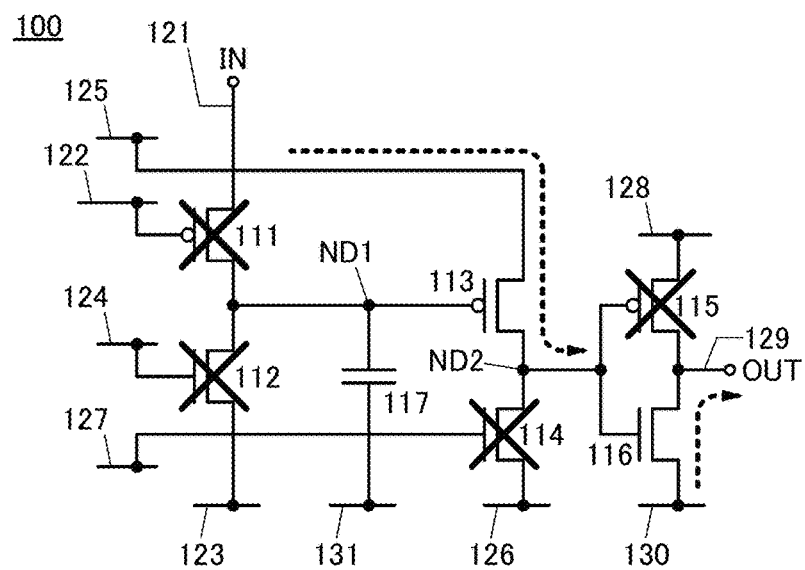
Figure 6A:
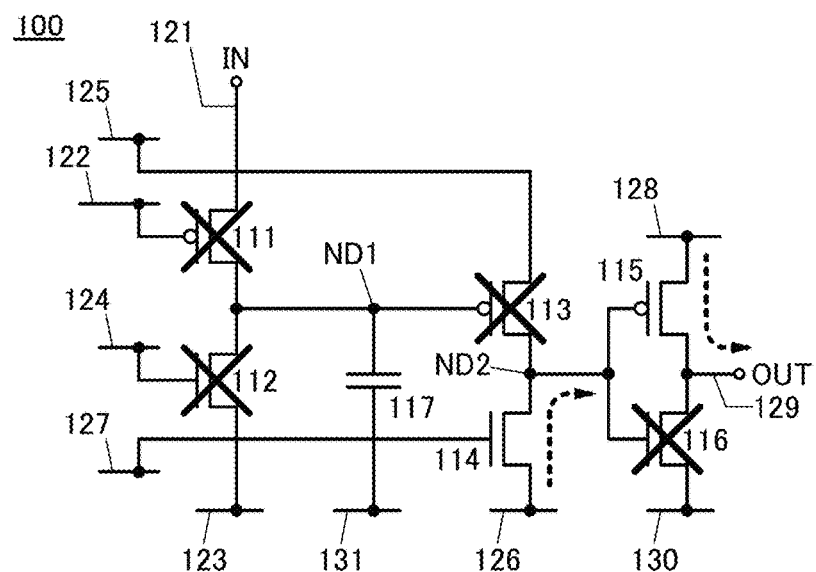
FIGS. 6A and 6B show operations of the semiconductor device.
Figure 6B:
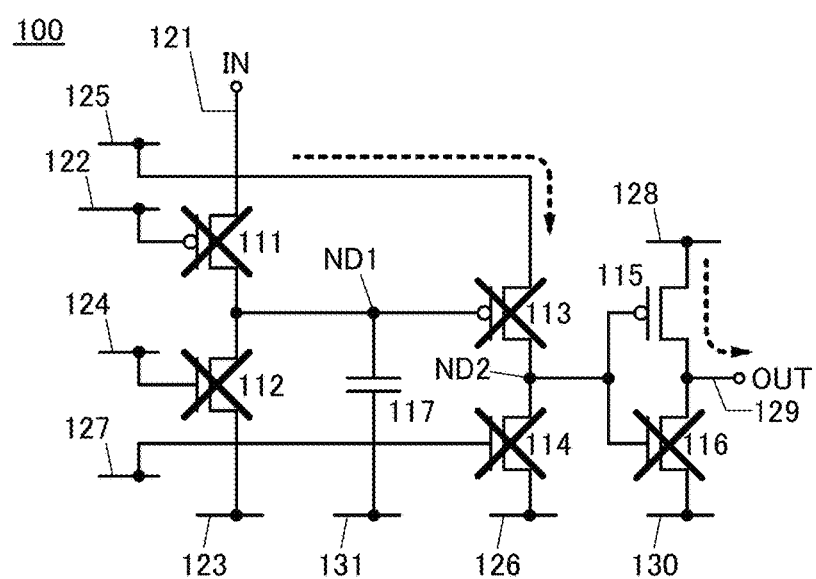

The semiconductor device 100 has a function of converting a current supplied to the wiring 121 into a voltage. An operation example of the semiconductor device 100 is described using a timing chart of FIG. 2 and circuit diagrams of FIGS. 3A and 3B, FIGS. 4A and 4B, FIGS. 5A and 5B, and FIGS. 6A and 6B. The timing chart of FIG. 2 shows the on and off states of the transistors 111 to 116 and the potentials of the node ND1, the node ND2, the wiring 125, and the wiring 129.

To the wiring 121, a current including information on the threshold voltage or mobility of a driver transistor (hereinafter also referred to as a "current $I_F$") is supplied. To the wiring 122, a signal SET which switches the on and off states of the transistor 111 is supplied. When the transistor 111 is turned on, the current $I_F$ is supplied to the node ND1. To the wiring 124, a signal RESET which switches the on and off states of the transistor 112 is supplied. When the transistor 112 is turned on, the potential of the wiring 123 is supplied to the node ND1. To the wiring 127, a signal PRE which switches the on and off states of the transistor 114 is supplied. When the transistor 114 is turned on, the potential of the wiring 126 is supplied to the node ND2. To the wiring 125, a read signal RD for reading the potential of the node ND1 (hereinafter also referred to as a "potential $V_{ND1}$") is supplied.

In the semiconductor device 100 described in this embodiment, when the potential of the node ND2 (hereinafter also referred to as a "potential $V_{ND2}$") is lower than the potential of the wiring 128 and the difference between the potential of the wiring 128 and the potential $V_{ND2}$ is greater than the threshold voltage of the transistor 115, the transistor 115 is turned on, so that the potential of the wiring 128 is output to the wiring 129. In addition, when the potential $V_{ND2}$ is higher than the potential of the wiring 130 and the difference between the potential of the wiring 130 and the potential $V_{ND2}$ is greater than the threshold voltage of the transistor 116, the transistor 116 is turned on, so that the potential of the wiring 130 is output to the wiring 129.

In this embodiment, VDD is supplied to the wiring 128, and VSS (or the GND potential) is supplied to the wirings 123, 126, 130, and 131. The potentials supplied to the wirings 123, 126, 130, and 131 may be any potential as long as it is a constant potential and may be a ground potential or a given fixed potential. The potentials supplied to the wirings 123, 126, 130, and 131 may be the same or different from each other.

[Period 151: Reset Operation]

In a period 151 (see FIG. 3A), the transistor 111 is in an off state, the transistor 112 is turned on, the transistor 113 is in an off state, and the transistor 114 is turned on. In this embodiment, since the transistor 113 is a p-channel transistor, a potential less than or equal to VSS is supplied to the wiring 125.

When the transistor 112 is turned on, the potential $V_{ND1}$ becomes VSS. When the transistor 114 is turned on, the potential $V_{ND2}$ becomes VSS. When the potential $V_{ND2}$ becomes VSS, the transistor 115 is turned on and the transistor 116 is turned off, so that VDD is supplied to the wiring 129.

[Period 152: Write Operation]

In a period 152 (see FIG. 3B), the transistor 112 and the transistor 114 are turned off and the transistor 111 is turned on. Then, the current $I_P$ is supplied to the node ND1 through the wiring 121. The potential $V_{ND1}$ increases at a rate corresponding to the amount of the current $I_P$. Since the potentials of the wiring 125 and the node ND2 are less than or equal to VSS, the transistor 113 remains in the off state.

[Period 153: Retention Operation]

In a period 153 (see FIG. 4A), the transistor 111 is turned off. Then, the increase in potential $V_{ND1}$ stops. The potential $V_{ND1}$ becomes a potential corresponding to the amount of the current $I_P$. In this embodiment, the potential $V_{ND1}$ is higher than VSS and lower than VDD.

[Period 154: Read Operation]

In a period 154 (see FIG. 4B), the read signal RD is supplied to the wiring 125. As the read signal RD, VDD is supplied. When the potential $V_{ND1}$ is lower than the potential of the wiring 125 and the difference between the potential of the wiring 125 and the potential $V_{ND1}$ is greater than the threshold voltage of the transistor 113, the transistor 113 is turned on, so that the potential of the wiring 125 is supplied to the node ND2. In this embodiment, the case where the difference between the potential of the wiring 125 and the potential $V_{ND1}$ is greater than the threshold voltage of the transistor 113 in the period 154 is described. Thus, the transistor 113 is turned on in the period 154.

When the transistor 113 is turned on, the potential $V_{ND2}$ becomes VDD. Then, the transistor 116 is turned on and the transistor 115 is turned off. Consequently, VSS is supplied to the wiring 129.

[Period 155: Reset Operation]

In a period 155 (see FIG. 5A), a potential less than or equal to VSS is supplied to the wiring 125 to turn off the transistor 113. In addition, the transistor 114 is turned on so that VSS is supplied to the node ND2. When the potential $V_{ND2}$ becomes VSS, the transistor 115 is turned on and the transistor 116 is turned off, so that VDD is supplied to the wiring 129.

[Period 156: Read Operation]

In a period 156 (see FIG. 5B), the read signal RD is supplied to the wiring 125. Here, a potential lower than the potential of the read signal RD supplied in the period 154 by d V is supplied. Specifically, a potential lower than VDD by d V is supplied. In this embodiment, the case where the difference between the potential of the wiring 125 and the potential $V_{ND1}$ is greater than the threshold voltage of the transistor 113 in the period 156 is described. Thus, the transistor 113 is turned on and the potential $V_{ND2}$ becomes the potential lower than VDD by d V.

Note that the potential lower than VDD by d V refers to the potential at which the transistor 116 is turned on and the transistor 115 is turned off. Consequently, VSS is supplied to the wiring 129.

[Period 157: Reset Operation]

In a period 157 (see FIG. 6A), a potential less than or equal to VSS is supplied to the wiring 125 to turn off the transistor 113. In addition, the transistor 114 is turned on so that VSS is supplied to the node ND2. When the potential of the node ND2 becomes VSS, the transistor 115 is turned on and the transistor 116 is turned off, so that VDD is supplied to the wiring 129.

[Period 158: Read Operation]

In a period 158 (see FIG. 6B), the read signal RD is supplied to the wiring 125. Here, a potential lower than the potential of the read signal RD supplied in the period 154 by 2 d V (twice as much as d V) is supplied. Specifically, a potential lower than VDD by 2 d V is supplied. When the difference between the potential of the wiring 125 and the potential $V_{ND1}$ is less than the threshold voltage of the transistor 113, the transistor 113 remains in the off state. In this embodiment, the case where the difference between the potential of the wiring 125 and the potential $V_{ND1}$ is less than the threshold voltage of the transistor 113 in the period 158 is described.

In the period 158, the potential $V_{ND2}$ remains at VSS when the transistor 113 is in the off state. The potential supplied to the wiring 125 at this time is referred to as a "potential $V_P$". The potential $V_P$ is obtained to measure the level of the potential $V_{ND1}$ (current $I_P$).

Note that d V is one fifth or less, preferably one twentieth or less, more preferably one fiftieth or less of the maximum voltage amplitude of the read signal RD. The lower d V becomes, the higher the accuracy of the potential $V_P$ becomes. In the semiconductor device of one embodiment of the present invention, the current $I_P$ can be converted into a voltage (voltage $V_P$) without an operational amplifier. Thus, a semiconductor device with low power consumption can be achieved.

Note that when an $I_P$ sensing circuit including a source driver is used, a grayscale voltage for a data signal may be used as the read signal RD. In this case, for example, when a data signal contains 256 gray levels, d V is 1/256.

When the potential $V_P$ cannot be obtained even in the read operation in the period 158, another read operation is performed after the reset operation in the period 157. As the read signal RD at this time, a potential lower than (the potential of) the read signal RD supplied in the period 154 by 3 d V (three times as much as d V) is used. Alternatively, the period 152 may be extended.

Operation Example 1 shows the case where the read operation is performed with the potential supplied to the wiring 125 gradually changed from a high potential to a low potential. However, the potential supplied to the wiring 125 can be gradually changed from a low potential to a high potential.

The potential supplied as the read signal RD is preferably greater than or equal to an intermediate potential between the potential supplied to the wiring 130 and the potential supplied to the wiring 128, more preferably greater than the potential supplied to the wiring 128. Such a potential can stabilize the operation of the semiconductor device 100 and improve the reliability of the semiconductor device 100.

<<Operation Example 2 of Semiconductor Device 100>>

Figure 7:
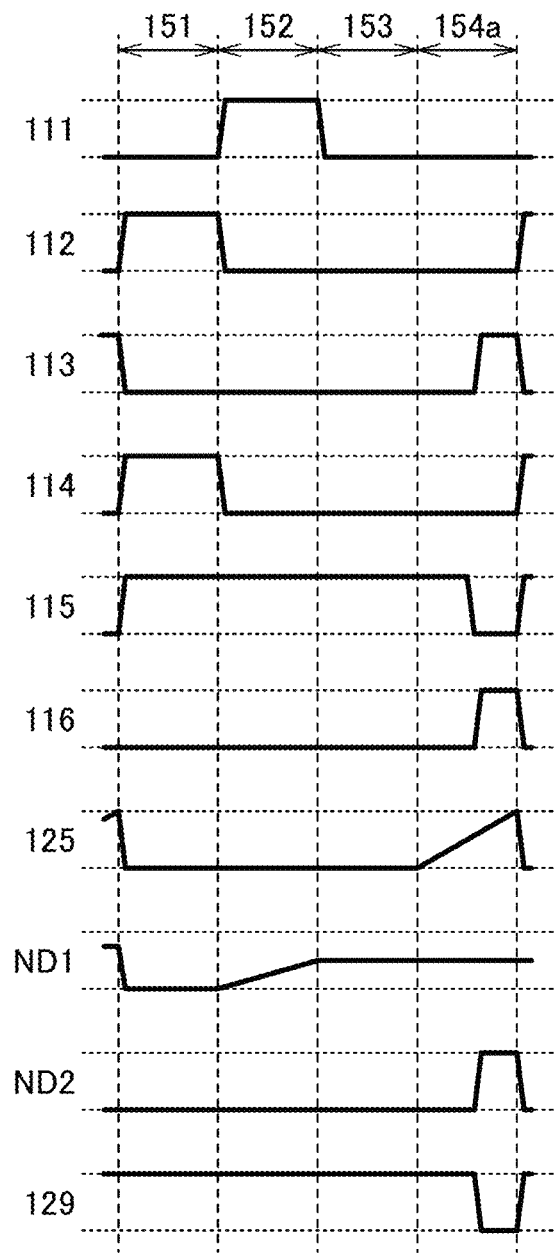
FIG. 7 is a timing chart showing operations of the semiconductor device.

Next, an operation example different from Operation Example 1 described above is described using FIG. 7. The description of the same operation as that in Operation Example 1 is basically omitted to avoid repeated description.

In Operation Example 2, the semiconductor device 100 is operated as in Operation Example 1 from the period 151 to the period 153.

[Period 154a]

In a period 154a, a ramp signal that continuously changes from a low potential to a high potential is supplied to the wiring 125 as the read signal RD. For example, a ramp signal that continuously changes from VSS to VDD is supplied to the wiring 125.

As described in Operation Example 1, when the difference between the potential of the wiring 125 and the potential $V_{ND1}$ is less than the threshold voltage of the transistor 113, the transistor 113 is in the off state and therefore the potential $V_{ND2}$ is not changed. In contrast, when the potential $V_{ND1}$ is lower than the potential of the wiring 125 and the difference between the potential of the wiring 125 and the potential $V_{ND1}$ is greater than the threshold voltage of the transistor 113, the transistor 113 is turned on, so that the potential of the wiring 125 is supplied to the node ND2.

When the potential of the wiring 129 changes from VDD to VSS, the potential of the wiring 125 is the potential $V_P$. Thus, the current $I_P$ can be converted into a voltage (potential $V_P$).

Operation Example 2 shows the case where the read operation is performed with the potential of the read signal RD continuously changed from a low potential to a high potential. However, the potential of the read signal RD can be gradually changed from a low potential to a high potential.

This embodiment can be implemented in an appropriate combination with any of the structures described in the other embodiments.

Embodiment 2

Figure 8A:
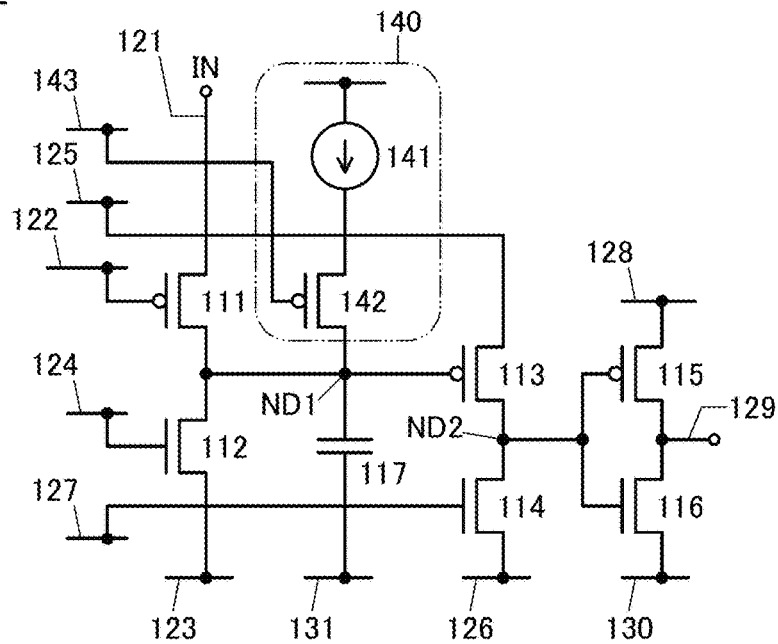
FIGS. 8A and 8B are circuit diagrams showing a semiconductor device.
Figure 8B:
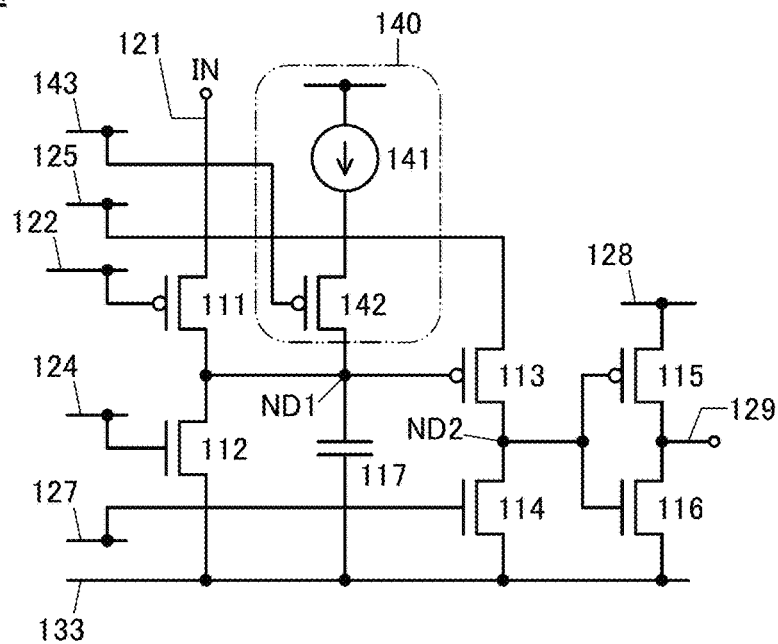
Figure 10A:
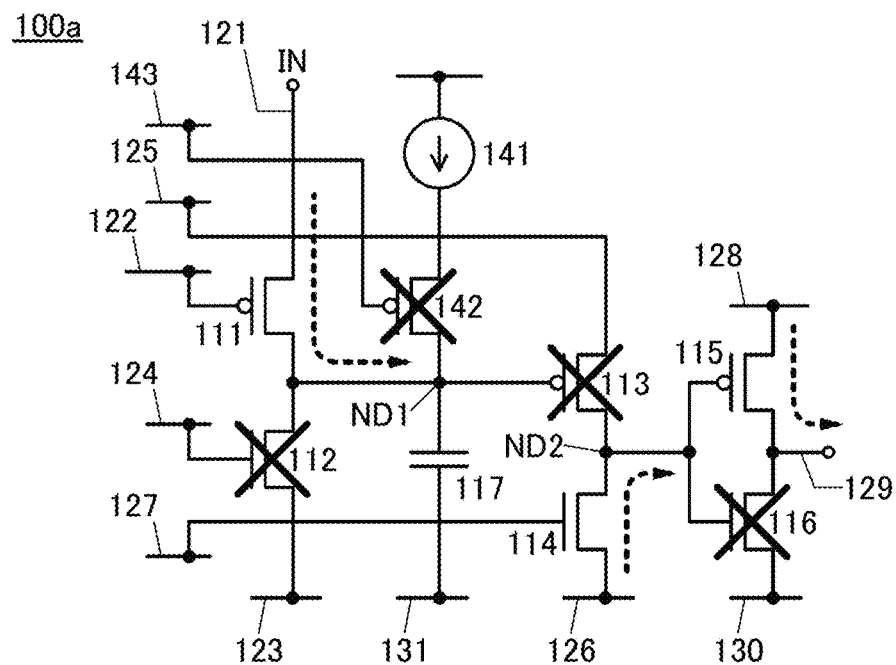
FIGS. 10A and 10B show operations of the semiconductor device.
Figure 10B:
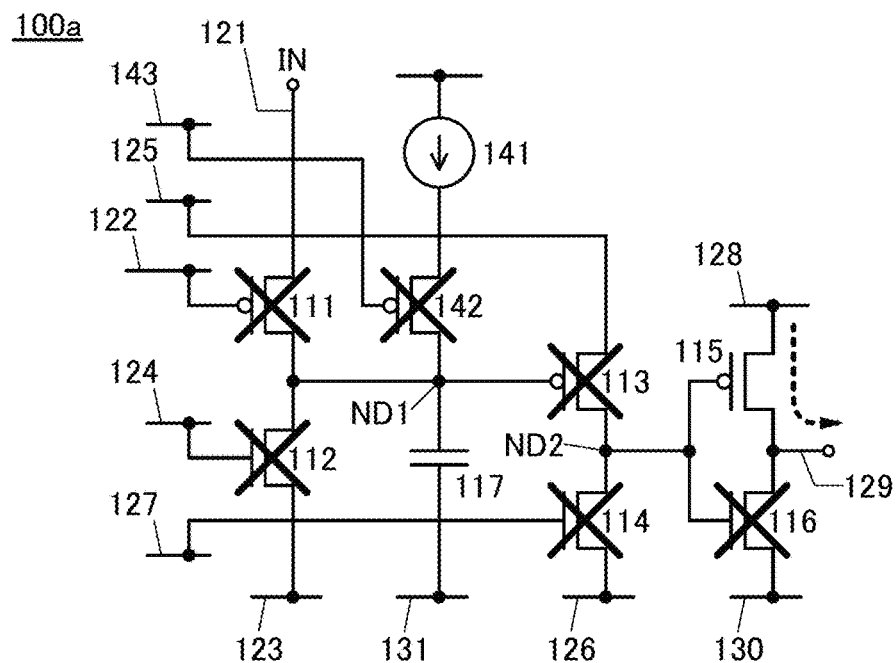

A semiconductor device 100a of one embodiment of the present invention is described with reference to drawings. FIGS. 8A and 8B are circuit diagrams showing configurations of the semiconductor device 100a.

<<Configuration Examples of Semiconductor Device 100a>>

The semiconductor device 100a includes a circuit 140 including a current source 141 and a transistor 142 in addition to the components of the semiconductor device 100. Note that the description of the same components as those of the semiconductor device 100 is basically omitted to avoid repeated description.

When the current $I_P$ input to the wiring 121 is converted into the potential $V_P$ in the semiconductor device 100, the accuracy of the potential $V_P$ might be reduced because of a variation in the threshold voltage of the transistor 113 and variations in the capacitance value of the capacitor 117 and the capacitance value, including parasitic capacitance, of the node ND1 (hereinafter also referred to as a "capacitance value $C_{ND1}$"). The threshold voltage of the transistor 113 and the capacitance value $C_{ND1}$ are obtained so that the accuracy of the potential $V_P$ can be increased and a more precise current-voltage conversion can be achieved.

In the circuit 140, one of a source and a drain of the transistor 142 is electrically connected to the current source 141 and the other is electrically connected to the node ND1. A gate of the transistor 142 is electrically connected to a wiring 143. The circuit 140 has a function of supplying a constant current to the node ND1 to measure the capacitance value $C_{ND1}$.

Both in the semiconductor devices 100 and 100a, wirings supplied with the same potential may be electrically connected to each other. For example, when the wirings 123, 131, 126, and 130 are supplied with the same potential, the wirings may be electrically connected to each other and may be replaced with one wiring. For example, as shown in FIG. 8B, the wirings 123, 131, 126, and 130 may be replaced with a wiring 133.

<<Operation Example of Semiconductor Device 100a>>

An operation of the semiconductor device 100a for obtaining the threshold voltage of the transistor 113 and the capacitance value $C_{ND1}$ is described using timing charts of FIGS. 9A and 9B and circuit diagrams of FIGS. 10A and 10B, FIGS. 11A and 11B, FIGS. 12A and 12B, FIGS. 13A and 13B, and FIG. 14. The timing charts of FIGS. 9A and 9B show the on and off states of the transistors 111 to 116 and 142 and the potentials of the node ND1, the node ND2, the wiring 125, and the wiring 129.

<Obtaining Threshold Voltage of Transistor 113>

An operation in which the threshold voltage of the transistor 113 is obtained is described.

[Period 161: Write Operation]

In a period 161 (see FIG. 10A), the transistor 142 is in an off state, the transistor 111 is turned on, and the transistor 112 is in an off state such that a potential $V_1$ is supplied to the node ND1 through the wiring 121. Note that the transistor 142, the transistor 112, and the transistor 111 may be in an off state, turned on, and turned on, respectively, such that the potential $V_1$ is supplied to the node ND1 through the wiring 123. In this embodiment, since the transistor 113 is a p-channel transistor, a potential less than or equal to VSS is supplied to the wiring 125 to turn off the transistor 113.

In this embodiment, VSS is used as the potential $V_1$. However, the potential $V_1$ is not limited to VSS.

In addition, the transistor 114 is turned on so that VSS is supplied to the node ND2. When the potential of the node ND2 becomes VSS, the transistor 115 is turned on and the transistor 116 is in an off state, so that VDD is supplied to the wiring 129.

[Period 162: Retention Operation]

In a period 162 (see FIG. 10B), the transistor 111 and transistor 114 are turned off. Then, the potential $V_1$ is retained as the potential $V_{ND1}$ in the node ND1, and VSS is retained as the potential $V_{ND2}$ in the node ND2.

[Period 163: Read Operation]

In a period 163, a ramp signal that continuously changes from a low potential to a high potential is supplied to the wiring 125 as the read signal RD. For example, a ramp signal that continuously changes from VSS to VDD is supplied to the wiring 125.

Figure 11A:
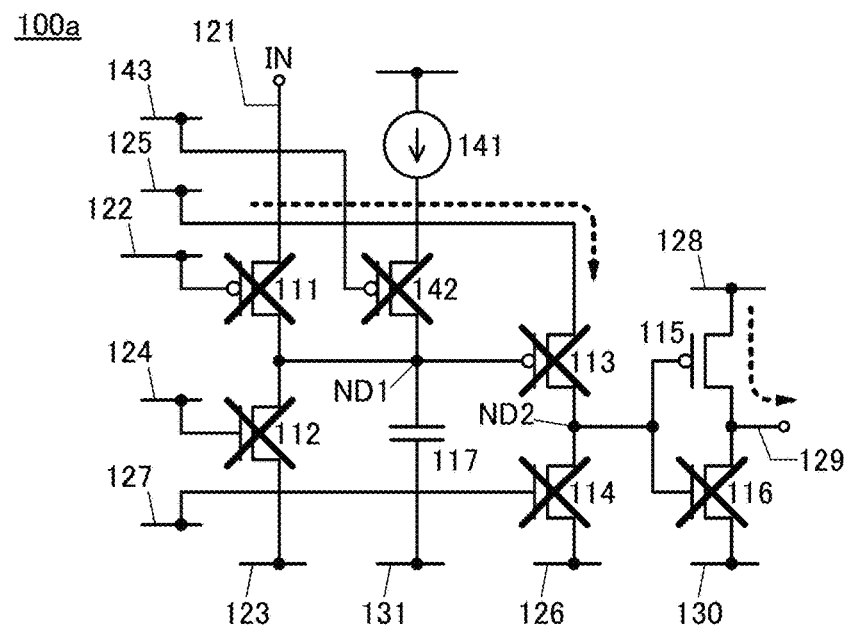
FIGS. 11A and 11B show operations of the semiconductor device.
Figure 11B:
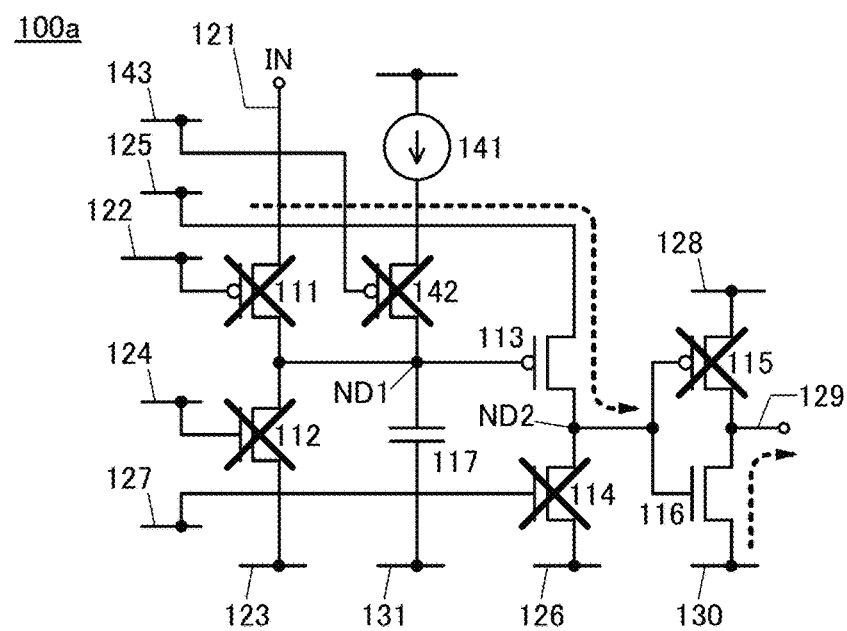
Figure 12A:
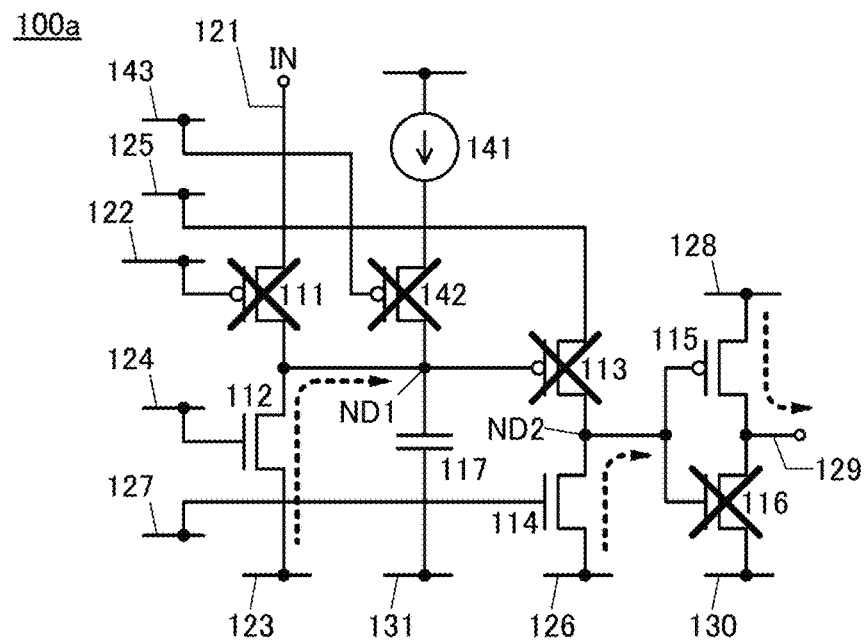
FIGS. 12A and 12B show operations of the semiconductor device.
Figure 12B:
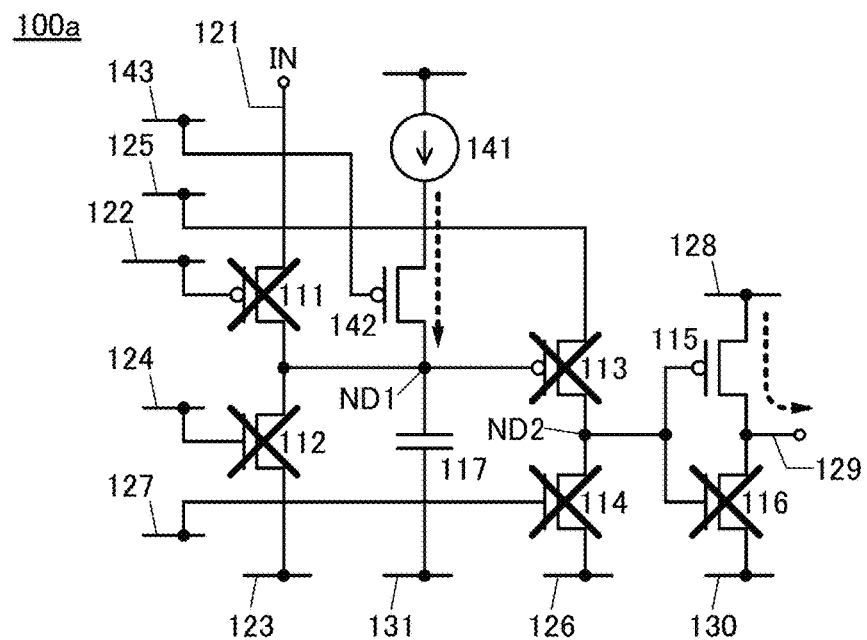

When the difference between the potential of the wiring 125 and the potential $V_{ND1}$ is less than the threshold voltage of the transistor 113, the transistor 113 is in the off state and therefore the potential $V_{ND2}$ is not changed (see FIG. 11A). In contrast, when the potential $V_{ND1}$ is lower than the potential of the wiring 125 and the difference between the potential of the wiring 125 and the potential $V_{ND1}$ is greater than the threshold voltage of the transistor 113, the transistor 113 is turned on, so that the potential of the wiring 125 is supplied to the node ND2. In this embodiment, the potential supplied to the node ND2 in the period 163 is the potential at which the transistor 116 is turned on and the transistor 115 is turned off. Consequently, VSS is supplied to the wiring 129 (see FIG. 11B).

When $V_{TH}$ denotes the threshold voltage of the transistor 113 and a potential $V_{RD}$ denotes the potential of the read signal RD at the time when the potential of the wiring 129 is changed from VDD to VSS, $V_{TH}$ can be obtained from Formula 1.

[Formula 1]

$$V_{TH}=V_1-V_{RD} \qquad (1)$$

<Obtaining Capacitance Value $C_{ND1}$>

Next, an operation for obtaining the capacitance value $C_{ND1}$ is described.

[Period 171: Reset Operation]

In a period 171 (see FIG. 12A), the transistor 111 is in the off state, the transistor 142 is in the off state, the transistor 112 is turned on, the transistor 113 is turned off, and the transistor 114 is turned on. In this embodiment, since the transistor 113 is a p-channel transistor, a potential less than or equal to VSS is supplied to the wiring 125.

When the transistor 112 is turned on, the potential $V_{ND1}$ becomes VSS. When the transistor 114 is turned on, the potential $V_{ND2}$ becomes VSS. When the potential $V_{ND2}$ becomes VSS, the transistor 115 is turned on and the transistor 116 is turned off, so that VDD is supplied to the wiring 129.

[Period 172: Write Operation]

In a period 172 (see FIG. 12B), the transistors 111 is in the off state, the transistor 112 is turned off, the transistor 113 is in the off state, and the transistor 114 is turned off. Since VSS is retained in the node ND2, the transistor 115 is in the on state and the transistor 116 is in the off state, so that VDD is supplied to the wiring 129.

In the period 172, the transistor 142 is turned on, so that a reference current (hereinafter also referred to as a "current $I_{REF}$") is supplied from the current source 141 to the node ND1. The value of the current $I_{REF}$ is constant, and the potential $V_{ND1}$ increases over time.

[Period 173: Retention Operation]

In a period 173 (see FIG. 13A), the transistor 142 is turned off. Then, the increase in potential $V_{ND1}$ stops, and the potential is retained.

[Period 174: Read Operation]

In a period 174, a ramp signal that continuously changes from a low potential to a high potential is supplied to the wiring 125 as the read signal RD. For example, a ramp signal that continuously changes from VSS to VDD is supplied to the wiring 125.

Figure 13A:
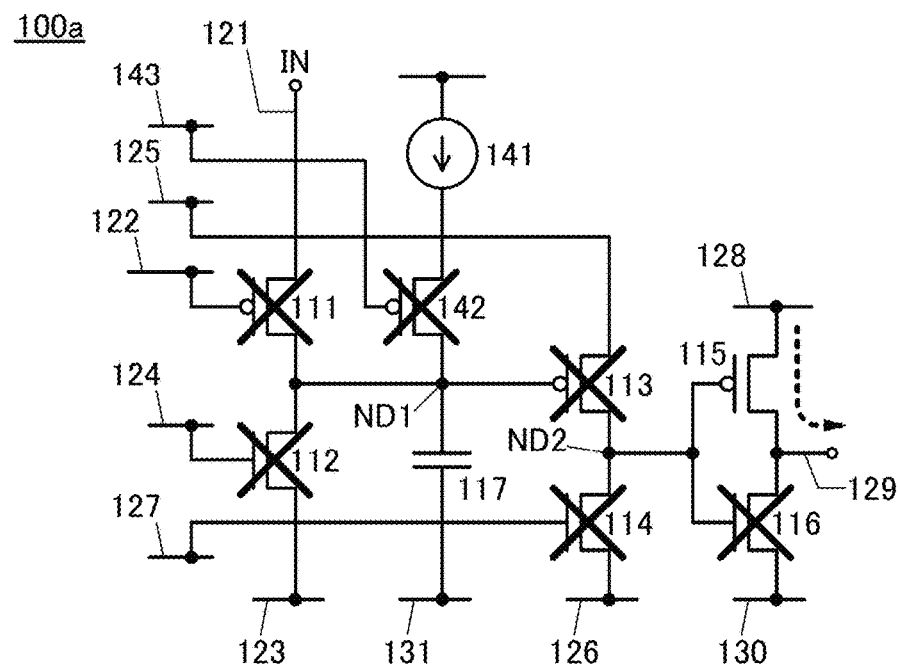
FIGS. 13A and 13B show operations of the semiconductor device.
Figure 13B:
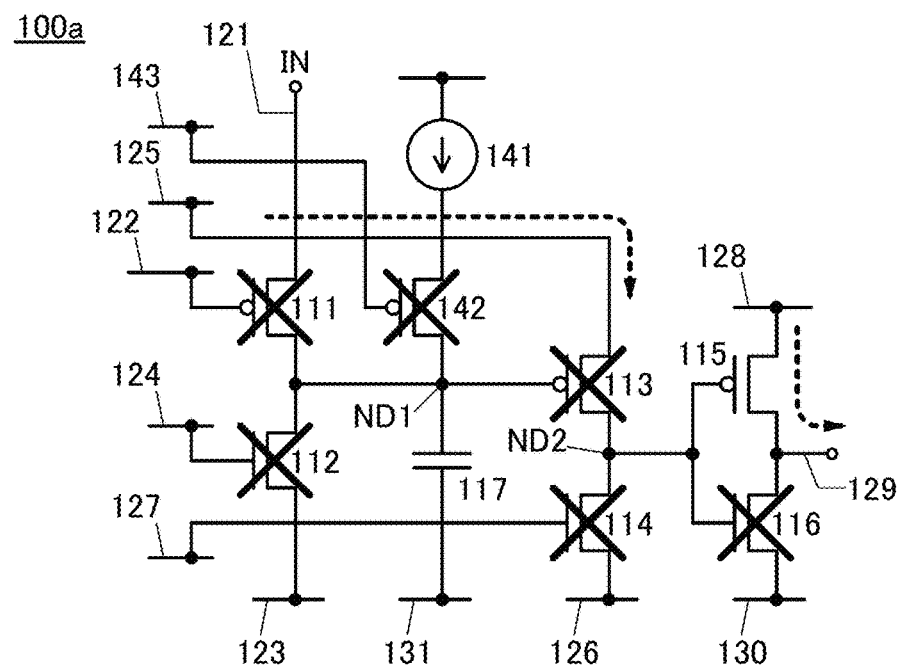
Figure 14:
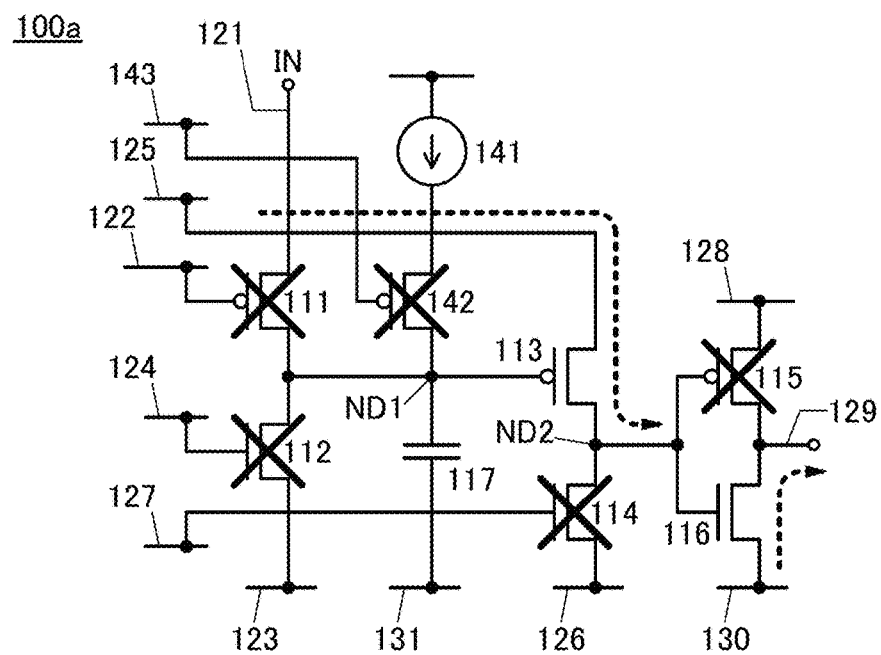
FIG. 14 shows an operation of the semiconductor device.

When the difference between the potential of the wiring 125 and the potential $V_{ND1}$ is less than the threshold voltage of the transistor 113, the transistor 113 is in the off state and therefore the potential $V_{ND2}$ is not changed (see FIG. 13B). In contrast, when the potential $V_{ND1}$ is lower than the potential of the wiring 125 and the difference between the potential of the wiring 125 and the potential $V_{ND1}$ is greater than the threshold voltage of the transistor 113, the transistor 113 is turned on, so that the potential of the wiring 125 is supplied to the node ND2. When the potential of the wiring 125 is the potential at which the transistor 116 is turned on and the transistor 115 is turned off, VSS is supplied to the wiring 129 (see FIG. 14).

When the potential $V_{RD}$ denotes the potential of the read signal RD at the time when the potential of the wiring 129 is changed from VDD to VSS and $V_{TH}$ denotes the threshold voltage of the transistor 113, the potential $V_{ND1}$ can be obtained from Formula 2.

[Formula 2]

$$V_{ND1}=V_{RD}+V_{TH} \qquad (2)$$

When $T_{REF}$ denotes a period during which the current $I_{REF}$ is supplied to the node ND1 (the period 172 or a period during which the transistor 142 is kept in the on state), the capacitance value $C_{ND1}$ can be obtained from Formula 3.

[Formula 3]

$$C_{ND1} = \frac{I_{REF} \times T_{REF}}{V_{ND1}} \qquad (3)$$

As described above, the threshold voltage of the transistor 113 and the capacitance value $C_{ND1}$ can be obtained. By taking the threshold voltage of the transistor 113 and the capacitance value $C_{ND1}$ into consideration in addition to the potential $V_P$, the accuracy of a current-voltage conversion (a conversion of the current $I_P$ into the potential $V_P$) can be increased.

This embodiment can be implemented in an appropriate combination with any of the structures described in the other embodiments.

Embodiment 3

Figure 15A:
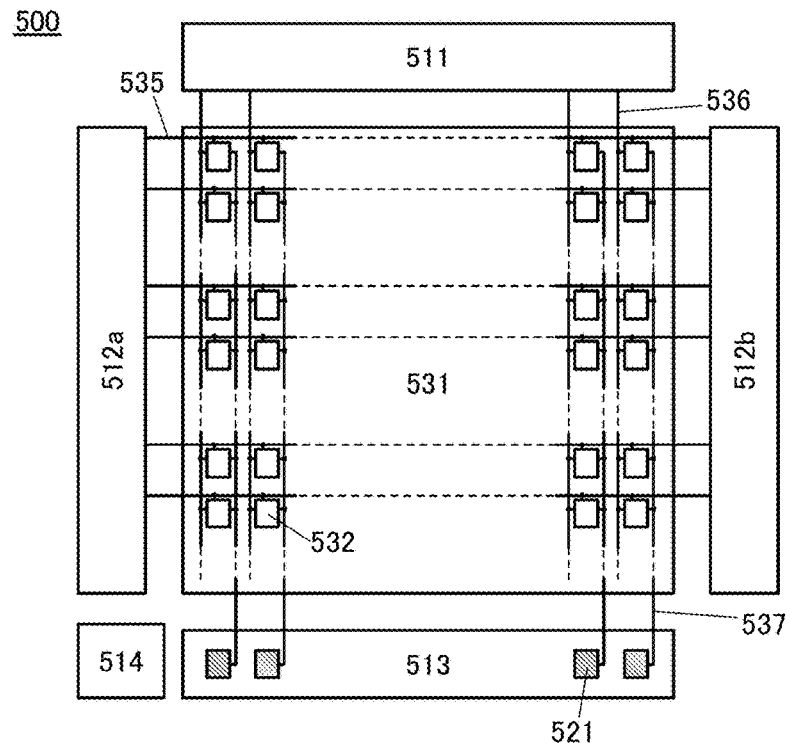
FIGS. 15A to 15C show examples of a display device.

In this embodiment, examples in which the semiconductor device 100 or the semiconductor device 100a is used in a display device are described with reference to drawings. FIG. 15A is a block diagram showing a configuration example of a display device 500. Although the block diagram shows elements classified according to their functions in independent blocks, it might be practically difficult to completely separate the elements according to their functions and, in some cases, one element might be involved in a plurality of functions.

<<Display Devices>>

The display device 500 in FIG. 15A includes driver circuits 511, 512a, and 512b, a sensor circuit 513, a control circuit 514, and a display region 531. Note that the driver circuits 511, 512a, and 512b, the sensor circuit 513, and the control circuit 514 are collectively referred to as a "driver circuit" or a "peripheral driver circuit" in some cases.

The driver circuits 512a and 512b can function as, for example, scan line driver circuits. The driver circuit 511 can function as, for example, a signal line driver circuit. Note that one of the driver circuits 512a and 512b may be omitted.

The display device 500 shown as an example in FIG. 15A includes m wirings 535 which are arranged substantially parallel to each other and whose potentials are controlled by the driver circuit 512*a* and/or the driver circuit 512*b*, n wirings 536 which are arranged substantially parallel to each other and whose potentials are controlled by the driver circuit 511, and n wirings 537 which are arranged substantially parallel to each other and electrically connected to the sensor circuit 513. The display region 531 includes a plurality of pixels 532 arranged in a matrix. The pixel 532 includes a pixel circuit 534 and a light-emitting element 426. In addition, the sensor circuit 513 includes n monitor circuits 521.

A wiring 535_*i* in the i-th row (i is a natural number greater than or equal to 1 and less than or equal to m) is electrically connected to n pixels 532 in the i-th row among the plurality of pixels 532 arranged in m rows and n columns (m and n are each a natural number of 1 or more) in the display region 531. A wiring 536_*j* in the j-th column (j is a natural number greater than or equal to 1 and less than or equal to n) is electrically connected to m pixels 532 in the j-th column among the plurality of pixels 532 arranged in m rows and n columns. A wiring 537_*j* in the j-th column (j is a natural number greater than or equal to 1 and less than or equal to n) is electrically connected to m pixels 532 in the j-th column among the plurality of pixels 532 arranged in m rows and n columns. In addition, a monitor circuit 521_*j* in the j-th column is electrically connected to the wiring 537_*j* in the j-th column.

When three pixels 532 function as one pixel, full-color display can be provided. The three pixels 532 each function as a sub-pixel. Three sub-pixels control, for example, the transmittance, the reflectance, or the amount of emitted light of red light, green light, and blue light. The colors of light controlled by the three sub-pixels are not limited to the combination of red, green, and blue and may be yellow, cyan, and magenta.

Four sub-pixels may collectively function as one pixel. For example, a sub-pixel that controls white light may be added to the three sub-pixels that control red light, green light, and blue light. The addition of the sub-pixel that controls white light can increase the luminance of the display region. When red, green, blue, yellow, cyan, and magenta are combined as appropriate with more sub-pixels functioning as one pixel, the range of color reproduction can be increased.

Using the pixels arranged in a matrix of 1920×1080, the display device 500 can display an image with "full high definition" (also referred to as "2K resolution", "2K1K", "2K", and the like). Using the pixels arranged in a matrix of 3840×2160, the display device 500 can display an image with "ultra-high definition" (also referred to as "4K resolution", "4K2K", "4K", and the like). Using the pixels arranged in a matrix of 7680×4320, the display device 500 can display an image with "super high definition" (also referred to as "8K resolution", "8K4K", "8K", and the like). Using a larger number of pixels, the display device 500 can display an image with 16K or 32K resolution.

[Display Element]

The display device 500 can employ various modes and include various display elements. Examples of the display element include a display medium whose contrast, luminance, reflectance, transmittance, or the like is changed by electrical or magnetic effect, such as an electroluminescence (EL) element (e.g., an EL element including organic and inorganic materials, or an EL element containing an organic or inorganic material), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a display element using micro electro mechanical systems (MEMS), a digital micromirror device (DMD), a digital micro shutter (DMS), MIRASOL (registered trademark), an interferometric modulation (IMOD) element, a MEMS shutter display element, an optical-interference-type MEMS display element, an electrowetting element, a piezoelectric ceramic display, or a display element using a carbon nanotube. Alternatively, quantum dots may be used as the display element.

Note that examples of display devices having EL elements include an EL display. Examples of display devices including electron emitters include a field emission display (FED) and an SED-type flat panel display (SED: surface-conduction electron-emitter display). Examples of display devices including quantum dots include a quantum dot display. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of display devices including electronic ink, electronic liquid powder (registered trademark), or electrophoretic elements include electronic paper. For example, the display device may be a plasma display panel (PDP).

In the case of a transflective liquid crystal display or a reflective liquid crystal display, some of or all of pixel electrodes function as reflective electrodes. For example, some or all of pixel electrodes contain aluminum, silver, or the like. In such a case, a memory circuit such as an SRAM can be provided under the reflective electrodes, leading to lower power consumption.

Note that when an LED is used, graphene or graphite may be provided under an electrode or a nitride semiconductor of the LED. Graphene or graphite may be a multilayer film in which a plurality of layers are stacked. Provision of graphene or graphite in this way enables easy formation of a nitride semiconductor film (such as an n-type GaN semiconductor layer including crystals) thereover. Furthermore, a p-type GaN semiconductor layer including crystals or the like can be provided thereover to form the LED. Note that an AlN layer may be provided between the n-type GaN semiconductor layer including crystals and graphene or graphite. The GaN semiconductor layers included in the LED may be formed by MOCVD. Note that when the graphene is provided, the GaN semiconductor layers included in the LED can be formed by a sputtering method.

[Examples of Pixel Circuit for Light-Emitting Display Device]

Figure 15B:
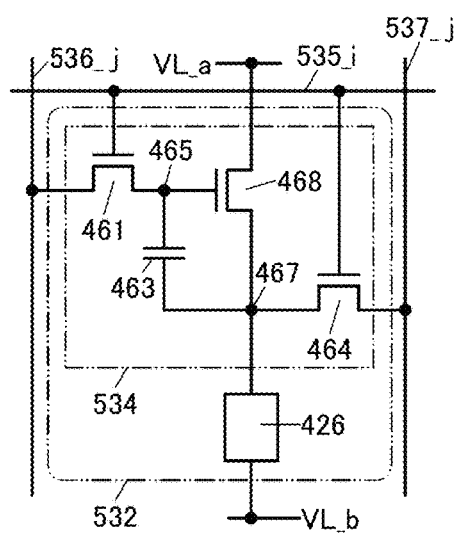
Figure 15C:
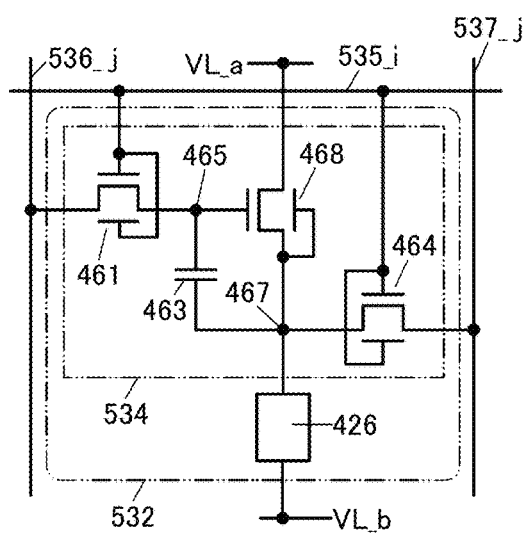

FIGS. 15B and 15C show circuit configuration examples that can be used for the pixel 532 for a light-emitting display device.

The pixel circuit 534 shown in FIG. 15B includes a transistor 461, a capacitor 463, a transistor 468, and a transistor 464. The pixel circuit 534 shown in FIG. 15B is electrically connected to the light-emitting element 426 which can function as a display element.

As shown in FIG. 15C, the transistors 461, 464, and 468 may be transistors with back gates. In each of the transistors 461 and 464 in FIG. 15C, the gate is electrically connected to the back gate. Thus, the gate and the back gate always have the same potential. The back gate of the transistor 468 is electrically connected to a node 467. Therefore, the back gate always has the same potential as the node 467.

One of a source and a drain of the transistor 461 is electrically connected to the wiring 536_*j*, the other is electrically connected to a node 465, and a gate thereof is electrically connected to the wiring 535_*i*. From the wiring 536_j, a video signal is supplied, and from the wiring 537_j, an initialization signal is supplied.

The transistor 461 has a function of determining whether to write the video signal to the node 465. The transistor 468 can also function as a driving transistor that determines the amount of a current flowing through the light-emitting element 426. The transistor 464 has a function of controlling whether to write the initialization signal to the node 467. The transistor 464 also has a function of determining whether to write the current $I_P$ to the wiring 537_j.

One of a pair of electrodes of the capacitor 463 is electrically connected to the node 465, and the other is electrically connected to the node 467. The capacitor 463 functions as a storage capacitor for storing data written to the node 465.

One of a source and a drain of the transistor 468 is electrically connected to a potential supply line VL_a, and the other is electrically connected to the node 467. A gate of the transistor 468 is electrically connected to the node 465.

One of a source and a drain of the transistor 464 is electrically connected to the wiring 537_j, and the other is electrically connected to the node 467. A gate of the transistor 464 is electrically connected to the wiring 535_i.

One of an anode and a cathode of the light-emitting element 426 is electrically connected to a potential supply line VL_b, and the other is electrically connected to the node 467.

As the light-emitting element 426, an organic electroluminescent element (also referred to as an organic EL element) or the like can be used, for example. Note that the light-emitting element 426 is not limited to organic EL elements; an inorganic EL element including an inorganic material can be used, for example.

For example, VDD is supplied to one of the potential supply line VL_a and the potential supply line VL_b, and VSS is supplied to the other.

In the examples in FIGS. 15B and 15C, the transistors are all n-channel transistors. When the transistors in the pixel circuit 534 have the same channel type, it is possible to omit some of steps for fabricating the transistors, for example, a step of adding an impurity element imparting one conductivity type to the semiconductor layer. Note that in the display device of one embodiment of the present invention, not all the transistors in the pixel circuit 534 are necessarily n-channel transistors. When the cathode of the light-emitting element 426 is connected to the wiring VL_b, at least the transistor 468 is preferably an n-channel transistor. When the anode of the light-emitting element 426 is connected to the wiring VL_b, at least the transistor 468 is preferably a p-channel transistor.

[Operation Example of Pixel Circuit for Light-Emitting Display Device]

An operation example of the pixel circuit for a light-emitting display device is described. In the display device 500 including the pixel circuit 534 in FIGS. 15B and 15C, the pixels 532 are sequentially selected row by row by the driver circuit 512a and/or the driver circuit 512b, whereby the transistors 461 and 464 are turned on. Then, through the transistor 461, the video signal is written to the node 465. Through the transistor 464, the initialization signal is written to the node 467.

When the transistors 461 and 464 are turned off, the signals written to the node 465 and 467 are brought into a holding state. Furthermore, the amount of current flowing between the source and the drain of the transistor 468 is controlled in accordance with the signal (potential) written to the node 465. The light-emitting element 426 emits light with a luminance corresponding to the amount of flowing current. This operation is sequentially performed row by row; thus, an image can be displayed.

[Operation Example of Obtaining Current $I_P$]

An example of a method in which the current $I_P$ including information on the threshold voltage or mobility of the driver transistor is obtained in the pixel 532 shown in FIG. 15B or FIG. 15C is described. The current $I_P$ can be obtained row by row. First, the transistors 461 and 464 included in the pixel circuit 534 in the i-th row are turned on. Then, a common potential (0 V) is supplied to the node 467 through the wiring 537_j. Note that the potential supplied to the node 467 is not necessarily the common potential. In addition, a reference potential $V_{REF}$ is supplied to the node 465 through the wiring 536_j. The reference potential $V_{REF}$ is the potential at which the transistor 468 is turned on.

In the case where the cathode of the light-emitting element 426 is connected to the wiring VL_b, a potential greater than or equal to the potential of the node 467 is supplied to the wiring VL_b. For example, when a common potential is supplied to the node 467, a potential greater than or equal to the common potential is supplied to the wiring VL_b.

Next, the wiring 537_j is set in a floating state. Then, since the transistor 468 is in the on state, the current $I_P$ is supplied to the wiring 437_j through the transistor 464. The current $I_P$ is determined by the threshold voltage and mobility of the transistor 464.

The current $I_P$ supplied to the wiring 437_j is measured by the monitor circuit 521. As the monitor circuit 521 in this embodiment, the semiconductor device 100 or the semiconductor device 100a of one embodiment of the present invention can be used. The current $I_P$ including information on the threshold voltage of and mobility of the transistor 464 is converted into the potential $V_P$ by the monitor circuit 521 and supplied to the control circuit 514.

The control circuit 514 has a function of supplying a driving signal for use in the peripheral driver circuit. The driving signal includes a start pulse signal SSP, a clock signal SCK, and a latch signal LP for controlling operation of the peripheral driver circuit, a start pulse GSP and a clock signal GCK for controlling operation of the driver circuit, and the like.

The control circuit 514 also has a function of correcting a video signal based on the information (potential $V_P$) obtained by the monitor circuit 521 and supplying the corrected video signal to the driver circuit 511.

[Example of Pixel Circuit for Hybrid Display Device]

Figure 16:
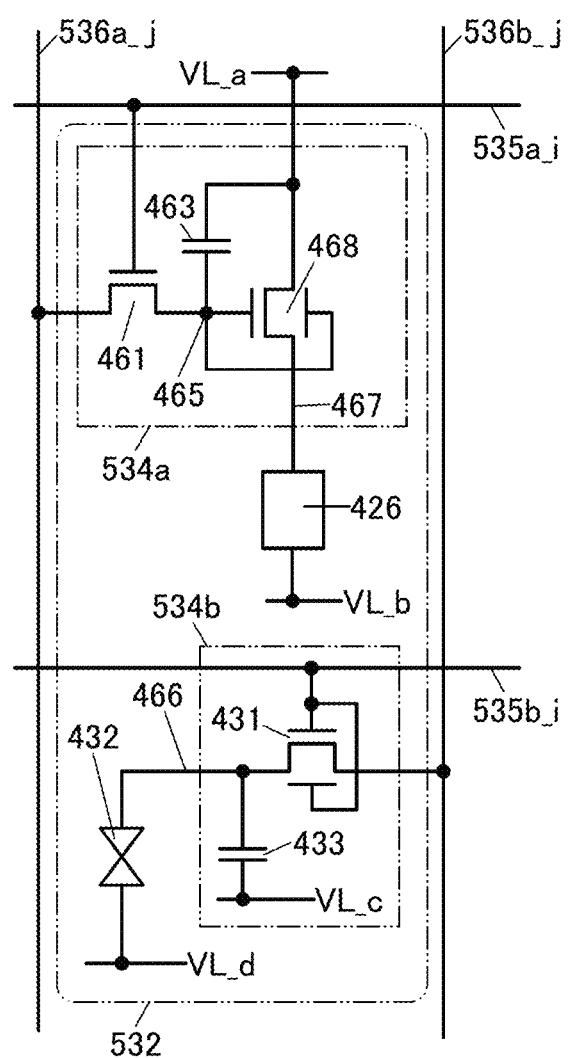
FIG. 16 shows an example of a display device.

FIG. 16 shows an example of a circuit configuration that can be used for a hybrid display device in which one pixel 532 includes a plurality of kinds of display elements. In this embodiment, an example of a circuit configuration in which a light-emitting element and a liquid crystal element are used as display elements is described.

The pixel 532 shown in FIG. 16 includes a pixel circuit 534a electrically connected to the light-emitting element 426 and a pixel circuit 534b electrically connected to a liquid crystal element 432.

The pixel circuit 534a includes the transistor 461, the transistor 468, and the capacitor 463. The one of the source and the drain of the transistor 461 is electrically connected to a wiring 536a_j, the other is electrically connected to the node 465, and the gate thereof is electrically connected to a wiring 535a_i. From the wiring 536a_j, a video signal is supplied.

The one of the source and the drain of the transistor 468 is electrically connected to the potential supply line VL_a, the other is electrically connected to the node 467, and the gate thereof is electrically connected to the node 465. The transistor 468 has a back gate, and the back gate is electrically connected to the node 465.

The one of the electrodes of the capacitor 463 is electrically connected to the potential supply line VL_a, and the other is electrically connected to the node 465.

The one of the anode and the cathode of the light-emitting element 426 is electrically connected to the potential supply line VL_b, and the other is electrically connected to the node 467.

The pixel circuit 534b includes the transistor 431 and a capacitor 433. One of a source and a drain of the transistor 431 is electrically connected to a wiring 536b_j, the other is electrically connected to a node 466, and a gate thereof is electrically connected to a wiring 535b_i. The transistor 431 has a back gate, and the back gate is electrically connected to the wiring 535b_i. From the wiring 536b_j, a video signal is supplied. The transistor 431 has a function of controlling whether to write the video signal to the node 466.

One of the electrodes of the capacitor 433 is electrically connected to a potential supply line VL_c, and the other is electrically connected to the node 466. The capacitor 433 functions as a storage capacitor for storing data written to the node 466.

One of electrodes of the liquid crystal element 432 is electrically connected to the node 466, and the other is electrically connected to a potential supply line VL_d. To the potential supply lines VL_c and VL_d, a fixed potential such as VDD, VSS, or a common potential (also referred to as "COM" or a "COM potential") is supplied. The potentials supplied to the potential supply lines VL_c and VL_d may be the same or different from each other. The potential of at least one of the potential supply lines VL_c and VL_d may be varied depending on the purpose.

The alignment state in the liquid crystal element 432 depends on data written to the node 466. As a method of driving the display device including the liquid crystal element 432, any of the following methods may be used, for example: a TN mode, an STN mode, a VA mode, an axially symmetric aligned micro-cell (ASM) mode, an optically compensated birefringence (OCB) mode, a ferroelectric liquid crystal (FLC) mode, an antiferroelectric liquid crystal (AFLC) mode, an MVA mode, a patterned vertical alignment (PVA) mode, an IPS mode, an FFS mode, a transverse bend alignment (TBA) mode, and the like. Examples of the driving method of the display device other than the above driving methods include an electrically controlled birefringence (ECB) mode, a polymer dispersed liquid crystal (PDLC) mode, a polymer network liquid crystal (PNLC) mode, and a guest-host mode. Note that the present invention is not limited to these examples, and various liquid crystal elements and driving methods can be used.

In the case where a liquid crystal element is used as the display element, thermotropic liquid crystal, low-molecular liquid crystal, high-molecular liquid crystal, polymer-dispersed liquid crystal, ferroelectric liquid crystal, anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, liquid crystal exhibiting a blue phase for which an alignment film is unnecessary may be used. A blue phase is one of liquid crystal phases, which is generated just before a cholesteric phase changes into an isotropic phase while the temperature of cholesteric liquid crystal is increased. Since the blue phase appears only in a narrow temperature range, a liquid crystal composition in which 5 wt % or more of a chiral material is mixed is used for the liquid crystal layer in order to improve the temperature range. The liquid crystal composition that includes the liquid crystal exhibiting a blue phase and a chiral material has a short response time of 1 msec or less, and has optical isotropy, which makes the alignment process unnecessary and the viewing angle dependence small. An alignment film does not need to be provided and rubbing treatment is thus not necessary; accordingly, electrostatic discharge damage caused by the rubbing treatment can be prevented and defects and damage of the liquid crystal display device in the manufacturing process can be reduced. Thus, productivity of the liquid crystal display device can be improved.

The plurality of kinds of display elements provided in one pixel 532 can achieve image display in which a display element suitable for the use environment of the display device is used. For example, a light-emitting element is used for image display in a dark place and a reflective liquid crystal element is used for image display in a bright place such as the outdoors when the light-emitting element and the liquid crystal element are used as display elements; thus, the visibility of the displayed images can be improved.

With one embodiment of the present invention, a display device having high display quality can be achieved. A display device with low power consumption can be achieved.

This embodiment can be implemented in an appropriate combination with any of the structures described in the other embodiments.

Embodiment 4

In this embodiment, examples of a transistor that can be used for the pixel circuit, the driver circuit, or the like described in the above-described embodiments are described.

The semiconductor device or the like of one embodiment of the present invention can be fabricated by using a transistor with any of various structures, such as a bottom-gate transistor or a top-gate transistor. Therefore, a material for a semiconductor layer or the structure of a transistor can be easily changed to comply with the existing production line.

[Bottom-Gate Transistor]

FIG. 17A1 is a cross-sectional view of a channel-protective transistor 410 which is a type of bottom-gate transistor. The transistor 410 includes an electrode 246 over a substrate 271 with an insulating layer 272 positioned therebetween. The transistor 410 includes a semiconductor layer 242 over the electrode 246 with an insulating layer 226 provided therebetween. The electrode 246 can function as a gate electrode. The insulating layer 226 can function as a gate insulating layer.

The transistor 410 includes an insulating layer 225 over a channel formation region in the semiconductor layer 242. The transistor 410 includes an electrode 244a and an electrode 244b which are in contact with part of the semiconductor layer 242 and over the insulating layer 226. Part of the electrode 244a and part of the electrode 244b are formed over the insulating layer 225.

The insulating layer 225 can function as a channel protective layer. With the insulating layer 225 provided over the channel formation region, the semiconductor layer 242 can be prevented from being exposed at the time of forming the electrodes 244a and 244b. Thus, the channel formation region in the semiconductor layer 242 can be prevented from being etched at the time of forming the electrodes 244a and 244b. With one embodiment of the present invention, a transistor with favorable electrical characteristics can be provided.

The transistor 410 includes an insulating layer 228 over the electrode 244a, the electrode 244b, and the insulating layer 225 and further includes an insulating layer 229 over the insulating layer 228.

When an oxide semiconductor is used for the semiconductor layer 242, a material that is capable of removing oxygen from part of the semiconductor layer 242 to generate oxygen vacancies is preferably used at least for regions of the electrodes 244a and 244b which are in contact with the semiconductor layer 242. The carrier concentration of the regions of the semiconductor layer 242 in which oxygen vacancies are generated is increased, so that the regions become n-type regions ($n^+$ layers). Accordingly, the regions can function as a source region or a drain region. Examples of the material that is capable of removing oxygen from an oxide semiconductor to generate oxygen vacancies include tungsten and titanium.

Formation of the source region and the drain region in the semiconductor layer 242 makes it possible to reduce contact resistance between the semiconductor layer 242 and the electrode 244a and contact resistance between the semiconductor layer 242 and the electrode 244b. Accordingly, the electrical characteristics of the transistor, such as the field-effect mobility and the threshold voltage, can be favorable.

In the case where a semiconductor such as silicon is used for the semiconductor layer 242, a layer that functions as an n-type semiconductor or a p-type semiconductor is preferably provided between the semiconductor layer 242 and the electrode 244a and between the semiconductor layer 242 and the electrode 244b. The layer that functions as an n-type semiconductor or a p-type semiconductor can function as a source region or a drain region in the transistor.

The insulating layer 229 is preferably formed using a material that can prevent or reduce diffusion of impurities into the transistor from the outside. The formation of the insulating layer 229 may be omitted as appropriate.

When an oxide semiconductor is used for the semiconductor layer 242, heat treatment may be performed before and/or after the insulating layer 229 is formed. The heat treatment can fill oxygen vacancies in the semiconductor layer 242 by diffusing oxygen contained in the insulating layer 229 or other insulating layers into the semiconductor layer 242. Alternatively, the insulating layer 229 may be formed while the heat treatment is performed, so that oxygen vacancies in the semiconductor layer 242 can be filled.

Note that a CVD method can be generally classified into a plasma enhanced CVD (PECVD) method using plasma, a thermal CVD (TCVD) method using heat, and the like. A CVD method can further be classified into a metal CVD (MCVD) method, a metal organic CVD (MOCVD) method, and the like according to a source gas to be used.

Furthermore, an evaporation method can be generally classified into a resistance heating evaporation method, an electron beam evaporation method, a molecular beam epitaxy (MBE) method, a pulsed laser deposition (PLD) method, an ion beam assisted deposition (IAD) method, an atomic layer deposition (ALD) method, and the like.

By using a PECVD method, a high-quality film can be formed at a relatively low temperature. By using a deposition method that does not use plasma for deposition, such as an MOCVD method or an evaporation method, a film with few defects can be formed because damage is not easily caused on a surface on which the film is deposited.

A sputtering method is generally classified into a DC sputtering method, a magnetron sputtering method, an RF sputtering method, an ion beam sputtering method, an electron cyclotron resonance (ECR) sputtering method, a facing-target sputtering method, and the like.

In a facing-target sputtering method, plasma is confined between targets; thus, plasma damage to a substrate can be reduced. Furthermore, step coverage can be improved because the incident angle of a sputtered particle to a substrate can be made smaller depending on the inclination of a target.

A transistor 411 illustrated in FIG. 17A2 is different from the transistor 410 in that an electrode 223 which can function as a back gate electrode is provided over the insulating layer 229. The electrode 223 can be formed using a material and a method that are similar to those of the electrode 246.

In general, a back gate electrode is formed using a conductive layer and positioned so that a channel formation region of a semiconductor layer is positioned between a gate electrode and the back gate electrode. Thus, the back gate electrode can function in a manner similar to that of the gate electrode. The potential of the back gate electrode may be the same as that of the gate electrode or may be a GND potential or a predetermined potential. By changing the potential of the back gate electrode independently of the potential of the gate electrode, the threshold voltage of a transistor can be changed.

The electrode 246 and the electrode 223 can each function as a gate electrode. Thus, the insulating layers 226, 228, and 229 can each function as a gate insulating layer. The electrode 223 may also be provided between the insulating layers 228 and 229.

When one of the electrode 246 and the electrode 223 is simply referred to as a "gate electrode" or a "gate", the other can be referred to as a "back gate electrode" or a "back gate". For example, in the transistor 411, when the electrode 223 is referred to as a "gate electrode", the electrode 246 is referred to as a "back gate electrode". When the electrode 223 is used as a "gate electrode", the transistor 411 can be regarded as a kind of top-gate transistor. Alternatively, one of the electrode 246 and the electrode 223 may be referred to as a "first gate electrode", and the other may be referred to as a "second gate electrode".

By providing the electrode 246 and the electrode 223 so that the semiconductor layer 242 is located therebetween, and by setting the potentials of the electrode 246 and the electrode 223 to be the same, a region of the semiconductor layer 242 through which carriers flow is enlarged in the film thickness direction; thus, the number of transferred carriers is increased. As a result, the on-state current and field-effect mobility of the transistor 411 are increased.

Therefore, the transistor 411 has a comparatively high on-state current for its area. That is, the area of the transistor 411 can be small for a required on-state current. With one embodiment of the present invention, the area of a transistor can be reduced. Therefore, with one embodiment of the present invention, a semiconductor device having a high degree of integration can be provided.

The gate electrode and the back gate electrode are formed using conductive layers and thus each have a function of preventing an electric field generated outside the transistor from influencing the semiconductor layer in which the channel is formed (in particular, an electric field blocking function against static electricity and the like). When the back gate electrode is formed larger than the semiconductor layer such that the semiconductor layer is covered with the back gate electrode, the electric field blocking function can be enhanced.

Since the electrode 246 and the electrode 223 each have a function of blocking an electric field from the outside, charges of charged particles and the like generated on the insulating layer 272 side or above the electrode 223 do not influence the channel formation region in the semiconductor layer 242. Thus, degradation by a stress test (e.g., a negative gate bias temperature (−GBT) stress test in which negative charge is applied to a gate) can be reduced. In addition, the electrode 246 and the electrode 223 can block an electric field generated from the drain electrode so as not to affect the semiconductor layer. Thus, changes in the rising voltage of on-state current due to changes in drain voltage can be suppressed. Note that this effect is significant when a potential is applied to the electrode 246 and the electrode 223.

The BT stress test is one kind of accelerated test and can evaluate, in a short time, a change in the characteristics of transistors by long-term use (i.e., a change over time). In particular, the amount of change in the threshold voltage of a transistor in the BT stress test is an important indicator such that the reliability of the transistor is examined. As the amount of change in threshold voltage is smaller, the transistor has higher reliability.

By providing the electrodes 246 and 223 and setting the potentials of the electrodes 246 and 223 to be the same, the amount of change in threshold voltage is reduced. Accordingly, variation in electrical characteristics among a plurality of transistors is also reduced.

The transistor including the back gate electrode has a smaller change in threshold voltage by a positive GBT stress test in which positive charges are applied to the gate than a transistor including no back gate electrode.

When the back gate electrode is formed using a light-blocking conductive film, light can be prevented from entering the semiconductor layer from the back gate electrode side. Therefore, photodegradation of the semiconductor layer can be prevented and degradation of electrical characteristics of the transistor, such as a shift of the threshold voltage, can be prevented.

With one embodiment of the present invention, a transistor with high reliability can be provided. Moreover, a semiconductor device with high reliability can be provided.

FIG. 17B1 is a cross-sectional view of a channel-protective transistor 420 which is a type of bottom-gate transistor. The transistor 420 has substantially the same structure as the transistor 410 but is different from the transistor 410 in that the insulating layer 225 covers the semiconductor layer 242. With the insulating layer 225, the semiconductor layer 242 can be prevented from being exposed at the time of forming the electrodes 244a and 244b. Thus, the semiconductor layer 242 can be prevented from being reduced in thickness at the time of forming the electrodes 244a and 244b.

The semiconductor layer 242 is electrically connected to the electrode 244a in an opening formed by selectively removing part of the insulating layer 225 which overlaps with the semiconductor layer 242. The semiconductor layer 242 is electrically connected to the electrode 244b in another opening formed by selectively removing part of the insulating layer 225 which overlaps with the semiconductor layer 242. A region of the insulating layer 225 which overlaps with the channel formation region can function as a channel protective layer.

A transistor 421 illustrated in FIG. 17B2 is different from the transistor 420 in that the electrode 223 which can function as a back gate electrode is provided over the insulating layer 229.

The distance between the electrodes 244a and 246 and the distance between the electrodes 244b and 246 in the transistors 420 and 421 are longer than those in the transistors 410 and 411. Thus, the parasitic capacitance generated between the electrodes 244a and 246 can be reduced. Furthermore, the parasitic capacitance generated between the electrodes 244b and 246 can be reduced. With one embodiment of the present invention, a transistor with favorable electrical characteristics can be provided.

A transistor 425 illustrated in FIG. 17C1 is a channel-etched transistor that is a type of bottom-gate transistor. In the transistor 425, the insulating layer 225 is not provided and the electrodes 244a and 244b are formed in contact with the semiconductor layer 242. Thus, part of the semiconductor layer 242 which is exposed when the electrodes 244a and 244b are formed is etched in some cases. However, since the insulating layer 225 is not provided, the productivity of the transistor can be increased.

A transistor 425 illustrated in FIG. 17C2 is different from the transistor 420 in that the electrode 223 which can function as a back gate electrode is provided over the insulating layer 229.

[Top-Gate Transistor]

FIG. 18A1 is a cross-sectional view of a transistor 430 which is a type of top-gate transistor. The transistor 430 includes the semiconductor layer 242 over the substrate 271 with the insulating layer 272 therebetween, the electrodes 244a and 244b which are over the semiconductor layer 242 and the insulating layer 272 and in contact with part of the semiconductor layer 242, the insulating layer 226 over the semiconductor layer 242 and the electrodes 244a and 244b, and the electrode 246 over the insulating layer 226.

In the transistor 430, since the electrode 246 overlaps with neither the electrode 244a nor the electrode 244b, the parasitic capacitance generated between the electrodes 246 and 244a and the parasitic capacitance generated between the electrodes 246 and 244b can be reduced. After the formation of the electrode 246, an impurity 255 is introduced into the semiconductor layer 242 using the electrode 246 as a mask, so that an impurity region can be formed in the semiconductor layer 242 in a self-aligned manner (see FIG. 18A3). With one embodiment of the present invention, a transistor with favorable electrical characteristics can be provided.

The introduction of the impurity 255 can be performed with an ion implantation apparatus, an ion doping apparatus, or a plasma treatment apparatus.

As the impurity 255, for example, at least one kind of element of Group 13 elements and Group 15 elements can be used. In the case where an oxide semiconductor is used for the semiconductor layer 242, at least one kind of element of a rare gas, hydrogen, and nitrogen can be used as the impurity 255.

A transistor 431 illustrated in FIG. 18A2 is different from the transistor 430 in that the electrode 223 and an insulating layer 227 are included. The transistor 431 includes the electrode 223 formed over the insulating layer 272 and the insulating layer 227 formed over the electrode 223. The electrode 223 can function as a back gate electrode. Thus, the insulating layer 227 can function as a gate insulating layer. The insulating layer 227 can be formed using a material and a method that are similar to those of the insulating layer 226.

The transistor 431 as well as the transistor 411 has a high on-state current for its area. That is, the area occupied by the transistor 431 can be small for a required on-state current. With one embodiment of the present invention, the area occupied by a transistor can be reduced. Therefore, with one embodiment of the present invention, a semiconductor device having a high degree of integration can be provided.

A transistor 440 illustrated in FIG. 18B1 as an example is a type of top-gate transistor. The transistor 440 is different from the transistor 430 in that the semiconductor layer 242 is formed after the formation of the electrodes 244a and 244b. A transistor 441 illustrated in FIG. 18B2 is different from the transistor 440 in that the electrode 223 and the insulating layer 227 are included. Thus, in the transistors 440 and 441, part of the semiconductor layer 242 is formed over the electrode 244a and another part of the semiconductor layer 242 is formed over the electrode 244b.

The transistor 441 as well as the transistor 411 has a high on-state current for its area. That is, the area occupied by the transistor 441 can be small for a required on-state current. With one embodiment of the present invention, the area occupied by a transistor can be reduced. Therefore, with one embodiment of the present invention, a semiconductor device having a high degree of integration can be provided.

A transistor 442 illustrated in FIG. 19A1 as an example is a type of top-gate transistor. The transistor 442 has the electrodes 244a and 244b over the insulating layer 229. The electrodes 244a and 244b are electrically connected to the semiconductor layer 242 in openings formed in the insulating layers 228 and 229.

Part of the insulating layer 226 which does not overlap with the electrode 246 is removed. The insulating layer 226 included in the transistor 442 is partly extended across the ends of the electrode 246.

The impurity 255 is added to the semiconductor layer 242 using the electrode 246 and the insulating layer 226 as masks, so that an impurity region can be formed in the semiconductor layer 242 in a self-aligned manner (see FIG. 19A3).

At this time, the impurity 255 is not added to a region of the semiconductor layer 242 which overlaps with the electrode 246, and the impurity 255 is added to a region of the semiconductor layer 242 which does not overlap with the electrode 246. A region of the semiconductor layer 242 to which the impurity 255 is added through the insulating layer 226 has a lower impurity concentration than a region of the semiconductor layer 242 to which the impurity 255 is added without through the insulating layer 226. Thus, a lightly doped drain (LDD) region is formed in a region in the semiconductor layer 242 which is adjacent to the electrode 246 when seen from the above.

A transistor 443 illustrated in FIG. 19A2 is different from the transistor 442 in that the transistor 443 includes the electrode 223 below the semiconductor layer 242. The electrode 223 and the semiconductor layer 242 overlap with each other with the insulating layer 272 positioned therebetween. The electrode 223 can function as a back gate electrode.

As in a transistor 444 illustrated in FIG. 19B1 and a transistor 445 illustrated in FIG. 19B2, a region of the insulating layer 226 which does not overlap with the electrode 246 may be wholly removed. Alternatively, as in a transistor 446 illustrated in FIG. 19C1 and a transistor 447 illustrated in FIG. 19C2, the insulating layer 226 except for the openings may be left without being removed.

In the transistors 444 to 447, after the formation of the electrode 246, the impurity 255 is added to the semiconductor layer 242 using the electrode 246 as a mask, so that an impurity region can be formed in the semiconductor layer 242 in a self-aligned manner.

FIG. 20A is a cross-sectional view of a transistor 471 and a transistor 472 which use a semiconductor substrate as the substrate 271, which are examples of a top-gate transistor. A transistor manufactured using a semiconductor substrate can operate at high speed. In this embodiment, an example in which a p-type single-crystal silicon substrate is used as the substrate 271 is described. In each of the transistors 471 and 472, a channel is formed in the substrate 271.

The transistor 471 can function as an n-channel transistor. The transistor 471 includes a channel formation region 283, n-type impurity regions 284 functioning as lightly doped drain (LDD) regions or extension regions, n-type impurity regions 285 functioning as a source region and a drain region, an insulating layer 216, and an electrode 287. The electrode 287 functions as a gate electrode. The insulating layer 216 functions as a gate insulating layer. The n-type impurity regions 285 have a higher impurity concentration than the n-type impurity regions 284. A sidewall insulating layer 286 is provided on a side surface of the electrode 287. The n-type impurity regions 284 and the n-type impurity regions 285 can be formed in a self-aligned manner using the electrode 287 and the sidewall insulating layer 286 as masks.

The transistor 472 can function as a p-channel transistor. The transistor 472 is formed in an n-well 278. The n-well 278 is formed by adding an impurity element imparting n-type conductivity to part of the substrate 271. The transistor 472 includes a channel formation region 293, p-type impurity regions 294 functioning as lightly doped drain (LDD) regions or extension regions, p-type impurity regions 295 functioning as a source region and a drain region, the insulating layer 216, and an electrode 297. The electrode 297 functions as a gate electrode. The insulating layer 216 functions as a gate insulating layer. The p-type impurity regions 295 have a higher impurity concentration than the p-type impurity regions 294. A sidewall insulating layer 296 is provided on a side surface of the electrode 297. The p-type impurity regions 294 and the p-type impurity regions 295 can be formed in a self-aligned manner using the electrode 297 and the sidewall insulating layer 296 as masks.

The transistors 471 and 472 are isolated from another transistor formed in the substrate 271 by an element isolation region 299. The insulating layers 228 and 229 are formed to cover the electrode 287, the sidewall insulating layer 286, the electrode 297, and the sidewall insulating layer 296. An insulating layer 275 which has a flat surface is formed over the insulating layer 229, and electrodes 289a, 289b, 292a, and 292b are formed over the insulating layer 275.

The element isolation region 299 can be formed by a shallow trench isolation (STI) method or a local oxidation of silicon (LOCOS) method. The STI method can reduce the generation of a bird's beak in an element isolation region, which is caused in the LOCOS element isolation method, and can reduce the size of the element isolation region. Thus, it is preferable to employ the STI method to form the element isolation region 299.

The sidewall insulating layers 286 and 296 can be formed by a known method, such as anisotropic etching of an insulating layer.

The electrode 289a is electrically connected to one of the n-type impurity regions 285, through a contact plug 288a in an opening formed by removing part of the insulating layers 275, 229, and 228. The electrode 289b is electrically connected to the other of the n-type impurity regions 285, through a contact plug 288b in an opening formed by removing part of the insulating layers 275, 229, and 228.

The electrode 292a is electrically connected to one of the p-type impurity regions 295, through a contact plug 298a in an opening formed by removing part of the insulating layers 275, 229, and 228. The electrode 292b is electrically connected to the other of the p-type impurity regions 295, through a contact plug 298b in an opening formed by removing part of the insulating layers 275, 229, and 228.

As the transistor 471 and/or the transistor 472, a transistor containing silicide (salicide) or a transistor that does not include a sidewall insulating layer may be used. When a structure that contains silicide (salicide) is used, the resistance of the source region and the drain region can be further lowered and the speed of the semiconductor device can be increased. Furthermore, the semiconductor device can be operated at low voltage, so that power consumption of the semiconductor device can be reduced.

[Fin-Type Transistor]

FIGS. 20B1 and 20B2 illustrate another example of a transistor using a semiconductor substrate as the substrate 271. FIG. 20B1 is a cross-sectional view of a transistor 291 in the channel length direction, and FIG. 20B2 is a cross-sectional view of the transistor 291 in the channel width direction. The transistor 291 is a Fin-type transistor. The effective channel width is increased in the Fin-type transistor, whereby the on-state characteristics of the transistor can be improved. In addition, since contribution of the electric field of the gate electrode to the channel formation region can be increased, the off-state characteristics of the transistor can be improved.

In the transistor 291, an electrode 289c is formed over the insulating layer 275. The electrode 289c is electrically connected to the electrode 287, through a contact plug 288c in an opening formed by removing part of the insulating layers 275, 229, and 228 (see FIG. 20B2).

[S-Channel Transistor]

FIGS. 21A to 21C illustrate an example of the structure of a transistor using an oxide semiconductor for the semiconductor layer 242. In a transistor 450 illustrated in FIGS. 21A to 21C, a semiconductor layer 242b is formed over a semiconductor layer 242a, and a semiconductor layer 242c covers a top surface and a side surface of the semiconductor layer 242b and a side surface of the semiconductor layer 242a. FIG. 21A is the top view of the transistor 450. FIG. 21B is a cross-sectional view (in the channel length direction) taken along the dashed-dotted line X1-X2 in FIG. 21A. FIG. 21C is a cross-sectional view (in the channel width direction) taken along the dashed-dotted line Y1-Y2 in FIG. 21A.

The transistor 450 includes the electrode 246 functioning as a gate electrode. The electrode 246 is formed of two stacked conductive layers in this embodiment.

Each of the semiconductor layer 242a, the semiconductor layer 242b, and the semiconductor layer 242c is formed using a material containing either In or Ga or both of them. Typical examples are an In—Ga oxide (an oxide containing In and Ga), an In—Zn oxide (an oxide containing In and Zn), and an In-M-Zn oxide (an oxide containing In, an element M, and Zn; the element M is one or more kinds of elements selected from Al, Ti, Ga, Y, Zr, La, Ce, Nd, and Hf and has a higher strength of bonding with oxygen than In has).

The semiconductor layers 242a and 242c are preferably formed using a material including one or more kinds of metal elements included in the semiconductor layer 242b. With the use of such a material, interface states at interfaces between the semiconductor layers 242a and 242b and between the semiconductor layers 242c and 242b are less likely to be generated. Accordingly, carriers are not likely to be scattered or captured at the interfaces, which results in an improvement in the field-effect mobility of the transistor. Furthermore, variation in the threshold voltage of the transistor can be reduced. Thus, a semiconductor device having favorable electrical characteristics can be obtained.

The thicknesses of the semiconductor layers 242a and 242c are each greater than or equal to 3 nm and less than or equal to 100 nm, preferably greater than or equal to 3 nm and less than or equal to 50 nm. The thickness of the semiconductor layer 242b is greater than or equal to 3 nm and less than or equal to 200 nm, preferably greater than or equal to 3 nm and less than or equal to 100 nm, further preferably greater than or equal to 3 nm and less than or equal to 50 nm.

When the semiconductor layer 242b is an In-M-Zn oxide at an atomic ratio of $x_2:y_2:z_2$ and each of the semiconductor layers 242a and 242c is an In-M-Zn oxide at an atomic ratio of $x_1:y_1:z_1$, the compositions of the semiconductor layers 242a, 242c, and 242b can be determined so that $y_1/x_1$ is larger than $y_2/x_2$. Preferably, the semiconductor layer 242a, the semiconductor layer 242c, and the semiconductor layer 242b in which $y_1/x_1$ is 1.5 or more times as large as $y_2/x_2$ are selected. Still further preferably, the semiconductor layer 242a, the semiconductor layer 242c, and the semiconductor layer 242b in which $y_1/x_1$ is 2 or more times as large as $y_2/x_2$ are selected. Still further preferably, the semiconductor layer 242a, the semiconductor layer 242c, and the semiconductor layer 242b in which $y_1/x_1$ is 3 or more times as large as $y_2/x_2$ are selected. Preferably, $y_1$ is larger than or equal to $x_1$ because the transistor can have stable electrical characteristics. However, when $y_1$ is 3 or more times as large as $x_1$, the field-effect mobility of the transistor is reduced; accordingly, $y_1$ is preferably smaller than 3 times $x_1$. When the semiconductor layers 242a and 242c each have the above structure, each of the semiconductor layers 242a and 242c can be a layer in which oxygen vacancy is less likely to occur than in the semiconductor layer 242b.

In the case where the semiconductor layers 242a and 242c are each an In-M-Zn oxide, when the summation of In and the element M is assumed to be 100 atomic %, the proportions of In and an element M are preferably set to be less than 50 atomic % and greater than or equal to 50 atomic %, respectively, more preferably less than 25 atomic % and greater than or equal to 75 atomic %, respectively. In the case where the semiconductor layer 242b is an In-M-Zn oxide, when the summation of In and M is assumed to be 100 atomic %, the proportions of In and the element M are preferably set to be greater than or equal to 25 atomic % and less than 75 atomic %, respectively, more preferably greater than or equal to 34 atomic % and less than 66 atomic %, respectively.

For example, for each of the semiconductor layers 242a and 242c containing In or Ga, an In—Ga—Zn oxide formed using a target having an atomic ratio of In:Ga:Zn=1:3:2, 1:3:4, 1:3:6, 1:4:5, 1:6:4, or 1:9:6, for example, an In—Ga oxide formed using a target having an atomic ratio of In:Ga=1:9, gallium oxide, or the like can be used. For the semiconductor layer 242b, an In—Ga—Zn oxide formed using a target having an atomic ratio of In:Ga:Zn=3:1:2, 1:1:1, 5:5:6, 5:1:7, 4:2:3, or 4:2:4.1, for example, can be used. Note that the atomic ratio of each of the semiconductor layers 242a, 242b, and 242c may vary within a margin of ±20% of the corresponding atomic ratio.

In order to give stable electrical characteristics to the transistor including the semiconductor layer 242b, it is preferable that impurities and oxygen vacancies in the semiconductor layer 242b be reduced to highly purify the semiconductor layer 242b so that the semiconductor layer 242b can be regarded as an intrinsic or substantially intrinsic oxide semiconductor layer. Furthermore, it is preferable that at least the channel formation region of the semiconductor layer 242b be regarded as an intrinsic or substantially intrinsic semiconductor layer.

Note that the substantially intrinsic oxide semiconductor layer refers to an oxide semiconductor layer in which the carrier density is higher than or equal to $1\times10^{-9}/cm^3$ and lower than $8\times10^{11}/cm^3$, preferably lower than $1\times10^{11}/cm^3$, more preferably lower than $1\times10^{10}/cm^3$.

Figure 22A:
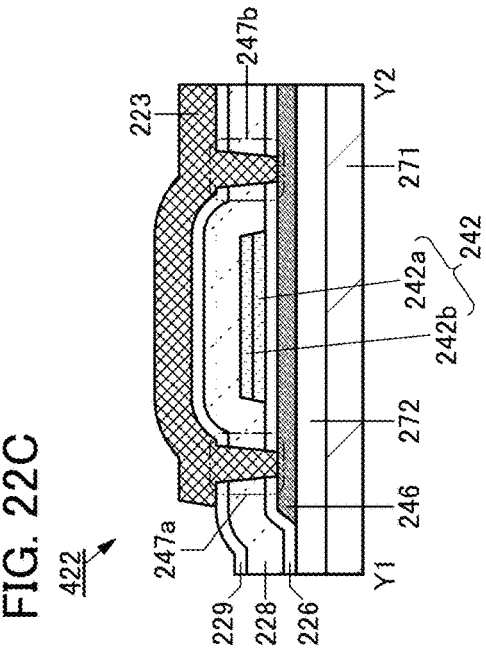
FIGS. 22A to 22C illustrate a semiconductor device.
Figure 22B:
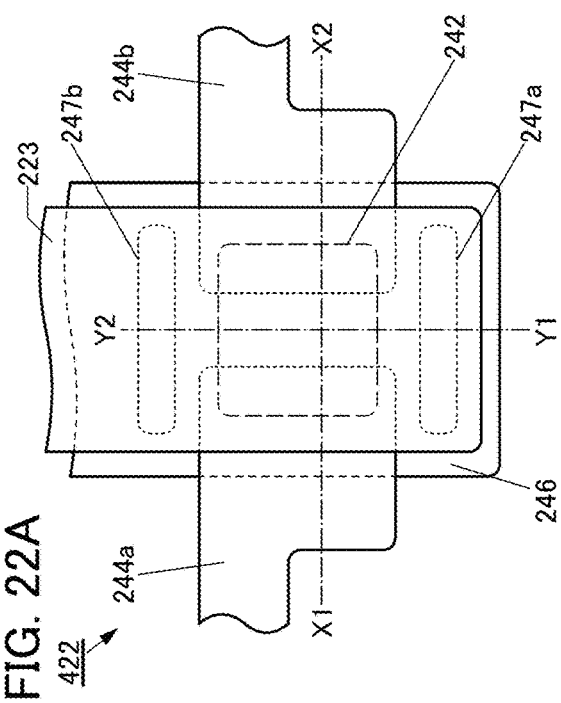
Figure 22C:
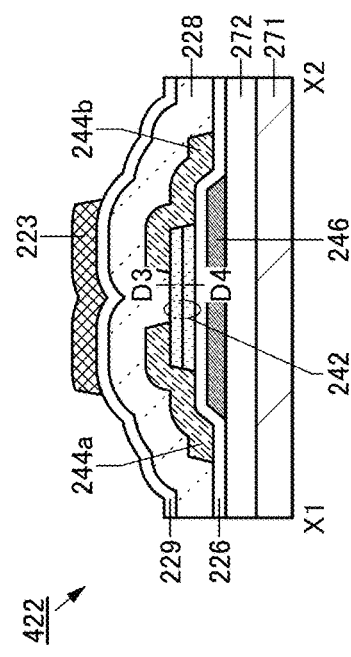

FIGS. 22A to 22C illustrate an example of the structure of a transistor including an oxide semiconductor layer as the semiconductor layer 242. In a transistor 422 illustrated in FIGS. 22A to 22C as an example, the semiconductor layer 242b is formed over the semiconductor layer 242a. The transistor 422 is a kind of bottom-gate transistor having a back-gate electrode. FIG. 22A is a top view of the transistor 422. FIG. 22B is a cross-sectional view (in the channel length direction) taken along the dashed-dotted line X1-X2 in FIG. 22A. FIG. 22C is a cross-sectional view (in the channel width direction) taken along dash-dot line Y1-Y2 in FIG. 22A.

The electrode 223 provided over the insulating layer 229 is electrically connected to the electrode 246 in an opening 247a and an opening 247b provided in the insulating layers 226, 228, and 229. Thus, the same potential is supplied to the electrodes 223 and 246. Furthermore, either or both of the openings 247a and 247b may be omitted. In the case where neither the opening 247a nor the opening 247b is provided, different potentials can be applied to the electrode 223 and the electrode 246.

[Energy Band Structure of Semiconductor Layer]

Figure 28A:
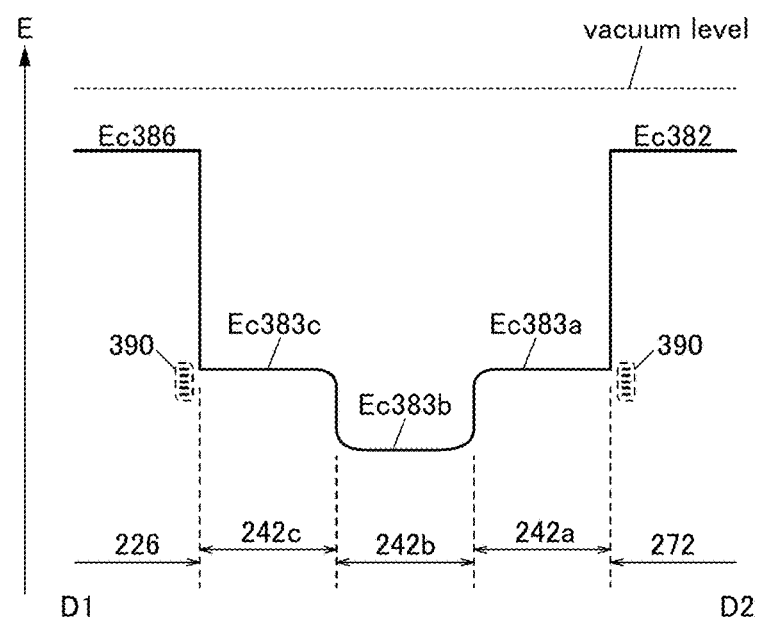
FIGS. 28A and 28B each show an energy band structure.
Figure 28B:
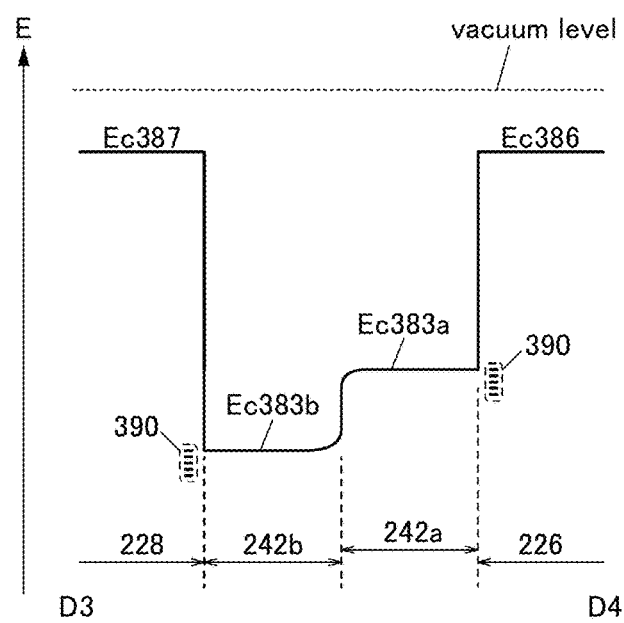

A function and an effect of the semiconductor layer 242 consisting of the stacked semiconductor layers 242a, 242b, and 242c are described using an energy band structure diagram of FIG. 28A or 28B. FIG. 28A shows the energy band structure of a portion along the dashed-dotted line D1-D2 in FIG. 21B. In other words, FIG. 28A shows the energy band structure of a channel formation region of the transistor 450.

In FIG. 28A, Ec382, Ec383a, Ec383b, Ec383c, and Ec386 indicate the energy of the conduction band minimum of the insulating layer 272, the semiconductor layer 242a, the semiconductor layer 242b, the semiconductor layer 242c, and the insulating layer 226, respectively.

Here, a difference in energy between the vacuum level and the bottom of the conduction band (the difference is also referred to as "electron affinity") corresponds to a value obtained by subtracting an energy gap from a difference in energy between the vacuum level and the top of the valence band (the difference is also referred to as an ionization potential). The energy gap can be measured using a spectroscopic ellipsometer (UT-300 manufactured by HORIBA Jobin Yvon SAS). The energy difference between the vacuum level and the valence band maximum can be measured using an ultraviolet photoelectron spectroscopy (UPS) device (e.g., VersaProbe manufactured by ULVAC-PHI, Inc.).

An In—Ga—Zn oxide formed using a target with an atomic ratio of In:Ga:Zn=1:3:2 has an energy gap of approximately 3.5 eV and an electron affinity of approximately 4.5 eV. An In—Ga—Zn oxide formed using a target with an atomic ratio of In:Ga:Zn=1:3:4 has an energy gap of approximately 3.4 eV and an electron affinity of approximately 4.5 eV. An In—Ga—Zn oxide formed using a target with an atomic ratio of In:Ga:Zn=1:3:6 has an energy gap of approximately 3.3 eV and an electron affinity of approximately 4.5 eV. An In—Ga—Zn oxide formed using a target with an atomic ratio of In:Ga:Zn=1:6:2 has an energy gap of approximately 3.9 eV and an electron affinity of approximately 4.3 eV. An In—Ga—Zn oxide formed using a target with an atomic ratio of In:Ga:Zn=1:6:8 has an energy gap of approximately 3.5 eV and an electron affinity of approximately 4.4 eV. An In—Ga—Zn oxide which is formed using a target having an atomic ratio of In:Ga:Zn=1:6:10 has an energy gap of approximately 3.5 eV and an electron affinity of approximately 4.5 eV. An In—Ga—Zn oxide formed using a target with an atomic ratio of In:Ga:Zn=1:1:1 has an energy gap of approximately 3.2 eV and an electron affinity of approximately 4.7 eV. An In—Ga—Zn oxide formed using a target with an atomic ratio of In:Ga:Zn=3:1:2 has an energy gap of approximately 2.8 eV and an electron affinity of approximately 5.0 eV.

Since the insulating layer 272 and the insulating layer 226 are insulators, Ec382 and Ec386 are closer to the vacuum level than Ec383a, Ec383b, and Ec383c (i.e., the insulating layer 272 and the insulating layer 226 have a smaller electron affinity than the semiconductor layer 242a, the semiconductor layer 242b, and the semiconductor layer 242c).

Ec383a is closer to the vacuum level than Ec383b. Specifically, Ec383a is preferably located closer to the vacuum level than Ec383b by greater than or equal to 0.05 eV, greater than or equal to 0.07 eV, greater than or equal to 0.1 eV, or greater than or equal to 0.15 eV and less than or equal to 2 eV, less than or equal to 1 eV, less than or equal to 0.5 eV, or less than or equal to 0.4 eV.

Ec383c is closer to the vacuum level than Ec383b. Specifically, Ec383c is preferably located closer to the vacuum level than Ec383b by greater than or equal to 0.05 eV, greater than or equal to 0.07 eV, greater than or equal to 0.1 eV, or greater than or equal to 0.15 eV and less than or equal to 2 eV, less than or equal to 1 eV, less than or equal to 0.5 eV, or less than or equal to 0.4 eV.

In the vicinity of an interface between the semiconductor layers 242a and 242b and the vicinity of an interface between the semiconductor layers 242b and 242c, mixed regions are formed; thus, the energy of the conduction band minimum continuously changes. In other words, no state or few states exist at these interfaces.

Thus, electrons move mainly in the semiconductor layer 242b in the stacked-layer structure having the above energy band structure. Therefore, even when states exist at the interface between the semiconductor layer 242a and the insulating layer 272 or at the interface between the semiconductor layer 242c and the insulating layer 226, the states hardly influence electron movement. In addition, the interface states do not exist or hardly exist at the interface between the semiconductor layers 242a and 242b and at the interface between the semiconductor layer 242c and the semiconductor layer 242b; thus, electron movement is not inhibited in the regions. Accordingly, high field-effect mobility can be obtained in the transistor 450 having the above stacked-layer structure of the oxide semiconductor layers.

Although trap states 390 due to impurities or defects might be formed at or near the interface between the semiconductor layer 242a and the insulating layer 272 and at or near the interface between the semiconductor layer 242c and the insulating layer 226 as shown in FIG. 28A, the semiconductor layer 242b can be separated from the trap states owing to the existence of the semiconductor layers 242a and 242c.

In particular, in the transistor 450 described as an example in this embodiment, the top surface and side surface of the semiconductor layer 242b are in contact with the semiconductor layer 242c, and the bottom surface of the semiconductor layer 242b is in contact with the semiconductor layer 242a. Surrounding the semiconductor layer 242b with the semiconductor layers 242a and 242c in this manner can further reduce the influence of the trap states.

However, when an energy difference between Ec383a or Ec383c and Ec383b is small, electrons in the semiconductor layer 242b might reach the trap states by passing over the energy gap. The electrons are trapped by the trap states, which generates a negative fixed charge at the interface with the insulating layer, causing the threshold voltage of the transistor to be shifted in the positive direction.

Therefore, each of the energy differences between Ec383a and Ec383b and between Ec383c and Ec383b is preferably set to be greater than or equal to 0.1 eV, further preferably greater than or equal to 0.15 eV, in which case a change in the threshold voltage of the transistor can be reduced and the transistor can have favorable electrical characteristics.

Each of the band gaps of the semiconductor layers 242a and 242c is preferably larger than that of the semiconductor layer 242b.

FIG. 28B is the energy band structure diagram of a portion along the dashed-dotted line D3-D4 in FIG. 22B. FIG. 28B shows the energy band structure of a channel formation region of the transistor 422.

In FIG. 28B, Ec387 indicates the energy of the conduction band minimum of the insulating layer 228. The semiconductor layer 242 is formed using two layers, the semiconductor layers 242a and 242b; thus, the transistor can be manufactured with improved productivity. Since the semiconductor layer 242c is not provided, the transistor including the two semiconductor layers is easily affected by the trap states 390 but can have higher field-effect mobility than a transistor including one semiconductor layer as the semiconductor layer 242.

With one embodiment of the present invention, a transistor with a small variation in electrical characteristics can be provided. Accordingly, a semiconductor device with a small variation in electrical characteristics can be provided. With one embodiment of the present invention, a transistor with high reliability can be provided. Accordingly, a semiconductor device with high reliability can be provided.

Note that an oxide semiconductor has an energy gap as large as 2 eV or more and high visible-light transmittance. In a transistor obtained by processing an oxide semiconductor under appropriate conditions, the off-state current at ambient temperature (e.g., 25° C.) can be less than or equal to 100 zA ($1 \times 10^{-19}$ A), less than or equal to 10 zA ($1 \times 10^{-20}$ A), or less than or equal to 1 zA ($1 \times 10^{-21}$ A). Therefore, a semiconductor device with low power consumption can be achieved.

With one embodiment of the present invention, a transistor with low power consumption can be provided. Accordingly, a display element or a semiconductor device such as a display device with low power consumption can be provided. Moreover, a display element or a semiconductor device such as a display device with high reliability can be provided.

The transistor 450 illustrated in FIGS. 21A to 21C is described again. The semiconductor layer 242b is provided over a projection of the insulating layer 272, in which case the side surface of the semiconductor layer 242b can be covered with the electrode 246. Thus, the transistor 450 has a structure in which the semiconductor layer 242b can be electrically surrounded by an electric field of the electrode 246. The structure of a transistor in which the semiconductor layer including the channel is electrically surrounded by an electric field of a conductive film in this way is referred to as a surrounded channel (s-channel) structure. A transistor having an s-channel structure is referred to as an "s-channel transistor".

In the s-channel transistor, a channel can be formed in the entire semiconductor layer 242b (bulk). In the s-channel structure, the drain current of the transistor is increased, so that a larger amount of on-state current can be obtained. Furthermore, the entire channel formation region of the semiconductor layer 242b can be depleted by the electric field of the electrode 246. Accordingly, the off-state current of the transistor with an s-channel structure can be further reduced.

When the projection of the insulating layer 272 is increased in height and the channel width is shortened, the effects of the s-channel structure to increase the on-state current and reduce the off-state current can be enhanced. Part of the semiconductor layer 242a exposed in the formation of the semiconductor layer 242b may be removed. In this case, the side surfaces of the semiconductor layers 242a and 242b may be aligned with each other.

Figure 23A:
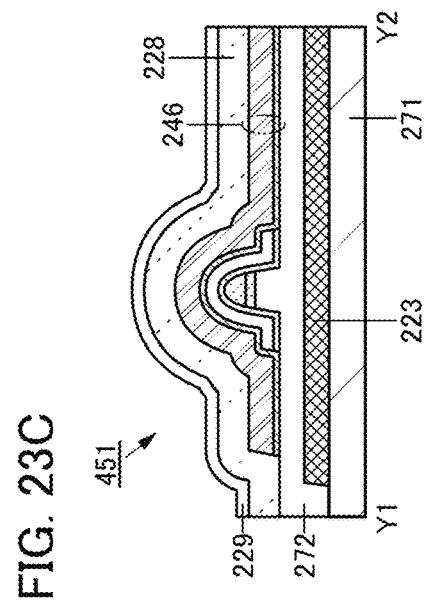
FIGS. 23A to 23C illustrate a semiconductor device.
Figure 23B:
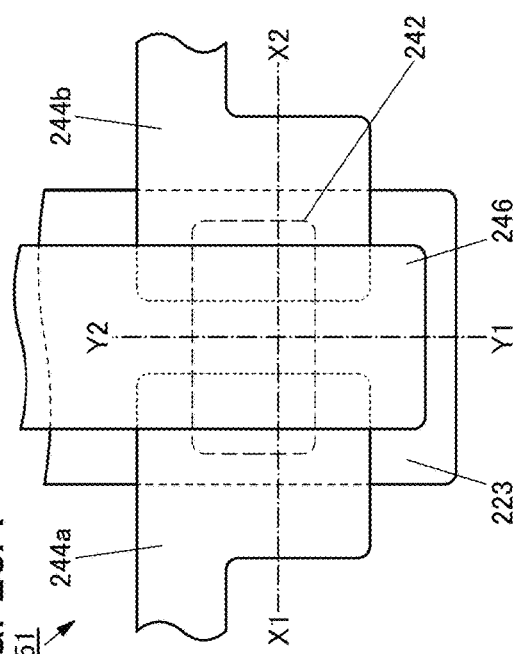
Figure 23C:
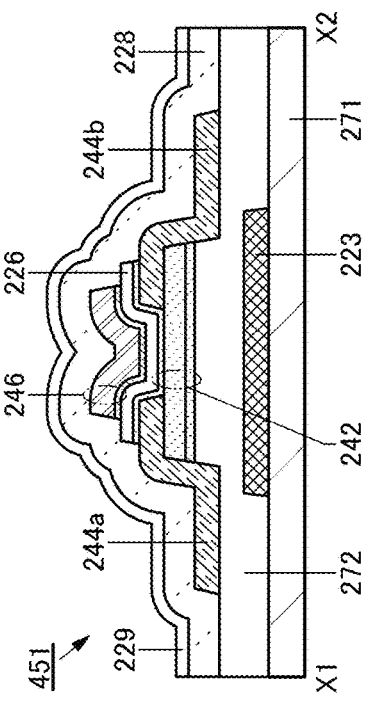

As in a transistor 451 illustrated in FIGS. 23A to 23C, the electrode 223 may be provided below the semiconductor layer 242 with an insulating layer provided therebetween. FIG. 23A is a top view of the transistor 451. FIG. 23B is a cross-sectional view taken along the dashed-dotted line X1-X2 in FIG. 23A. FIG. 23C is a cross-sectional view taken along the dashed-dotted line Y1-Y2 in FIG. 23A.

Figure 24A:
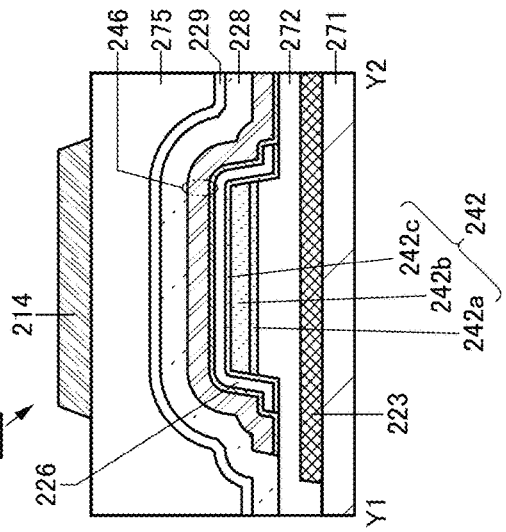
FIGS. 24A to 24C illustrate a semiconductor device.
Figure 24B:
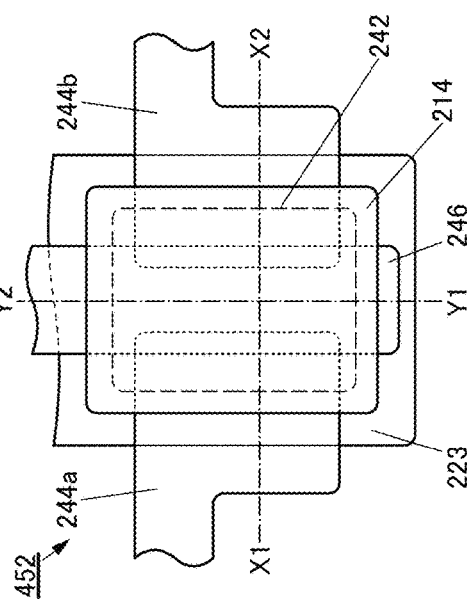
Figure 24C:
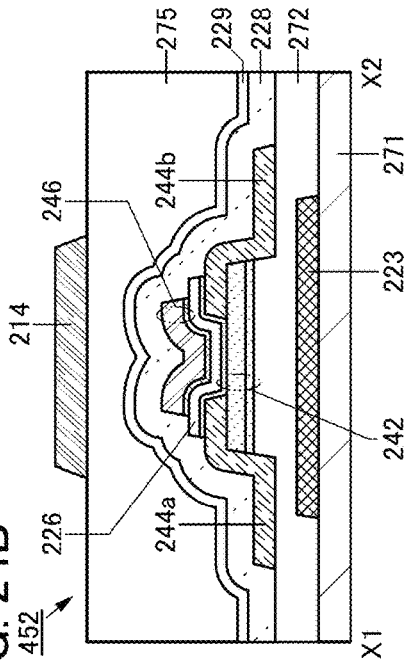

As in a transistor 452 illustrated in FIGS. 24A to 24C, the insulating layer 275 may be provided above the electrode 246 and a layer 214 may be provided over the insulating layer 275. FIG. 24A is a top view of the transistor 452. FIG. 24B is a cross-sectional view taken along the dashed-dotted line X1-X2 in FIG. 24A. FIG. 24C is a cross-sectional view taken along the dashed-dotted line Y1-Y2 in FIG. 24A.

Although the layer 214 is provided over the insulating layer 275 in FIGS. 24A to 24C, the layer 214 may be provided over the insulating layer 228 or 229. The layer 214 formed using a material with a light-blocking property can prevent a variation in characteristics, a decrease in reliability, or the like of the transistor caused by light irradiation. When the layer 214 is formed at least larger than the semiconductor layer 242b such that the semiconductor layer 242b is covered with the layer 214, the above effects can be improved. The layer 214 can be formed using an organic material, an inorganic material, or a metal material. In the case where the layer 214 is formed using a conductive material, the layer 214 may be supplied with a voltage or may be brought into an electrically-floating state.

Figure 25A:
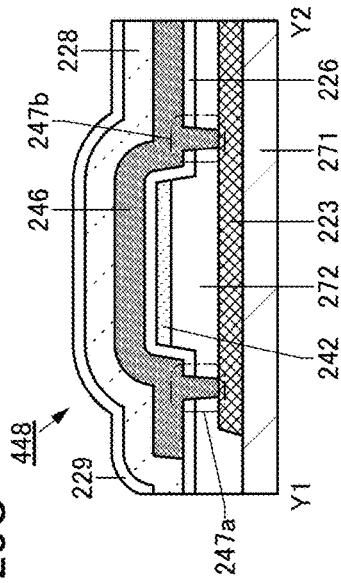
FIGS. 25A to 25C illustrate a semiconductor device.
Figure 25B:
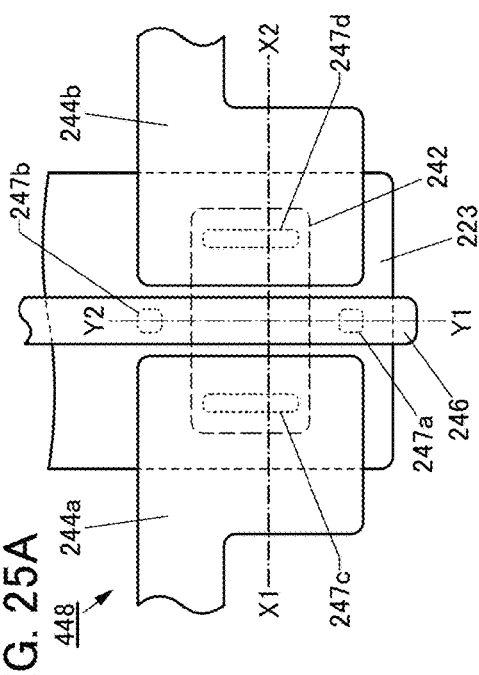
Figure 25C:
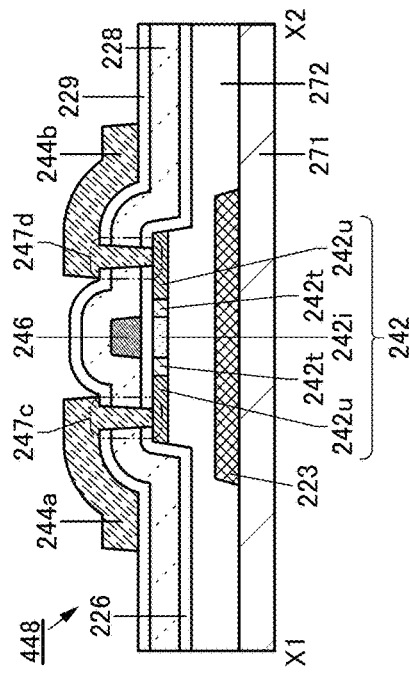

FIGS. 25A to 25C illustrate an example of a transistor with an s-channel structure. A transistor 448 in FIGS. 25A to 25C has almost the same structure as the transistor 447. In the transistor 448, the semiconductor layer 242 is formed over the projection of the insulating layer 272. The transistor 448 is a kind of top-gate transistor having a back-gate electrode. FIG. 25A is a top view of the transistor 448. FIG. 25B is a cross-sectional view taken along the dashed-dotted line X1-X2 in FIG. 25A. FIG. 25C is a cross-sectional view taken along the dashed-dotted line Y1-Y2 in FIG. 25A.

FIGS. 25A to 25C illustrate an example in which an inorganic semiconductor layer such as a silicon layer is used as the semiconductor layer 242 in the transistor 448. In FIGS. 25A to 25C, the semiconductor layer 242 includes a semiconductor layer 242i in a region overlapping with the gate electrode, two semiconductor layers 242t, and two semiconductor layers 242u. The semiconductor layer 242i is located between the two semiconductor layers 242t. The semiconductor layer 242i and the two semiconductor layers 242t are located between the two semiconductor layers 242u.

A channel is formed in the semiconductor layer 242i when the transistor 448 is in an on state. Therefore, the semiconductor layer 242i serves as a channel formation region. The semiconductor layers 242t serve as low concentration impurity regions (i.e., LDD). The semiconductor layers 242u serve as high concentration impurity regions. Note that one or both of the two semiconductor layers 242t are not necessarily provided. One of the two semiconductor layers 242u serves as a source region, and the other semiconductor layer 242u serves as a drain region.

The electrode 244a provided over the insulating layer 229 is electrically connected to one of the semiconductor layers 242u in an opening 247c formed in the insulating layers 226, 228, and 229. The electrode 244b provided over the insulating layer 229 is electrically connected to the other of the semiconductor layers 242u in an opening 247d formed in the insulating layers 226, 228, and 229.

The electrode 246 provided over the insulating layer 226 is electrically connected to the electrode 223 in the openings 247a and 247b formed in the insulating layers 226 and 272. Accordingly, the same potential is supplied to the electrodes 246 and 223. Either or both of the openings 247a and 247b may be omitted. In the case where neither the opening 247a nor the opening 247b is provided, different potentials can be applied to the electrode 223 and the electrode 246.

Figure 26A:
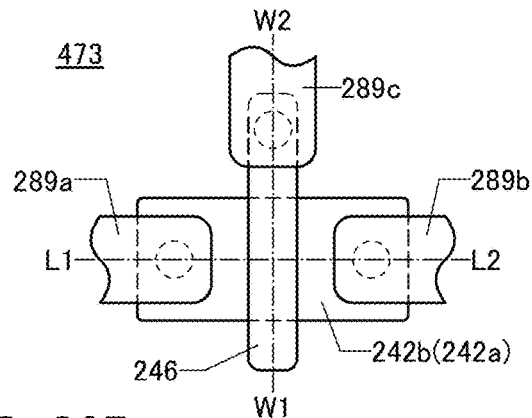
FIGS. 26A and 26B illustrate a semiconductor device.
Figure 26B:
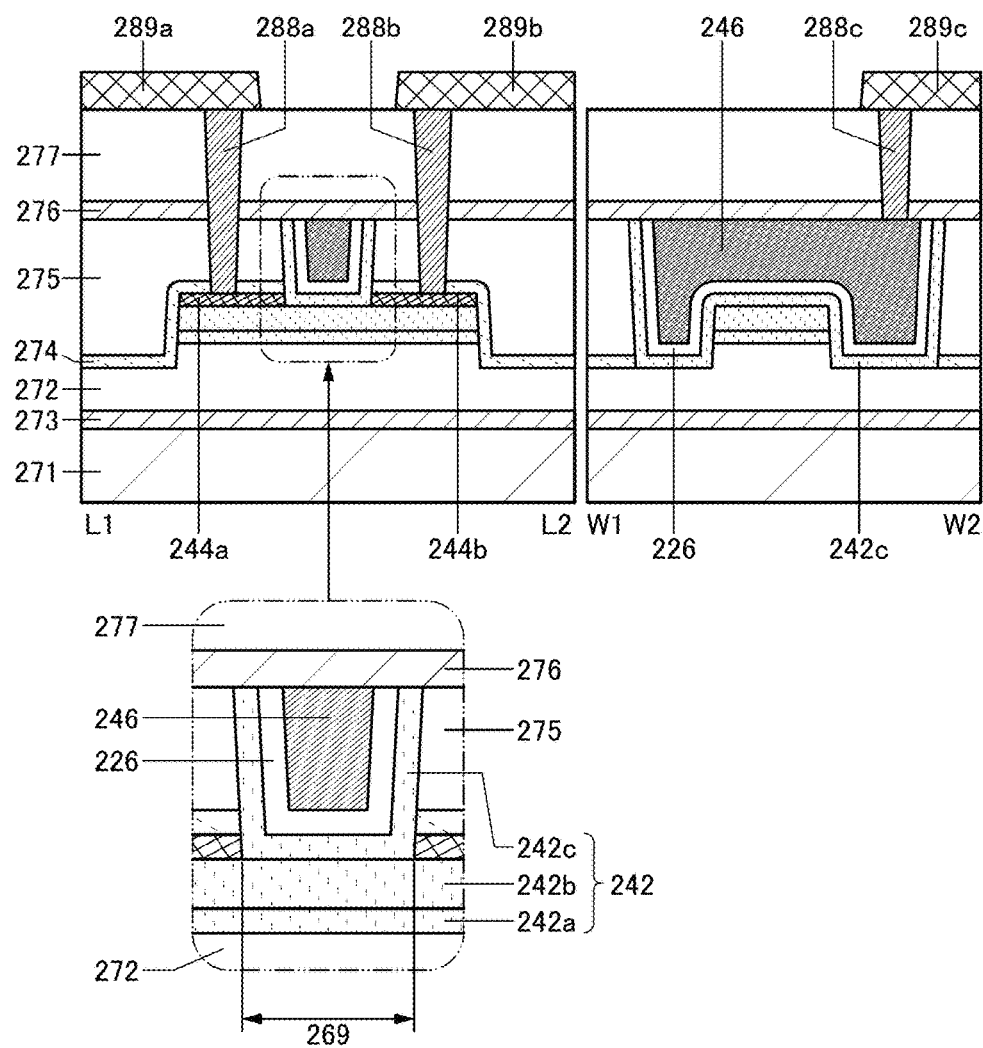

FIGS. 26A and 26B show another example of a transistor with an s-channel structure. FIG. 26A illustrates a plan view of the transistor 473. FIG. 26B illustrates a cross-sectional view taken along the dashed-dotted line L1-L2 and a cross-sectional view taken along the dashed-dotted line W1-W2 in FIG. 26A. In FIG. 26B, the cross-sectional view along L1-L2 is taken in the channel length direction of the transistor 473 and the cross-sectional view along W1-W2 is taken in the channel width direction of the transistor 473.

The transistor 473 includes the semiconductor layer 242, the insulating layer 226, the electrode 246, the electrode 244a, and the electrode 244b. The electrode 246 can function as a gate electrode. The insulating layer 226 can function as a gate insulating layer. The electrode 244a can function as one of a source electrode and a drain electrode. The electrode 244b can function as the other of the source electrode and the drain electrode. The transistor 473 is provided over the substrate 271 with an insulating layer 273 and the insulating layer 272 located therebetween.

In FIG. 26B, the insulating layer 273 is provided over the substrate 271, and the insulating layer 272 is provided over the insulating layer 273. The insulating layer 272 has a projection. Over the projection, the semiconductor layers 242a and the semiconductor layer 242b each having an island shape are provided. The electrode 244a and the electrode 244b are provided over the semiconductor layer 242b. A region of the semiconductor layer 242b which overlaps with the electrode 244a can function as one of a source and a drain of the transistor 473. A region of the semiconductor layer 242b which overlaps with the electrode 244b can function as the other of the source and the drain of the transistor 473. Thus, a region 269 of the semiconductor layer 242b which is located between the electrode 244a and the electrode 244b can function as a channel formation region.

An oxide semiconductor layer 274 is provided over the electrode 244a and the electrode 244b, and an insulating layer 275 is provided over the oxide semiconductor layer 274. An opening is provided in regions of the oxide semiconductor layer 274 and the insulating layer 275 which overlap with the region 269, and a semiconductor layer 242c is provided along the side and bottom surfaces of the opening. In the opening, the insulating layer 226 is provided along the side and bottom surfaces of the opening with the semiconductor layer 242c located therebetween. In the opening, the electrode 246 is also provided along the side and bottom surfaces of the opening with the semiconductor layer 242c and the insulating layer 226 located therebetween.

In the channel width direction, the opening is wider than the semiconductor layers 242a and 242b in the cross section. Accordingly, the side surfaces of the semiconductor layers 242a and 242b in the region 269 are covered with the semiconductor layer 242c. The side surfaces of the semiconductor layer 242a and the semiconductor layer 242b in a region other than the region 269 are covered with the oxide semiconductor layer 274.

An insulating layer 276 is provided over the insulating layer 275, and an insulating layer 277 is provided over the insulating layer 276. An electrode 289a, an electrode 289b, and an electrode 289c are provided over the insulating layer 277. The electrode 289a is electrically connected to the electrode 244a through a contact plug 288a in an opening formed by partly removing the insulating layer 277, the insulating layer 276, the insulating layer 275, and the oxide semiconductor layer 274. The electrode 289b is electrically connected to the electrode 244b through a contact plug 288b in an opening formed by partly removing the insulating layer 277, the insulating layer 276, the insulating layer 275, and the oxide semiconductor layer 274. The electrode 289c is electrically connected to the electrode 246 through a contact plug 288c in an opening formed by partly removing the insulating layer 277 and the insulating layer 276.

As illustrated in FIG. 26B, in the transistor 473 in the channel width direction, the electrode 246 covers the semiconductor layer 242b. By the existence of the projection of the insulating layer 272, the side surfaces of the semiconductor layer 242b can be covered with the electrode 246.

Figure 27A:
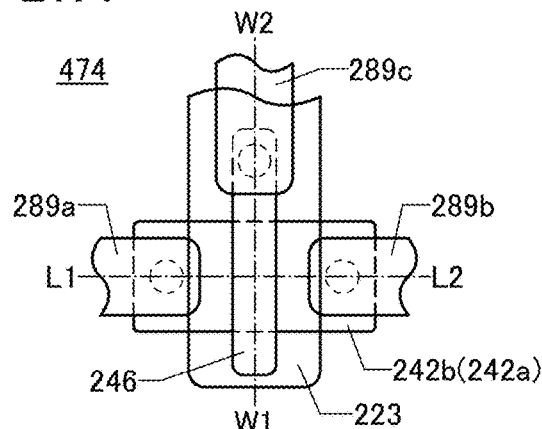
FIGS. 27A to 27C illustrate a semiconductor device.
Figure 27B:
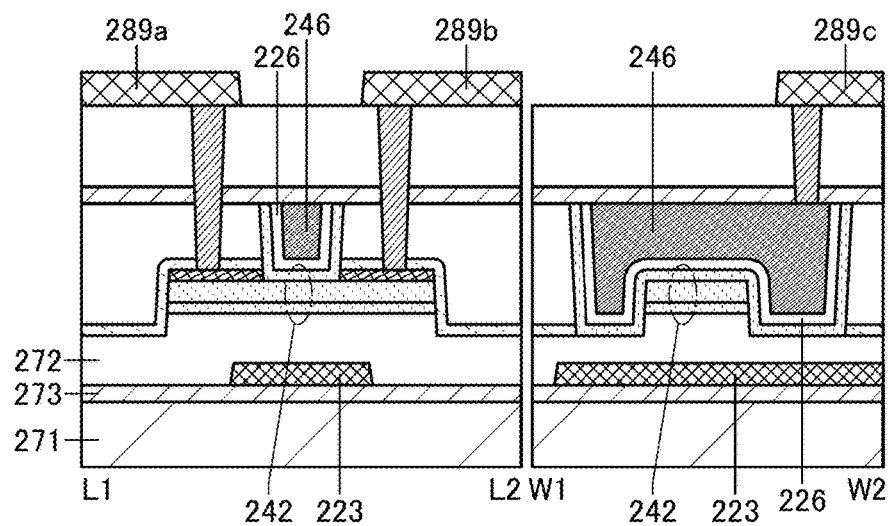

The transistor 474 illustrated in FIGS. 27A and 27B differs from the transistor 473 in that it includes the electrode 223 which functions as a back gate electrode between the insulating layers 273 and 272. FIG. 27A illustrates a plan view of the transistor 474. FIG. 27B illustrates a cross-sectional view taken along the dashed-dotted line L1-L2 and a cross-sectional view taken along the dashed-dotted line W1-W2 in FIG. 27A. Note that the electrode 223 may be provided between the substrate 271 and the insulating layer 273.

The electrode 246 and the electrode 223 can each function as a gate electrode. Thus, the insulating layer 272 and the insulating layer 226 can each function as a gate insulating layer.

By providing the electrode 246 and the electrode 223 so that the semiconductor layer 242 is located therebetween, and by setting the potentials of the electrode 246 and the electrode 223 to be the same, a region of the semiconductor layer 242 through which carriers flow is enlarged in the film thickness direction; thus, the number of transferred carriers is increased. As a result, the on-state current and field-effect mobility of the transistor 474 are increased.

Figure 27C:
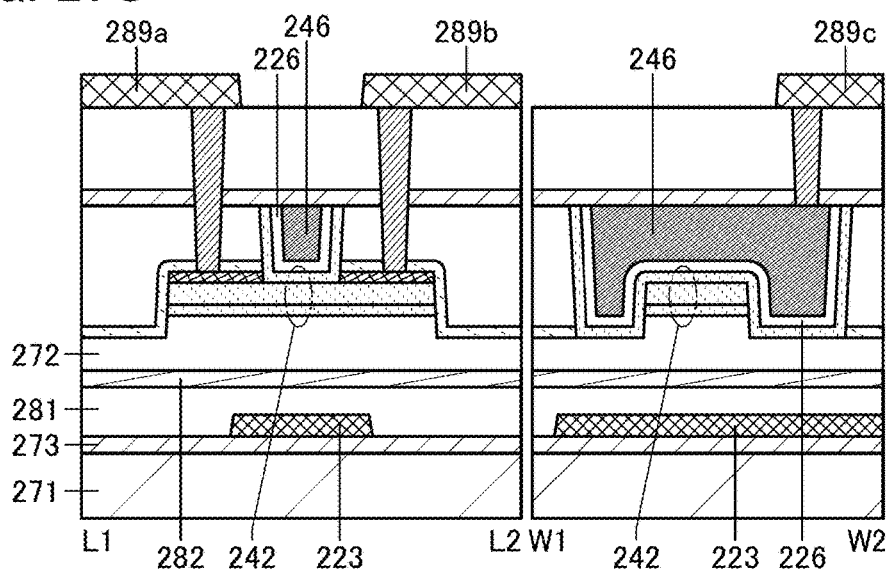

For example, as illustrated in FIG. 27C, an insulating layer 281 may be formed over the electrode 223; an insulating layer 282 may be formed over the insulating layer 281; and the insulating layer 272 may be formed over the insulating layer 282. The insulating layer 281 and the insulating layer 282 can be formed using a material and a method that are similar to those of the insulating layer 272.

Note that when the insulating layer 282 is formed using hafnium oxide, aluminum oxide, tantalum oxide, aluminum silicate, or the like, the insulating layer 282 can function as a charge trap layer. The threshold voltage of the transistor can be changed by injecting electrons into the insulating layer 282. For example, the injection of electrons into the insulating layer 282 can be performed with the use of the tunnel effect. By applying a positive voltage to the electrode 223, tunnel electrons can be injected into the insulating layer 282.

<Deposition Method>

The conductive layers of the electrodes and the like, the insulating layers, and the semiconductor layers described in this specification and the like can be formed by a CVD method, an evaporation method, a sputtering method, or the like. In general, the CVD method can be classified into a plasma enhanced CVD (PECVD) method using plasma, a thermal CVD (TCVD) method using heat, and the like. The CVD method can be further classified into a metal CVD (MCVD) method and a metal organic CVD (MOCVD) method according to a source gas to be used.

By using a PECVD method, a high-quality film can be formed at a relatively low temperature. By using a deposition method that does not use plasma for deposition, such as an MOCVD method or an evaporation method, a film with few defects can be formed because damage is not easily caused on a surface on which the film is deposited.

A sputtering method is generally classified into a DC sputtering method, a magnetron sputtering method, an RF sputtering method, an ion beam sputtering method, an electron cyclotron resonance (ECR) sputtering method, a facing-target sputtering method, and the like.

In a facing-target sputtering method, plasma is confined between targets; thus, plasma damage to a substrate can be reduced. Furthermore, step coverage can be improved because the incident angle of a sputtered particle to a substrate can be made smaller depending on the inclination of a target.

A transistor 411 illustrated in FIG. 17A2 is different from the transistor 410 in that an electrode 223 which can function as a back gate electrode is provided over the insulating layer 229. The electrode 223 can be formed using a material and a method that are similar to those of the electrode 246.

Unlike in a deposition method in which particles ejected from a target or the like are deposited, a film is formed by reaction at a surface of an object in a CVD method and an ALD method. Thus, a CVD method and an ALD method enable favorable step coverage almost regardless of the shape of an object. In particular, an ALD method enables excellent step coverage and excellent thickness uniformity and can be favorably used for covering a surface of an opening with a high aspect ratio, for example. In contrast, an ALD method has a relatively low deposition rate; thus, it is sometimes preferable to combine an ALD method with another deposition method with a high deposition rate, such as a CVD method.

When a CVD method or an ALD method is used, the composition of a film to be formed can be controlled with the flow rate ratio of a source gas. For example, by adjusting the flow rate ratio of a source gas in a CVD method or an ALD method, a film with a certain composition can be formed. Moreover, by changing the flow rate ratio of a source gas during deposition by a CVD method or an ALD method, a film whose composition is continuously changed can be formed. In the case where a film is deposited while the flow rate ratio of a source gas is changed, the time for deposition can be shorter than in the case where a film is deposited using a plurality of deposition chambers because time for transfer and pressure adjustment can be saved. Thus, transistors and semiconductor devices can be manufactured with improved productivity in some cases.

<Substrate>

There is no particular limitation on a material used as the substrate 271. The material is determined according to the purpose in consideration of whether it has a light-transmitting property, heat resistance high enough to withstand heat treatment, or the like. For example, a glass substrate of barium borosilicate glass, aluminoborosilicate glass, or the like, a ceramic substrate, a quartz substrate, or a sapphire substrate can be used. Alternatively, a semiconductor substrate, a flexible substrate, an attachment film, a base film, or the like may be used as the substrate 271.

As the semiconductor substrate, a single material semiconductor substrate of silicon, germanium, or the like or a compound semiconductor substrate of silicon carbide, silicon germanium, gallium arsenide, indium phosphide, zinc oxide, or gallium oxide, or the like is used, for example. As the semiconductor substrate, a single-crystal semiconductor or a polycrystalline semiconductor may be used.

As materials of the flexible substrate, the attachment film, and the base material film, the following materials can be used, for example: polyethylene terephthalate (PET), polyethylene naphthalate (PEN), polyether sulfone (PES), polytetrafluoroethylene (PTFE), polypropylene, polyester, polyvinyl fluoride, polyvinyl chloride, polyolefin, polyamide (e.g., nylon or aramid), polyimide, polycarbonate, aramid, an epoxy resin, an acrylic resin, and the like.

The flexible substrate used as the substrate 271 preferably has a lower coefficient of linear expansion because a lower coefficient of linear expansion suppresses deformation due to an environment. The flexible substrate used as the substrate 271 is formed using, for example, a material whose coefficient of linear expansion is lower than or equal to $1 \times 10^{-3}$/K, lower than or equal to $5 \times 10^{-5}$/K, or lower than or equal to $1 \times 10^{-5}$/K. In particular, aramid is preferably used for the flexible substrate because of its low coefficient of linear expansion.

<Insulating Layers>

The insulating layers 272, 273, 276, 277, 226, 225, 228, and 229 are formed with a single layer or a stack of layers of one or more materials selected from aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, and aluminum silicate. Alternatively, a material in which two or more materials selected from an oxide material, a nitride material, an oxynitride material, and a nitride oxide material are mixed may be used.

Note that in this specification, a nitride oxide refers to a compound that includes more nitrogen than oxygen. An oxynitride refers to a compound that includes more oxygen than nitrogen. The content of each element can be measured by Rutherford backscattering spectrometry (RBS), for example.

It is particularly preferable that the insulating layers 272 and 229 be formed using an insulating material that is relatively impermeable to impurities. The insulating layers 272 and 229 may each be formed to have, for example, a single-layer structure or a stacked-layer structure including an insulating material containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Examples of such an insulating material that is relatively impermeable to impurities include aluminum oxide, aluminum nitride, aluminum oxynitride, aluminum nitride oxide, gallium oxide, germanium oxide, yttrium oxide, zirconium oxide, lanthanum oxide, neodymium oxide, hafnium oxide, tantalum oxide, and silicon nitride. The insulating layer 272 or 229 may be formed using indium tin zinc oxide (In—Sn—Zn oxide) having an excellent insulating property or the like.

When the insulating material that is relatively impermeable to impurities is used for the insulating layer 272, impurity diffusion from the substrate 271 side can be suppressed, and the reliability of the transistor can be improved. When the insulating material that is relatively impermeable to impurities is used for the insulating layer 229, impurity diffusion from the insulating layer 229 side can be suppressed, and the reliability of the transistor can be improved.

Note that a plurality of stacked insulating layers formed with these materials may be used as each of the insulating layers 272, 226, 225, 228, and 229. There is no particular limitation on a formation method of the insulating layers 272, 226, 225, 228, and 229, and a variety of formation methods such as a sputtering method, a CVD method, an MBE method, a PLD method, an ALD method, and a spin coating method can be employed.

For example, when an aluminum oxide film is formed by a thermal CVD method, two kinds of gases, e.g., $H_2O$ as an oxidizer and a source material gas which is obtained by vaporizing a solvent and liquid containing an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

When an oxide semiconductor is used for the semiconductor layer 242, the hydrogen concentration in the insulating layers is preferably lowered in order to prevent an increase in the hydrogen concentration in the semiconductor layer 242. It is particularly preferable to lower the hydrogen concentration in the insulating layer in contact with the semiconductor layer 242. Specifically, the hydrogen concentration in the insulating layers, which is measured by SIMS, is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. Furthermore, the nitrogen concentration in the insulating layers is preferably low in order to prevent an increase in the nitrogen concentration in the semiconductor layer 242. It is particularly preferable to lower the nitrogen concentration in the insulating layers in contact with the semiconductor layer 242. Specifically, the nitrogen concentration in the insulating layers, which is measured by SIMS, is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

The concentration measured by SIMS analysis may include a variation within a range of ±40%.

When an oxide semiconductor is used for the semiconductor layer 242, the insulating layers are preferably formed with insulating layers from which oxygen is released by heating. In this specification and the like, oxygen released by heating is also referred to as "excess oxygen". It is particularly preferable that the insulating layer in contact with the semiconductor layer 242 include excess oxygen. For example, the insulating layer is preferably an insulating layer of which the amount of released oxygen converted into oxygen atoms is greater than or equal to $1.0\times10^{18}$ atoms/cm$^3$, preferably greater than or equal to $1.0\times10^{19}$ atoms/cm$^3$, further preferably greater than or equal to $1.0\times10^{20}$ atoms/cm$^3$ in TDS analysis in which heat treatment is performed so that the surface temperature of the insulating layer is higher than or equal to 100° C. and lower than or equal to 700° C., preferably higher than or equal to 100° C. and lower than or equal to 500° C.

The insulating layer containing excess oxygen can be formed by performing treatment for adding oxygen to an insulating layer. The treatment for adding oxygen can be performed by heat treatment under an oxygen atmosphere or performed with an ion implantation apparatus, an ion doping apparatus, or a plasma treatment apparatus. As a gas for adding oxygen, an oxygen gas of $^{16}O_2$, $^{18}O_2$, or the like, a nitrous oxide gas, an ozone gas, or the like can be used. In this specification, the treatment for adding oxygen is also referred to as "oxygen doping treatment".

The formation of an insulating layer by sputtering in an atmosphere including oxygen allows introduction of oxygen into the insulating layer.

In general, a capacitor has such a structure that a dielectric is sandwiched between two electrodes that face to each other; as the thickness of the dielectric is smaller (as the distance between the two facing electrodes is shorter) or as the dielectric constant of the dielectric is higher, the capacitance value becomes larger. However, if the thickness of the dielectric is reduced in order to increase the capacitance value of the capacitor, because of a tunnel effect or the like, current unintentionally flowing between the two electrodes (hereinafter also referred to as "leakage current") tends to increase and the withstand voltage of the capacitor tends to be lower.

A portion where a gate electrode, a gate insulating layer, and a semiconductor layer of a transistor overlap with each other functions as a capacitor (hereinafter also referred to as a "gate capacitor"). A channel is formed in a region of the semiconductor layer which overlaps with the gate electrode with the gate insulating layer provided therebetween. That is, the gate electrode and the channel formation region function as two electrodes of the capacitor. Furthermore, the gate insulating layer functions as a dielectric of the capacitor. Although it is preferable that the capacitance value of the gate capacitor be as large as possible, a reduction in the thickness of the gate insulating layer for the purpose of increasing the capacitance value increases the probability of occurrence of an increase in leakage current or a reduction in withstand voltage.

When a high-k material such as hafnium silicate ($HfSi_xO_y$ (x>0, y>0)), hafnium silicate to which nitrogen is added ($HfSi_xO_yN_z$ (x>0, y>0, z>0)), hafnium aluminate to which nitrogen is added ($HfAl_xO_yN_z$ (x>0, y>0, z>0)), hafnium oxide, or yttrium oxide is used as the dielectric, even if the thickness of the dielectric is made thick, a sufficient capacitance value of the capacitor can be ensured.

Even if the thickness of the dielectric is made thick, the use of a high-k material having a high dielectric constant as the dielectric enables, for example, the same capacitance value as the use of silicon oxide as the dielectric; accordingly, leakage current between the two electrodes of the capacitor can be reduced. Note that the dielectric may have a stacked-layer structure of the high-k material and another insulating material.

The insulating layer 275 has a flat surface. As the insulating layer 275, an organic material having heat resistance, such as polyimide, an acrylic-based resin, a benzocyclobutene-based resin, polyamide, or an epoxy-based resin, can be used as well as the above-mentioned insulating materials. Other than such organic materials, it is possible to use a low-dielectric constant material (a low-k material), a siloxane-based resin, PSG (phosphosilicate glass), BPSG (borophosphosilicate glass), or the like. Note that a plurality of insulating layers formed of these materials may be stacked.

Note that the siloxane-based resin corresponds to a resin including an Si—O—Si bond formed using a siloxane-based material as a starting material. The siloxane-based resin may include an organic group (e.g., an alkyl group or an aryl group) or a fluoro group as a substituent. The organic group may include a fluoro group.

There is no particular limitation on the method of forming the insulating layer 275; depending on a material thereof, any of the following methods is used: a sputtering method, an SOG method, spin coating, dipping, spray coating, a droplet discharging method (e.g., an inkjet method), a printing method (e.g., screen printing or offset printing), or the like.

The sample surface may be subjected to CMP treatment. The CMP treatment can reduce unevenness of the surface, whereby coverage with an insulating layer or a conductive layer to be formed later can be increased.

<Semiconductor Layer>

A single-crystal semiconductor, a poly crystalline semiconductor, a microcrystalline semiconductor, an amorphous semiconductor, or the like can be used for the semiconductor layer 242. As a semiconductor material, silicon, germanium, or the like can be used. Alternatively, a compound semiconductor of silicon germanium, silicon carbide, gallium arsenide, oxide semiconductor, nitride semiconductor, or the like, an organic semiconductor, or the like can be used.

When an organic semiconductor is used for the semiconductor layer 242, a low molecular organic material having an aromatic ring, a π-electron conjugated conductive polymer, or the like can be used. For example, rubrene, tetracene, pentacene, perylenediimide, tetracyanoquinodimethane, polythiophene, polyacetylene, or polyparaphenylene vinylene can be used.

As described above, the band gap of an oxide semiconductor is 2 eV or more; thus, when the oxide semiconductor is used for the semiconductor layer 242, a transistor with an extremely low off-state current can be provided. A transistor using an oxide semiconductor in the semiconductor layer where the channel is formed (also referred to as an "OS transistor") has high withstand voltage between its source and drain. Thus, a transistor with high reliability can be provided. Furthermore, a display device, a semiconductor device, or the like with high reliability can be provided.

In this embodiment, the case where an oxide semiconductor is used for the semiconductor layer 242 is described. For the oxide semiconductor used for the semiconductor layer 242, an oxide semiconductor containing, for example, indium (In) is preferably used. An oxide semiconductor can have high carrier mobility (electron mobility) by containing indium, for example. An oxide semiconductor preferably contains an element M.

The element M is preferably aluminum, gallium, yttrium, tin, or the like. Other elements which can be used as the element M are boron, silicon, titanium, iron, nickel, germanium, zirconium, molybdenum, lanthanum, cerium, neodymium, hafnium, tantalum, tungsten, magnesium, and the like. Note that two or more of the above elements may be used in combination as the element M in some cases. The element M is an element having high bonding energy with oxygen, for example. The element M is an element that increases the energy gap of the oxide semiconductor, for example. In addition, the oxide semiconductor preferably contains zinc. When the oxide semiconductor contains zinc, the oxide semiconductor is easily crystallized in some cases.

Note that the oxide semiconductor used for the semiconductor layer 242 is not limited to the oxide containing indium. The oxide semiconductor may be, for example, an oxide that does not contain indium and contains zinc, an oxide that does not contain indium and contains gallium, or an oxide that does not contain indium and contains tin, e.g., a zinc tin oxide, a gallium tin oxide, or gallium oxide.

For example, when an InGaZnO$_X$ (X>0) film is formed as the semiconductor layer 242 by a thermal CVD method, trimethylindium (In(CH$_3$)$_3$), trimethylgallium (Ga(CH$_3$)$_3$), and dimethylzinc (Zn(CH$_3$)$_2$) are used. Without limitation to the above combination, triethylgallium (Ga(C$_2$H$_5$)$_3$) can be used instead of trimethylgallium, and diethylzinc (Zn(C$_2$H$_5$)$_2$) can be used instead of dimethylzinc.

For example, when an InGaZnO$_X$ film (X>0) is formed as the semiconductor layer 242 by an ALD method, an In(CH$_3$)$_3$ gas and an O$_3$ gas are sequentially introduced more than once to form an InO$_2$ layer, subsequently a Ga(CH$_3$)$_3$ gas and an O$_3$ gas are sequentially introduced more than once to form a GaO layer, and then a Zn(CH$_3$)$_2$ gas and an O$_3$ gas are sequentially introduced more than once to form a ZnO layer. Note that the order of these layers is not limited to this example. A mixed compound layer such as an InGaO$_2$ layer, an InZnO$_2$ layer, a GaInO layer, a ZnInO layer, or a GaZnO layer may be formed by using these gases. Note that although an H$_2$O gas which is obtained by bubbling water with an inert gas such as Ar may be used instead of an O$_3$ gas, it is preferable to use an O$_3$ gas, which does not contain H. Instead of an In(CH$_3$)$_3$ gas, an In(C$_2$H$_5$)$_3$ gas or tris(acetylacetonato)indium may be used. Note that tris(acetylacetonato)indium is also referred to as In(acac)$_3$. In addition, instead of a Ga(CH$_3$)$_3$ gas, a Ga(C$_2$H$_5$)$_3$ gas or tris(acetylacetonato)gallium may be used. Note that tris(acetylacetonato)gallium is also referred to as Ga(acac)$_3$. Furthermore, a Zn(CH$_3$)$_2$ gas or zinc acetate may be used. However, the deposition gas is not limited to these.

When the oxide semiconductor layer is formed by a sputtering method, a target containing indium is preferably used in order to reduce the number of particles. In addition, if an oxide target having a high atomic ratio of the element M is used, the conductivity of the target may be decreased. When a target containing indium is used, the conductivity of the target can be increased and DC discharge or AC discharge is facilitated; thus, deposition over a large substrate can be easily performed. Thus, semiconductor devices can be manufactured with improved productivity.

As described above, when the oxide semiconductor is formed by a sputtering method, the atomic ratio of In to M and Zn contained in the target may be 3:1:1, 3:1:2, 3:1:4, 1:1:0.5, 1:1:1, 1:1:2, 1:4:4, 5:1:7, or 4:2:4.1, for example.

When an oxide semiconductor is deposited by a sputtering method, an oxide semiconductor having an atomic ratio different from that of a target used may be deposited. In particular, the proportion of zinc atoms in the deposited oxide semiconductor may be lower than that in the target. Specifically, the proportion of zinc is approximately 40 atomic % to 90 atomic % of that in the target in some cases.

To obtain stable electrical characteristics of an OS transistor, the semiconductor layer 242 is preferably highly purified by reducing impurities and oxygen vacancies in the oxide semiconductor layer so as to be regarded as an intrinsic or substantially intrinsic oxide semiconductor layer. Furthermore, it is preferable that at least the channel formation region in the semiconductor layer 242 be regarded as an intrinsic or substantially intrinsic oxide semiconductor layer.

When an oxide semiconductor is used for the semiconductor layer 242, the layer preferably includes c-axis aligned crystalline oxide semiconductor (CAAC-OS). A CAAC-OS is an oxide semiconductor having a plurality of c-axis aligned crystal parts.

In the oxide semiconductor layer used as the semiconductor layer 242, a region which is not a CAAC preferably accounts for less than 20% of the entire oxide semiconductor layer.

A CAAC-OS has dielectric constant anisotropy. Specifically, the dielectric constant of a CAAC-OS is higher in the c-axis direction than in the a-axis direction and the b-axis direction. A transistor in which a channel is formed in a semiconductor layer including a CAAC-OS and a gate electrode is located in the c-axis direction has a high dielectric constant in the c-axis direction; accordingly, an electric field generated by the gate electrode easily reaches the entire CAAC-OS. Thus, the subthreshold swing (S value) can be reduced. In the transistor including a CAAC-OS in the semiconductor layer, the S value is not easily increased by miniaturization.

Moreover, since the dielectric constant in the a-axis direction and the b-axis direction of a CAAC-OS is small, an influence of the electric field generated between a source and a drain is reduced. Thus, a channel length modulation effect, a short-channel effect, or the like is less likely to occur, whereby the reliability of the transistor can be increased.

Here, the channel length modulation effect is a phenomenon in which, when the drain voltage is higher than the threshold voltage, a depletion layer expands from the drain side, so that the effective channel length is decreased. The short-channel effect is a phenomenon in which a channel length is reduced, so that a deterioration in electrical characteristics, such as a decrease in threshold voltage, is caused. The more a transistor is miniaturized, the more likely deterioration in electrical characteristics caused by these phenomena is to occur.

After the oxide semiconductor layer is formed, oxygen doping treatment may be performed. In addition, heat treatment is preferably performed to reduce impurities such as moisture and hydrogen contained in the oxide semiconductor layer and to purify the oxide semiconductor layer.

For example, the oxide semiconductor layer is subjected to heat treatment in a reduced-pressure atmosphere, an inert atmosphere of nitrogen, a rare gas, or the like, an oxidizing atmosphere, or an ultra-dry air atmosphere (the moisture amount is 20 ppm (−55° C. by conversion into a dew point) or less, preferably 1 ppm or less, further preferably 10 ppb or less, in the case where the measurement is performed by a dew point meter in a cavity ring down laser spectroscopy (CRDS) system). Note that the oxidizing atmosphere refers to an atmosphere containing an oxidizing gas such as oxygen, ozone, or nitrogen oxide at 10 ppm or higher. The inert atmosphere refers to an atmosphere which contains the oxidizing gas at lower than 10 ppm and is filled with nitrogen or a rare gas.

By the heat treatment, at the same time as the release of the impurities, oxygen contained in the insulating layer 226 is diffused to the oxide semiconductor layer and oxygen vacancies in the oxide semiconductor layer can be reduced. Note that the heat treatment may be performed in such a manner that heat treatment is performed in an inert atmosphere, and then another heat treatment is performed in an atmosphere containing an oxidizing gas at 10 ppm or more, 1% or more, or 10% or more in order to compensate for desorbed oxygen. The heat treatment may be performed at any time after the oxide semiconductor layer is formed.

There is no particular limitation on a heat treatment apparatus used for the heat treatment, and the apparatus may be provided with a device for heating an object to be processed by heat conduction or heat radiation from a heating element such as a resistance heating element. For example, an electric furnace, or a rapid thermal annealing (RTA) apparatus such as a lamp rapid thermal annealing (LRTA) apparatus or a gas rapid thermal annealing (GRTA) apparatus can be used. The LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. The GRTA apparatus is an apparatus for heat treatment using a high-temperature gas.

The heat treatment may be performed at a temperature higher than or equal to 250° C. and lower than or equal to 650° C., preferably higher than or equal to 300° C. and lower than or equal to 500° C. The treatment time is shorter than or equal to 24 hours. Heat treatment for over 24 hours is not preferable because the productivity is reduced.

<Electrodes>

As a conductive material for forming the electrodes 246, 223, 244*a*, 244*b*, 287, 297, 289*a*, 289*b*, 292*a*, and 292*b*, a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, and the like can be used. Alternatively, a semiconductor having a high electric conductivity typified by polycrystalline silicon including an impurity element such as phosphorus may be used. Alternatively, an oxide semiconductor with high electrical conductivity or a nitride semiconductor with high electrical conductivity may be used. Alternatively, silicide such as nickel silicide may be used. A plurality of stacked conductive layers formed with these materials may be used.

The conductive material for forming the electrodes 246, 223, 244*a*, 244*b*, 287, 297, 289*a*, 289*b*, 292*a*, and 292*b* can also be formed using a conductive material containing oxygen, such as indium tin oxide (ITO), indium oxide containing tungsten oxide, indium zinc oxide containing tungsten oxide, indium oxide containing titanium oxide, indium tin oxide containing titanium oxide, indium zinc oxide, or indium tin oxide to which silicon is added, or a conductive material containing nitrogen, such as titanium nitride or tantalum nitride. It is also possible to use a stacked-layer structure formed using a material containing the above metal element and the above conductive material containing oxygen. It is also possible to use a stacked-layer structure formed using a material containing the above metal element and the above conductive material containing nitrogen. It is also possible to use a stacked-layer structure formed using a material containing the above metal element, the above conductive material containing oxygen, and the above conductive material containing nitrogen. There is no particular limitation on a formation method of the conductive material, and a variety of formation methods such as an evaporation method, a CVD method, and a sputtering method can be employed.

<Contact Plugs>

For the contact plugs 288*a*, 288*b*, 288*c*, 298*a*, and 298*b*, a conductive material with high embeddability such as tungsten or polysilicon can be used. A side surface and a bottom surface of the material may be covered with a barrier layer (a diffusion prevention layer) of a titanium layer, a titanium nitride layer, a stacked layer of these layers, or the like. In this case, the barrier layer may be regarded as part of the contact plug.

With one embodiment of the present invention, a transistor with favorable electrical characteristics can be provided. With one embodiment of the present invention, a semiconductor device having a high degree of integration can be provided.

This embodiment can be implemented in an appropriate combination with any of the structures described in the other embodiments.

Embodiment 5

Some or all of driver circuits which include the transistors described in the above embodiments can be formed over a substrate where a pixel portion is formed, whereby a system-on-panel can be obtained. Structure examples of a display device in which the transistors described in the above embodiments can be used are described with reference to FIGS. 29A to 29C, FIG. 30, and FIG. 31.

Figure 29A:
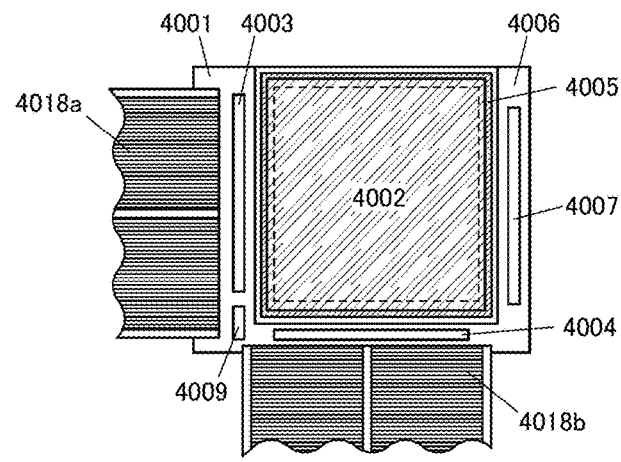
FIGS. 29A to 29C each illustrate an example of a display device.

As an example of the display device, a display device including an EL element is described. In FIG. 29A, a sealant 4005 is provided so as to surround a pixel portion 4002 provided over a substrate 4001, and sealing is performed with a substrate 4006. In FIG. 29A, a signal line driver circuit 4003, a scan line driver circuit 4004, a sensor circuit 4007, and a control circuit 4009 are each formed using a single-crystal semiconductor or a polycrystalline semiconductor over another substrate, and mounted in a region different from the region surrounded by the sealant 4005 over the substrate 4001. Various signals and potentials are supplied to the signal line driver circuit 4003, and the scan line driver circuit 4004, the sensor circuit 4007, the control circuit 4009, and the pixel portion 4002 from flexible printed circuits (FPCs) 4018*a* and 4018*b*. Some driving signals used in the peripheral driver circuit are supplied also from the control circuit 4009.

Figure 29B:
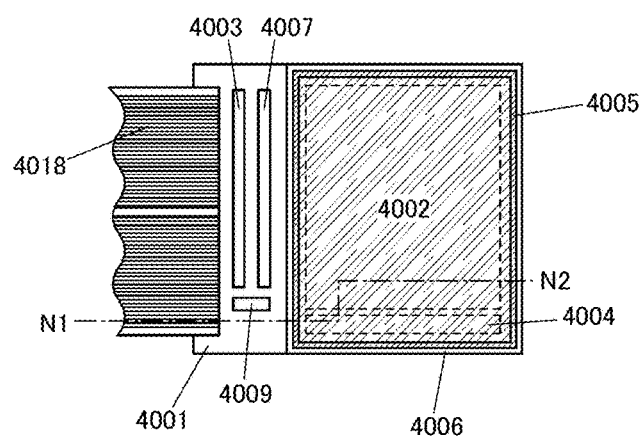
Figure 29C:
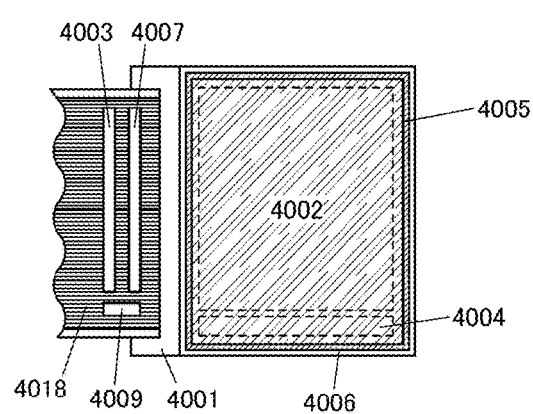

In FIGS. 29B and 29C, the sealant 4005 is provided so as to surround the pixel portion 4002 and the scan line driver circuit 4004 which are provided over the substrate 4001. The substrate 4006 is provided over the pixel portion 4002 and the scan line driver circuit 4004. Thus, the pixel portion 4002 and the scan line driver circuit 4004 are sealed together with the display element, by the substrate 4001, the sealant 4005, and the substrate 4006. In FIGS. 29B and 29C, the signal line driver circuit 4003, the sensor circuit 4007, and the control circuit 4009 which are formed using a single-crystal semiconductor or a polycrystalline semiconductor over another substrate are mounted in a region that is different from the region surrounded by the sealant 4005 over the substrate 4001.

In FIG. 29B, the signal line driver circuit 4003, the sensor circuit 4007, and the control circuit 4009 are mounted on the substrate 4001 between the pixel portion 4002 and the FPC 4018. In FIG. 29C, the signal line driver circuit 4003, the sensor circuit 4007, and the control circuit 4009 are mounted on the FPC 4018.

Although FIGS. 29B and 29C each illustrate an example in which the signal line driver circuit 4003, the sensor circuit 4007, and the control circuit 4009, which are formed over another substrate, are mounted on the substrate 4001 and the FPC 4018, one embodiment of the present invention is not limited to this structure. For example, some circuits included in each of the signal line driver circuit 4003, the sensor circuit 4007, and the control circuit 4009 may be provided in the region surrounded by the sealant 4005 over the substrate 4001. Alternatively, for example, some circuits included in each of the signal line driver circuit 4003, the sensor circuit 4007, and the control circuit 4009 may be provided in contact with the FPC 4018.

The connection method of the driver circuit formed over another substrate is not particularly limited; wire bonding, a chip on glass (COG), a tape carrier package (TCP), a chip on film (COF), or the like can be used. FIG. 29A illustrates an example in which the signal line driver circuit 4003 and the scan line driver circuit 4004 are mounted by a COG. FIG. 29B illustrates an example in which the signal line driver circuit 4003 is mounted by a COG. FIG. 29C illustrates an example in which the signal line driver circuit 4003 is mounted by a TCP.

In some cases, the display device encompasses a panel in which a display element is sealed, and a module in which an IC or the like including a controller is mounted on the panel.

The pixel portion and the scan line driver circuit provided over the first substrate include a plurality of transistors and any of the transistors described in the above embodiments can be used.

Figure 30:
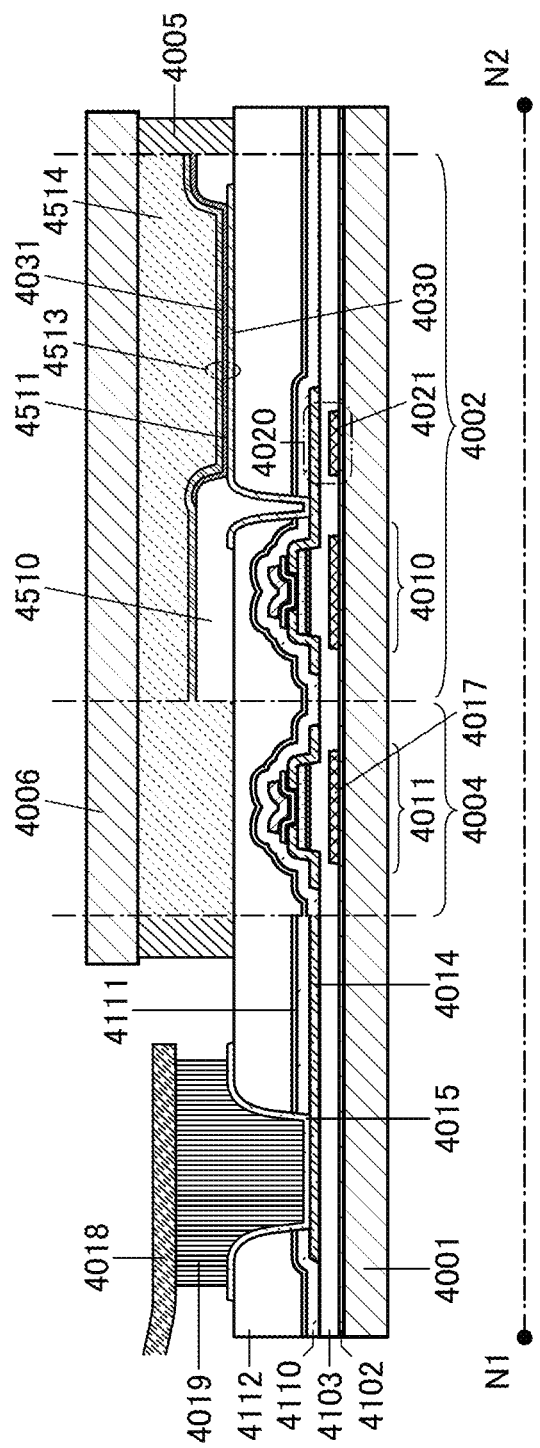
FIG. 30 illustrates an example of the display device.

FIG. 30 corresponds to a cross-sectional view taken along the chain line N1-N2 in FIG. 29B. As illustrated in FIG. 30, the display device includes an electrode 4015, and the electrode 4015 is electrically connected to a terminal included in the FPC 4018 through an anisotropic conductive layer 4019. In addition, the electrode 4015 is electrically connected to a wiring 4014 in an opening formed in an insulating layer 4112, an insulating layer 4111, and an insulating layer 4110. FIG. 30 illustrates an example of a light-emitting display device (also referred to as an "EL display device") using a light-emitting element as a display element.

The electrode 4015 is formed using the same conductive layer as an electrode 4030, and the wiring 4014 is formed using the same conductive layer as source and drain electrodes of transistors 4010 and 4011.

The pixel portion 4002 and the scan line driver circuit 4004 provided over the substrate 4001 include a plurality of transistors. In FIG. 30, the transistor 4010 included in the pixel portion 4002 and the transistor 4011 included in the scan line driver circuit 4004 are illustrated as examples. The insulating layers 4112, 4111, and 4110 are provided over the transistors 4010 and 4011 in FIG. 30. A bank 4510 is provided over the insulating layer 4112.

The transistors 4010 and 4011 are provided over an insulating layer 4102. The transistors 4010 and 4011 each include an electrode 4017 over the insulating layer 4102. An insulating layer 4103 is formed over the electrode 4017. The electrode 4017 can serve as a back gate electrode.

Any of the transistors described in the above embodiments can be used as the transistors 4010 and 4011. A change in the electric characteristics of the transistors described in the above embodiments is suppressed and the transistors are electrically stable. Accordingly, the display device of one embodiment of the present invention can be a highly reliable display device.

FIG. 30 illustrates an example in which a transistor having a structure similar to that of the transistor 451 described in the above embodiment is used as each of the transistors 4010 and 4011.

The display device illustrated in FIG. 30 includes a capacitor 4020. The capacitor 4020 includes a region where part of one of the source electrode or the drain electrode of the transistor 4010 overlaps with an electrode 4021 with the insulating layer 4103 positioned therebetween. The electrode 4021 is formed using the same conductive layer as the electrode 4017.

As the transistors 4010 and 4011, OS transistors are preferably used. The current in an off state (off-state current) of the OS transistors can be made low. Accordingly, an electrical signal such as an image signal can be held for a longer period, and a writing interval can be set longer in an on state. Accordingly, the frequency of refresh operations can be reduced, which leads to an effect of suppressing power consumption.

Furthermore, the OS transistors can have relatively high field-effect mobility, whereby high-speed operation is possible. Accordingly, the use of the above transistor in a pixel portion of a display device enables high-quality images to be obtained, and also enables a driver circuit portion and the pixel portion to be formed over one substrate, thereby reducing the number of components of the display device.

In general, the capacitance of a capacitor provided in a display device is set in consideration of leakage current or the like of transistors provided in a pixel portion so that charge can be held for a predetermined period. The capacitance of the capacitor can be set in consideration of the off-state current of the transistor or the like.

For example, the use of an OS transistor in the pixel portion of a display device can reduce the capacitance of the capacitor and eliminate the formation of the capacitor.

The transistor 4010 included in the pixel portion 4002 is electrically connected to the display element.

In the display device, a black matrix (a light-blocking layer), an optical member (an optical substrate) such as a polarizing member, a retardation member, or an anti-reflection member, or the like may be provided as appropriate. For example, circular polarization may be employed by using a polarizing substrate and a retardation substrate.

An EL element includes a layer containing a light-emitting compound (also referred to as an "EL layer") between a pair of electrodes. By generating a potential difference between the pair of electrodes which is greater than the threshold voltage of the EL element, holes are injected to the EL layer from the anode side and electrons are injected to the EL layer from the cathode side. The injected electrons and holes are recombined in the EL layer, so that a light-emitting substance contained in the EL layer emits light.

EL elements are classified according to whether a light-emitting material is an organic compound or an inorganic compound. In general, the former is referred to as an organic EL element, and the latter is referred to as an inorganic EL element.

In an organic EL element, by voltage application, electrons are injected from one electrode to the EL layer and holes are injected from the other electrode to the EL layer. The carriers (electrons and holes) are recombined; thus, a light-emitting organic compound is brought into an excited state. The light-emitting organic compound returns to a ground state from the excited state, thereby emitting light. Because of such a mechanism, such a light-emitting element is referred to as a current-excitation type light-emitting element.

In addition to the light-emitting compound, the EL layer may further include any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

The EL layer can be formed by an evaporation method (including a vacuum evaporation method), a transfer method, a printing method, an inkjet method, a coating method, or the like.

Inorganic EL elements are classified into dispersed inorganic EL elements and thin-film inorganic EL elements, on the basis of their element structures. A dispersion-type inorganic EL element has a light-emitting layer where particles of a light-emitting material are dispersed in a binder, and its light emission mechanism is donor-acceptor recombination type light emission, which utilizes a donor level and an acceptor level. A thin-film inorganic EL element has a structure where a light-emitting layer is sandwiched between dielectric layers that are further sandwiched between electrodes, and its light emission mechanism is localized type light emission, which utilizes inner-shell electron transition of metal ions. Note that description is given here using an organic EL element as a light-emitting element.

In order to extract light emitted from the light-emitting element, at least one of a pair of electrodes is transparent. The light-emitting element and a transistor are formed over a substrate, and the light-emitting element can have any of the following emission structures: a top emission structure in which light emission is extracted from the side opposite to the substrate; a bottom emission structure in which light emission is extracted from the substrate side; and a dual emission structure in which light emission is extracted from both the side opposite to the substrate and the substrate side.

A light-emitting element 4513 which is the display element is electrically connected to the transistor 4010 provided in the pixel portion 4002. The structure of the light-emitting element 4513 is a stacked-layer structure including the electrode 4030, a light-emitting layer 4511, and an electrode 4031; however, this embodiment is not limited to this structure. The structure of the light-emitting element 4513 can be changed as appropriate in accordance with the direction in which light is extracted from the light-emitting element 4513, or the like.

The bank 4510 is formed using an organic insulating material or an inorganic insulating material. It is particularly preferable that the bank 4510 be formed using a photosensitive resin material to have an opening over the electrode 4030 so that a side surface of the opening slopes with continuous curvature.

The light-emitting layer 4511 may be formed using a single layer or a plurality of layers stacked.

A protective layer may be formed over the electrode 4031 and the bank 4510 in order to prevent entry of oxygen, hydrogen, moisture, carbon dioxide, or the like into the light-emitting element 4513. For the protective layer, silicon nitride, silicon nitride oxide, aluminum oxide, aluminum nitride, aluminum oxynitride, aluminum nitride oxide, diamond like carbon (DLC), or the like can be used. In addition, a filler 4514 is provided for sealing in a space sealed by the substrate 4001, the substrate 4006, and the sealant 4005. It is preferable to perform such packaging (sealing) with a protective film (such as a laminate film or an ultraviolet curable resin film) or a cover member with high air-tightness and little degasification so that exposure to the outside air is prevented.

As the filler 4514, an ultraviolet curable resin or a thermosetting resin can be used as well as an inert gas such as nitrogen or argon; for example, polyvinyl chloride (PVC), an acrylic resin, polyimide, an epoxy resin, a silicone resin, polyvinyl butyral (PVB), ethylene vinyl acetate (EVA), or the like can be used. A drying agent may be contained in the filler 4514.

A glass material such as a glass frit, or a resin that is curable at room temperature such as a two-component-mixture-type resin, a light curable resin, a thermosetting resin, and the like can be used for the sealant 4005. A drying agent may be contained in the sealant 4005.

In addition, if necessary, an optical film, such as a polarizing plate, a circularly polarizing plate (including an elliptically polarizing plate), a retardation plate (a quarter-wave plate or a half-wave plate), or a color filter, may be provided as appropriate on a light-emission side of the light-emitting element. Furthermore, the polarizing plate or the circularly polarizing plate may be provided with an anti-reflection film. For example, anti-glare treatment by which reflected light can be diffused by unevenness of the surface so as to reduce the glare can be performed.

When the light-emitting element has a microcavity structure, light with high color purity can be extracted. Furthermore, when a microcavity structure and a color filter are used in combination, the glare can be reduced and visibility of a display image can be increased.

The first electrode layer and the second electrode layer (each of which is also called a pixel electrode layer, a common electrode layer, a counter electrode layer, or the like) for applying voltage to the display element each have either a light-transmitting property or a light-reflecting property, which depends on the direction in which light is extracted, the position where the electrode layer is provided, the pattern structure of the electrode layer, and the like.

The electrode 4030 and the electrode 4031 can be formed using a light-transmitting conductive material such as indium oxide containing tungsten oxide, indium zinc oxide containing tungsten oxide, indium oxide containing titanium oxide, indium tin oxide, indium tin oxide containing titanium oxide, indium zinc oxide, or indium tin oxide to which silicon oxide is added.

For example, the electrode 4030 and the electrode 4031 each can also be formed using one or more kinds selected from a metal such as tungsten (W), molybdenum (Mo), zirconium (Zr), hafnium (Hf), vanadium (V), niobium (Nb), tantalum (Ta), palladium (Pd), chromium (Cr), cobalt (Co), nickel (Ni), titanium (Ti), platinum (Pt), aluminum (Al), copper (Cu), or silver (Ag); an alloy thereof; and a nitride thereof.

For example, a conductive composition containing a conductive high molecule (also called a conductive polymer) can also be used for the electrode 4030 and the electrode 4031. As the conductive high molecule, a so-called π-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof can be given.

When the light-emitting element 4513 has a top emission structure, the electrode 4030 is formed using a conductive material having high light reflectivity. An example of such a material is a material containing Al, Ag, or the like. Stacked layers of a conductive material having high light reflectivity and a conductive material having a light-transmitting property may be used. In addition, the electrode 4031 is formed using a conductive material having a light-transmitting property.

When the light-emitting element 4513 has a bottom emission structure, the electrode 4030 is formed using a conductive material having a light-transmitting property and the electrode 4031 is formed using a conductive material having high light reflectivity.

When the light-emitting element 4513 has a dual emission structure, the electrodes 4030 and 4031 are each formed using a conductive material having a light-transmitting property.

Since the transistor is easily broken owing to static electricity or the like, a protection circuit for protecting the driver circuit is preferably provided. The protection circuit is preferably formed using a nonlinear element.

With the use of the transistor described in the above embodiment, a highly reliable display device can be provided. With the use of the transistor described in the above embodiment, a display device that has a high resolution, a large size, and high display quality can be provided. Furthermore, a display device with low power consumption can be provided.

Figure 31:
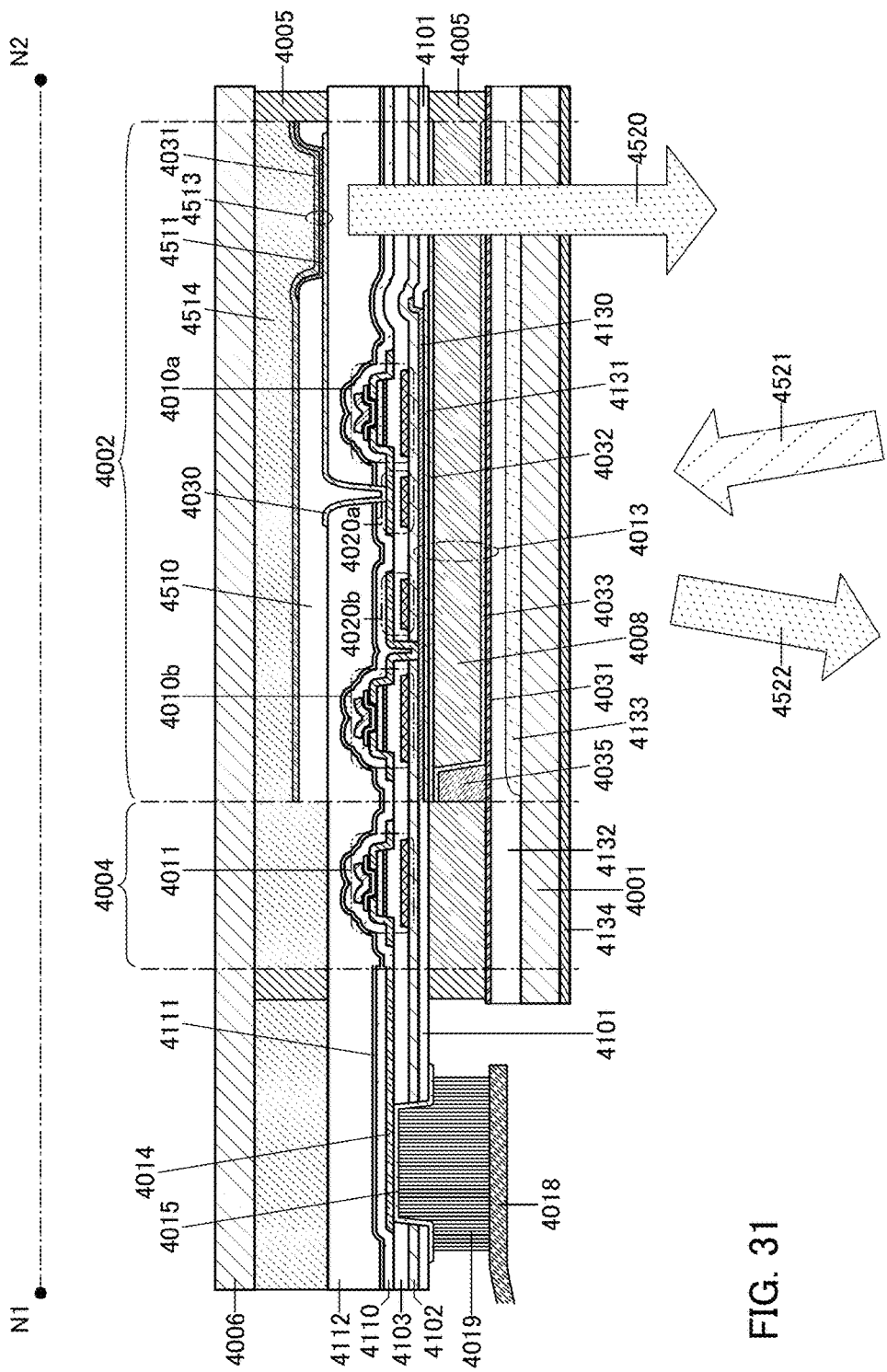
FIG. 31 illustrates an example of a display device.

FIG. 31 shows an example of a cross-sectional structure of a display device including an EL element and a liquid crystal element in one pixel, as another display device example. Note that description is made mainly on portions different from the display device in FIG. 30 to avoid repeated description.

The display device illustrated in FIG. 31 includes a transistor 4010a, a transistor 4010b, a capacitor 4020a, and a capacitor 4020b over the insulating layer 4102. The transistors 4010a and 4010b have the same structure as the transistor 4010. The capacitors 4020a and 4020b have the same structure as the capacitor 4020. The transistor 4010a has a function of driving the light-emitting element 4513 and the transistor 4010b has a function of driving the liquid crystal element 4013.

The display device illustrated in FIG. 31 includes, below the insulating layer 4102, a reflective electrode 4130, an insulating layer 4101, an electrode 4131, an alignment film 4032, a liquid crystal layer 4008, an alignment film 4033, a spacer 4035, an electrode 4132, an overcoat layer 4133, a coloring layer 4134, a substrate 4001, and a polarizing plate 4135.

In the display device illustrated in FIG. 31, the electrode 4015 is electrically connected to the wiring 4014 in an opening formed in the insulating layers 4101, 4102, and 4103.

The liquid crystal element 4013 includes the electrode 4131, the electrode 4132, and the liquid crystal layer 4008. The alignment films 4032 and 4033 are provided so that the liquid crystal layer 4008 is positioned therebetween. The electrodes 4131 and 4132 overlap with each other with the liquid crystal layer 4008 positioned therebetween. The electrode 4131 has a region overlapping with the reflective electrode 4130. In addition, the electrode 4131 is electrically connected to one of a source and a drain of the transistor 4010*b* through the reflective electrode 4130.

The spacer 4035 is a columnar spacer obtained by selective etching of an insulating layer and is provided in order to control the distance between the electrode 4131 and the electrode 4132 (a cell gap). Alternatively, a spherical spacer may be used as the spacer 4035.

The display device illustrated in FIG. 31 has functions as a light-emitting display device having a bottom emission structure and as a reflective liquid crystal display device. Light 4520 emitted from the light-emitting element 4513 is extracted through the substrate 4001. Light 4521 entering through the substrate 4001 is reflected by the reflective electrode 4130 and extracted through the substrate 4001. When the light 4521 is transmitted through the coloring layer 4134, light in a specific wavelength range is absorbed, so that the light 4521 becomes light 4522 having a wavelength range different from that of the light 4521. However, if the wavelength range of the entering light 4521 is within the wavelength range of light transmitted through the coloring layer 4134, the wavelength range of the light 4522 is almost the same as that of the light 4521.

The substrates 4001 and 4006 can each be formed using a material similar to that of the substrate 271. The insulating layer 4112 can be formed using a material and a method that are similar to those of the insulating layer 275. The insulating layer 4111 can be formed using a material and a method that are similar to those of the insulating layer 229. The insulating layer 4110 can be formed using a material and a method that are similar to those of the insulating layer 228. The insulating layer 4103 can be formed using a material and a method that are similar to those of the insulating layer 272. The insulating layers 4101 and 4102 can each be formed using a material and a method that are similar to those of the insulating layer 281.

The reflective electrode 4130, the electrode 4131, and the electrode 4132 can each be formed using a material and a method that are similar to those of the electrode 4030 or the electrode 4031. In the display device illustrated in FIG. 31, the reflective electrode 4130 is formed using a conductive material having high light reflectivity and the electrodes 4131 and 4132 are formed using a conductive material having a light-transmitting property.

For the overcoat layer 4133, an organic insulating layer of an acrylic resin, an epoxy resin, polyimide, or the like can be used. With the overcoat layer 4133, diffusion of an impurity or the like contained in the coloring layer 4134 into the transistors, the display elements, or the like can be inhibited, for example. Note that the overcoat layer 4133 is not necessarily provided and a structure in which the overcoat layer 4133 is not formed may be employed.

[Display Module]

Figure 32:
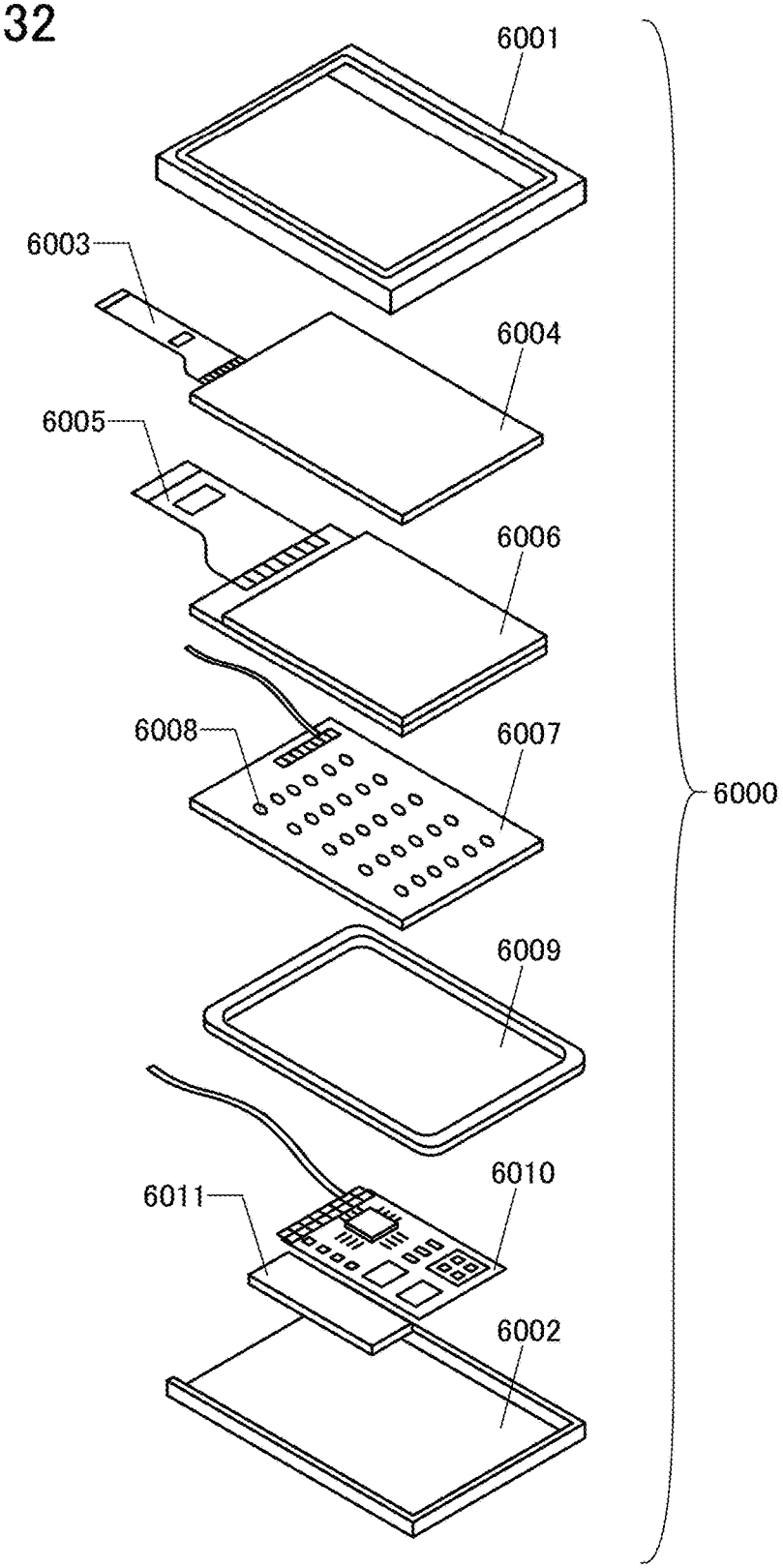
FIG. 32 illustrates an example of a display module.

A display module is described as an example of a semiconductor device using the above-described transistor. In a display module 6000 in FIG. 32, a touch sensor 6004 connected to an FPC 6003, a display panel 6006 connected to an FPC 6005, a backlight unit 6007, a frame 6009, a printed circuit board 6010, and a battery 6011 are provided between an upper cover 6001 and a lower cover 6002. Note that the backlight unit 6007, the battery 6011, the touch sensor 6004, and the like are not provided in some cases.

The semiconductor device of one embodiment of the present invention can be used for, for example, the touch sensor 6004, the display panel 6006, an integrated circuit mounted on the printed circuit board 6010, and the like. For example, the above-described display device can be used in the display panel 6006

The shapes and sizes of the upper cover 6001 and the lower cover 6002 can be changed as appropriate in accordance with the sizes of the touch sensor 6004, the display panel 6006, and the like.

The touch sensor 6004 can be a resistive touch sensor or a capacitive touch sensor and can be formed to overlap with the display panel 6006. The display panel 6006 can have a touch sensor function. For example, an electrode for a touch sensor can be provided in each pixel of the display panel 6006 so that a capacitive touch panel function is added. Alternatively, a photosensor can be provided in each pixel of the display panel 6006 so that an optical touch sensor function is added.

The backlight unit 6007 includes a light source 6008. The light source 6008 may be provided at an end portion of the backlight unit 6007 and a light diffusing plate may be used. When a light-emitting display device or the like is used for the display panel 6006, the backlight unit 6007 can be omitted.

The frame 6009 protects the display panel 6006 and also functions as an electromagnetic shield for blocking electromagnetic waves generated from the printed circuit board 6010 side. The frame 6009 may function as a radiator plate.

The printed circuit board 6010 has a power supply circuit, a signal processing circuit for outputting a video signal and a clock signal, and the like. As a power source for supplying power to the power supply circuit, the battery 6011 or a commercial power source may be used. Note that the battery 6011 can be omitted in the case where a commercial power source is used as the power source.

The display module 6000 can be additionally provided with a member such as a polarizing plate, a retardation plate, or a prism sheet.

This embodiment can be combined as appropriate with any of the other embodiments and examples in this specification.

Embodiment 6

In this embodiment, examples of electronic devices including any of the semiconductor devices disclosed in this specification and the like are described.

Specific examples of the electronic device that uses the semiconductor device of one embodiment of the present invention are as follows: display devices of televisions, monitors, and the like, lighting devices, desktop and laptop personal computers, word processors, image reproduction devices that reproduce still images and moving images stored in recording media such as digital versatile discs (DVDs), portable CD players, radios, tape recorders, headphone stereos, stereos, table clocks, wall clocks, cordless phone handsets, transceivers, car phones, mobile phones, portable information terminals, tablet terminals, portable game machines, stationary game machines such as pachinko machines, calculators, electronic notebooks, e-book readers, electronic translators, audio input devices, video cameras, digital still cameras, electric shavers, high-frequency heating appliances such as microwave ovens, electric rice cookers, electric washing machines, electric vacuum cleaners, water heaters, electric fans, hair dryers, air-conditioning systems such as air conditioners, humidifiers, and dehumidifiers, dishwashers, dish dryers, clothes dryers, futon dryers, electric refrigerators, electric freezers, electric refrigerator-freezers, freezers for preserving DNA, flashlights, electrical tools such as a chain saw, smoke detectors, and medical equipment such as dialyzers. Further examples include the following industrial equipment: guide lights, traffic lights, belt conveyors, elevators, escalators, industrial robots, power storage systems, and power storage devices for leveling the amount of power supply and smart grid. In addition, moving objects and the like driven by electric motors using power from non-aqueous secondary batteries and fuel engines may also be included in the range of electronic devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, spacecrafts, and the like.

Figure 33A:
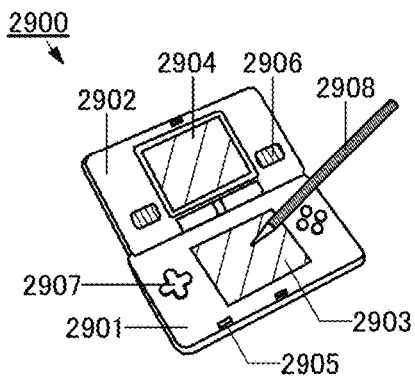
FIGS. 33A to 33H each illustrate an electronic device.

A portable game machine 2900 illustrated in FIG. 33A includes a housing 2901, a housing 2902, a display portion 2903, a display portion 2904, a microphone 2905, a speaker 2906, an operation switch 2907, and the like. In addition, the portable game machine 2900 includes an antenna, a battery, and the like inside the housing 2901. Although the portable game machine in FIG. 33A has the two display portions 2903 and 2904, the number of display portions is not limited to this. The display portion 2903 is provided with a touch screen as an input device, which can be handled with a stylus 2908 or the like.

Figure 33B:
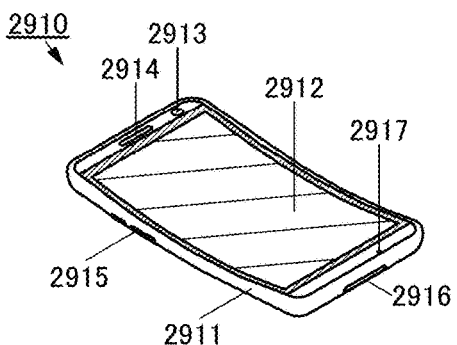

An information terminal 2910 illustrated in FIG. 33B includes a housing 2911, a display portion 2912, a microphone 2917, a speaker portion 2914, a camera 2913, an external connection portion 2916, an operation switch 2915, and the like. A display panel and a touch screen that uses a flexible substrate are provided in the display portion 2912. In addition, the information terminal 2910 includes an antenna, a battery, and the like inside the housing 2911. The information terminal 2910 can be used as, for example, a smartphone, a mobile phone, a tablet information terminal, a tablet personal computer, or an e-book reader.

Figure 33C:
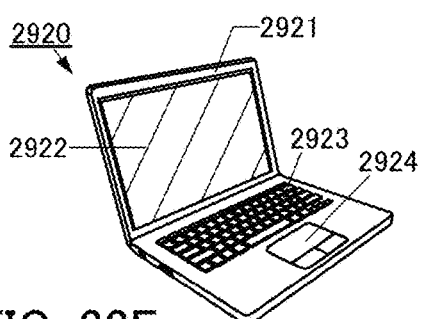

A notebook personal computer 2920 illustrated in FIG. 33C includes a housing 2921, a display portion 2922, a keyboard 2923, a pointing device 2924, and the like. In addition, the notebook personal computer 2920 includes an antenna, a battery, and the like inside the housing 2921.

Figure 33D:
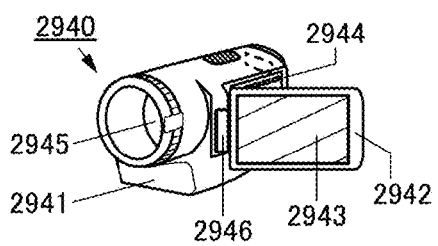

A video camera 2940 illustrated in FIG. 33D includes a housing 2941, a housing 2942, a display portion 2943, operation switches 2944, a lens 2945, a joint 2946, and the like. The operation switches 2944 and the lens 2945 are provided for the housing 2941, and the display portion 2943 is provided for the housing 2942. In addition, the video camera 2940 includes an antenna, a battery, and the like inside the housing 2941. The housing 2941 and the housing 2942 are connected to each other with the joint 2946, and the angle between the housing 2941 and the housing 2942 can be changed with the joint 2946. The orientation of an image on the display portion 2943 may be changed and display and non-display of an image may be switched depending on the angle between the housings 2941 and 2942.

Figure 33E:
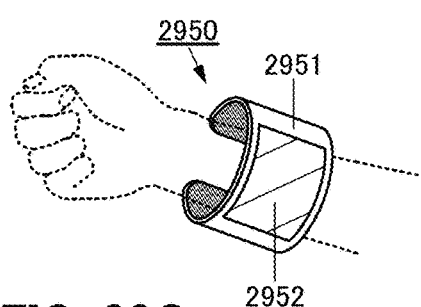

FIG. 33E illustrates an example of a bangle-type information terminal. An information terminal 2950 includes a housing 2951, a display portion 2952, and the like. In addition, the information terminal 2950 includes an antenna, a battery, and the like inside the housing 2951. The display portion 2952 is supported by the housing 2951 having a curved surface. A display panel formed with a flexible substrate is provided in the display portion 2952, whereby the information terminal 2950 can be a user-friendly information terminal that is flexible and lightweight.

Figure 33F:
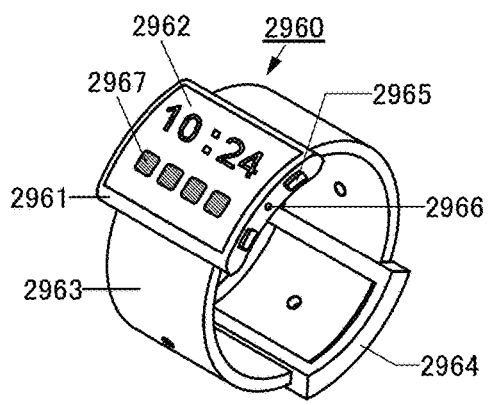

FIG. 33F illustrates an example of a watch-type information terminal. An information terminal 2960 includes a housing 2961, a display portion 2962, a band 2963, a buckle 2964, an operation switch 2965, an input/output terminal 2966, and the like. In addition, the information terminal 2960 includes an antenna, a battery, and the like inside the housing 2961. The information terminal 2960 is capable of executing a variety of applications such as mobile phone calls, e-mailing, text viewing and editing, music reproduction, Internet communication, and computer games.

The display surface of the display portion 2962 is bent, and images can be displayed on the bent display surface. Furthermore, the display portion 2962 includes a touch sensor, and operation can be performed by touching the screen with a finger, a stylus, or the like. For example, an application can be started by touching an icon 2967 displayed on the display portion 2962. With the operation switch 2965, a variety of functions such as time setting, ON/OFF of the power, ON/OFF of wireless communication, setting and cancellation of a silent mode, and setting and cancellation of a power saving mode can be performed. For example, the functions of the operation switch 2965 can be set by setting the operating system incorporated in the information terminal 2960.

The information terminal 2960 can employ near field communication that is a communication method based on an existing communication standard. In that case, for example, mutual communication between the information terminal 2960 and a headset capable of wireless communication can be performed, and thus hands-free calling is possible. Moreover, the information terminal 2960 includes the input/output terminal 2966, and data can be directly transmitted to and received from another information terminal via a connector. Power charging through the input/output terminal 2966 is possible. Note that the charging operation may be performed by wireless power feeding without using the input/output terminal 2966.

Figure 33G:
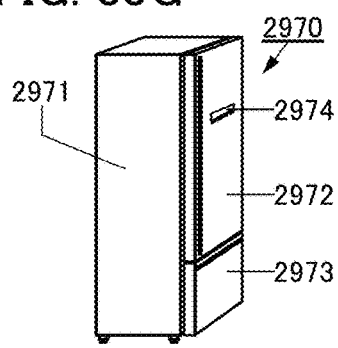

FIG. 33G illustrates an electric refrigerator-freezer as an example of a home electric device. An electric refrigerator-freezer 2970 includes a housing 2971, a refrigerator door 2972, a freezer door 2973, a display portion 2974, and the like.

Figure 33H:
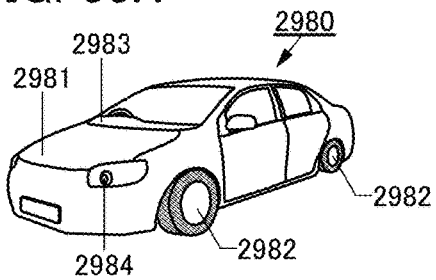

FIG. 33H is an external view illustrating an example of a car. A car 2980 includes a car body 2981, wheels 2982, a dashboard 2983, lights 2984, and the like. The car 2980 includes an antenna, a battery, and the like.

The electronic devices shown in this embodiment each include the semiconductor device of one embodiment of the present invention.

This embodiment can be implemented in an appropriate combination with any of the structures described in the other embodiments.

Embodiment 7

<Composition of CAC-OS>

Described below is the composition of a cloud aligned complementary oxide semiconductor (CAC-OS) applicable to a transistor disclosed in one embodiment of the present invention.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is called an oxide semiconductor in some cases. In other words, an OS FET is a transistor including a metal oxide or an oxide semiconductor.

In this specification, a metal oxide in which regions functioning as a conductor and regions functioning as a dielectric are mixed and which functions as a semiconductor as a whole is defined as a CAC-OS or a CAC-metal oxide.

The CAC-OS has, for example, a composition in which elements included in an oxide semiconductor are unevenly distributed. Materials including unevenly distributed elements each have a size of greater than or equal to 0.5 nm and less than or equal to 10 nm, preferably greater than or equal to 0.5 nm and less than or equal to 3 nm, or a similar size. Note that in the following description of an oxide semiconductor, a state in which one or more elements are unevenly distributed and regions including the element(s) are mixed is referred to as a mosaic pattern or a patch-like pattern. The region has a size of greater than or equal to 0.5 nm and less than or equal to 10 nm, preferably greater than or equal to 0.5 nm and less than or equal to 3 nm, or a similar size.

The physical properties of a region including an unevenly distributed element are determined by the properties of the element. For example, a region including an unevenly distributed element which relatively tends to serve as an insulator among elements included in a metal oxide serves as a dielectric region. In contrast, a region including an unevenly distributed element which relatively tends to serve as a conductor among elements included in a metal oxide serves as a conductive region. A material in which conductive regions and dielectric regions are mixed to form a mosaic pattern serves as a semiconductor.

That is, a metal oxide in one embodiment of the present invention is a kind of matrix composite or metal matrix composite, in which materials having different physical properties are mixed.

Note that an oxide semiconductor preferably contains at least indium. In particular, indium and zinc are preferably contained. In addition, an element M (M is one or more of gallium, aluminum, silicon, boron, yttrium, copper, vanadium, beryllium, titanium, iron, nickel, germanium, zirconium, molybdenum, lanthanum, cerium, neodymium, hafnium, tantalum, tungsten, magnesium, and the like) may be contained.

For example, of the CAC-OS, an In—Ga—Zn oxide with the CAC composition (such an In—Ga—Zn oxide may be particularly referred to as CAC-IGZO) has a composition in which materials are separated into indium oxide (InO$_{X1}$, where X1 is a real number greater than 0) or indium zinc oxide (In$_{X2}$Zn$_{Y2}$O$_{Z2}$, where X2, Y2, and Z2 are real numbers greater than 0), and gallium oxide (GaO$_{X3}$, where X3 is a real number greater than 0), gallium zinc oxide (Ga$_{X4}$Zn$_{Y4}$O$_{Z4}$, where X4, Y4, and Z4 are real numbers greater than 0), or the like, and a mosaic pattern is formed. Then, InO$_{X1}$ and In$_{X2}$Zn$_{Y2}$O$_{Z2}$ forming the mosaic pattern are evenly distributed in the film. This composition is also referred to as a cloud-like composition.

That is, the CAC-OS is a composite oxide semiconductor with a composition in which a region including GaO$_{X3}$ as a main component and a region including In$_{X2}$Zn$_{Y2}$O$_{Z2}$ or InO$_{X1}$ as a main component are mixed. Note that in this specification, for example, when the atomic ratio of In to an element M in a first region is greater than the atomic ratio of In to an element M in a second region, the first region has higher In concentration than the second region.

Note that a compound including In, Ga, Zn, and O is also known as IGZO. Typical examples of IGZO include a crystalline compound represented by InGaO$_3$(ZnO)$_{m1}$ (m1 is a natural number) and a crystalline compound represented by In$_{(1+x0)}$Ga$_{(1-x0)}$O$_3$(ZnO)$_{m0}$ ($-1 \leq x0 \leq 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC-OS relates to the material composition of an oxide semiconductor. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure including two or more films with different atomic ratios is not included. For example, a two-layer structure of a film including In as a main component and a film including Ga as a main component is not included.

A boundary between the region including GaO$_{X3}$ as a main component and the region including In$_{X2}$Zn$_{Y2}$O$_{Z2}$ or InO$_{X1}$ as a main component is not clearly observed in some cases.

In the case where one or more of aluminum, silicon, boron, yttrium, copper, vanadium, beryllium, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected element(s) as a main component(s) are observed in part of the CAC-OS and nanoparticle regions including In as a main component are observed in part of the CAC-OS, and these nanoparticle regions are randomly dispersed to form a mosaic pattern in the CAC-OS.

<Analysis of CAC-OS>

Next, measurement results of an oxide semiconductor over a substrate by a variety of methods are described.

<<Structure of Samples and Formation Method Thereof>>

Nine samples of one embodiment of the present invention are described below. The samples are formed at different substrate temperatures and with different ratios of an oxygen gas flow rate in formation of the oxide semiconductor. Note that each sample includes a substrate and an oxide semiconductor over the substrate.

A method for forming the samples is described.

A glass substrate is used as the substrate. Over the glass substrate, a 100-nm-thick In—Ga—Zn oxide is formed as an oxide semiconductor with a sputtering apparatus. The formation conditions are as follows: the pressure in a chamber is 0.6 Pa, and an oxide target (with an atomic ratio of In:Ga:Zn=4:2:4.1) is used as a target. The oxide target provided in the sputtering apparatus is supplied with an AC power of 2500 W.

As for the conditions in the formation of the oxide of the nine samples, the substrate temperature is set to a temperature that is not increased by intentional heating (hereinafter such a temperature is also referred to as room temperature or R.T.), to 130° C., and to 170° C. The ratio of a flow rate of an oxygen gas to a flow rate of a mixed gas of Ar and oxygen (also referred to as an oxygen gas flow rate ratio) is set to 10%, 30%, and 100%.

<<Analysis by X-Ray Diffraction>>

In this section, results of X-ray diffraction (XRD) measurement performed on the nine samples are described. As an XRD apparatus, D8 ADVANCE manufactured by Bruker AXS is used. The conditions are as follows: scanning is performed by an out-of-plane method at θ/2θ, the scanning range is 15 deg. to 50 deg., the step width is 0.02 deg., and the scanning speed is 3.0 deg./min.

Figure 34:
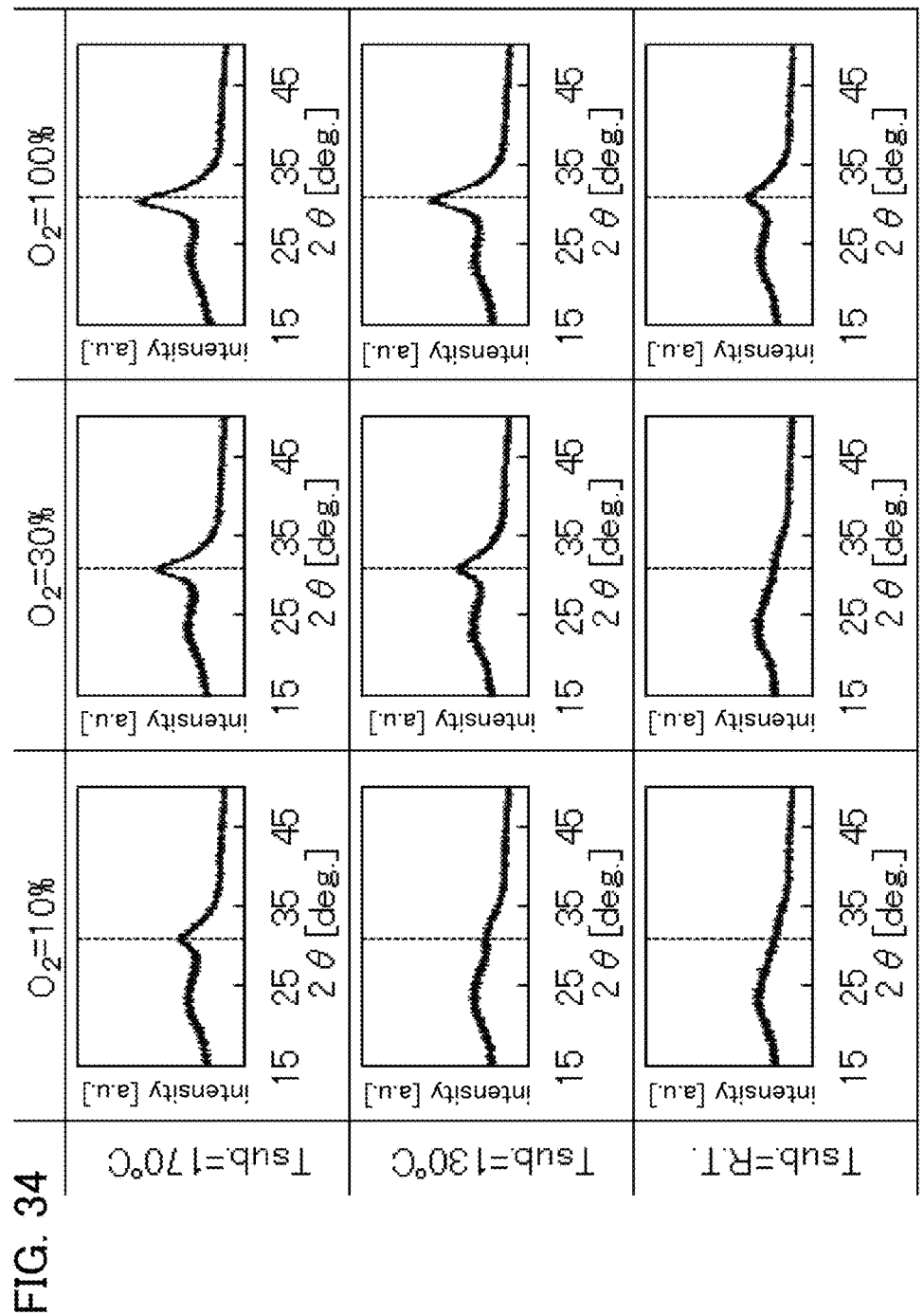
FIG. 34 shows measured XRD spectra of samples.

FIG. 34 shows XRD spectra measured by an out-of-plane method. In FIG. 34, the top row shows the measurement results of the samples formed at a substrate temperature of 170° C.; the middle row shows the measurement results of the samples formed at a substrate temperature of 130° C.; the bottom row shows the measurement results of the samples formed at a substrate temperature of R.T. The left column shows the measurement results of the samples formed with an oxygen gas flow rate ratio of 10%; the middle column shows the measurement results of the samples formed with an oxygen gas flow rate ratio of 30%; the right column shows the measurement results of the samples formed with an oxygen gas flow rate ratio of 100%.

In the XRD spectra shown in FIG. 34, the higher the substrate temperature at the time of formation is or the higher the oxygen gas flow rate ratio at the time of formation is, the higher the intensity of the peak at around 2θ=31° is. Note that it is found that the peak at around 2θ=31° is derived from a crystalline IGZO compound whose c-axes are aligned in a direction substantially perpendicular to a formation surface or a top surface of the crystalline IGZO compound (such a compound is also referred to as c-axis aligned crystalline (CAAC) IGZO).

As shown in the XRD spectra in FIG. 34, as the substrate temperature at the time of formation is lower or the oxygen gas flow rate ratio at the time of formation is lower, a peak becomes less clear. Accordingly, it is found that there are no alignment in the a-b plane direction and c-axis alignment in the measured areas of the samples that are formed at a lower substrate temperature or with a lower oxygen gas flow rate ratio.

<<Analysis with Electron Microscope>>

This section describes the observation and analysis results of the samples formed at a substrate temperature of R.T. and with an oxygen gas flow rate ratio of 10% with a high-angle annular dark-field scanning transmission electron microscope (HAADF-STEM). An image obtained with an HAADF-STEM is also referred to as a TEM image.

Described are the results of image analysis of plan-view images and cross-sectional images obtained with an HAADF-STEM (also referred to as plan-view TEM images and cross-sectional TEM images, respectively). The TEM images are observed with a spherical aberration corrector function. The HAADF-STEM images are obtained using an atomic resolution analytical electron microscope JEM-ARM200F manufactured by JEOL Ltd. under the following conditions: the acceleration voltage is 200 kV, and irradiation with an electron beam with a diameter of approximately 0.1 nm is performed.

Figure 35A:
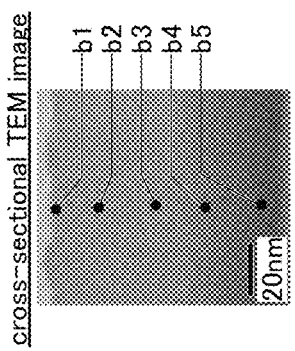
FIGS. 35A and 35B are TEM images of samples and FIGS. 35C to 35L are electron diffraction patterns thereof.
Figure 35B:
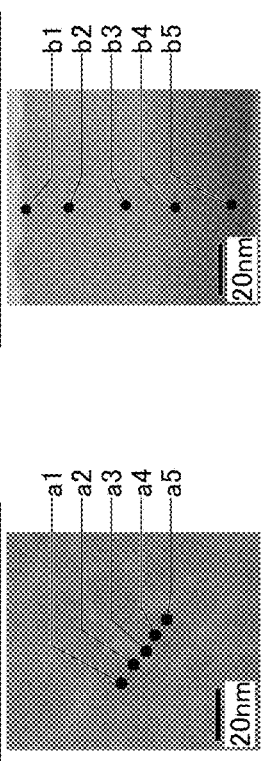
Figure 35C:
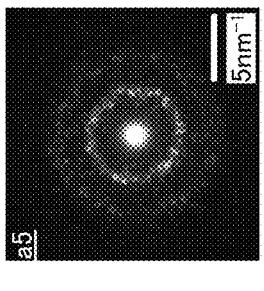
Figure 35D:
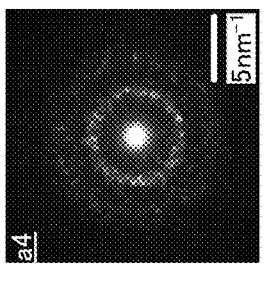
Figure 35E:
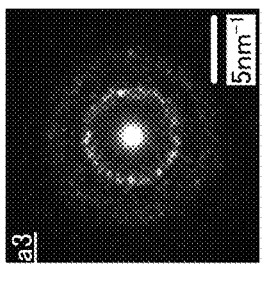
Figure 35F:
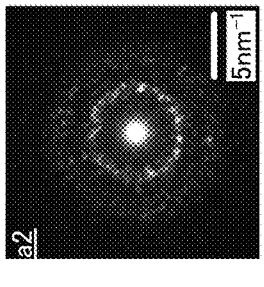
Figure 35G:
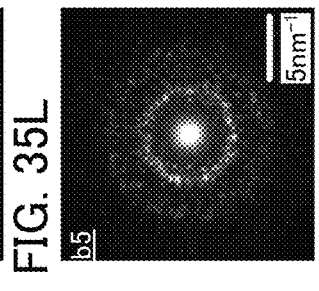
Figure 35H:
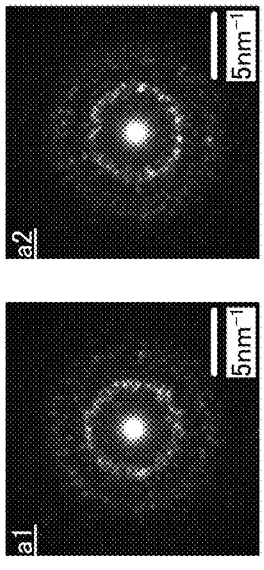
Figure 35I:
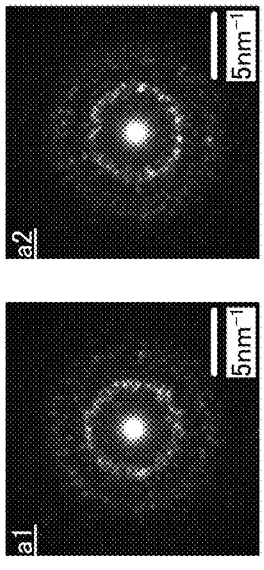
Figure 35J:
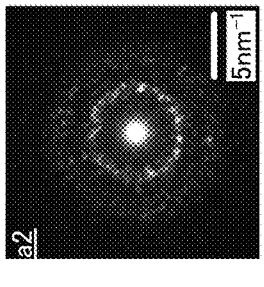
Figure 35K:
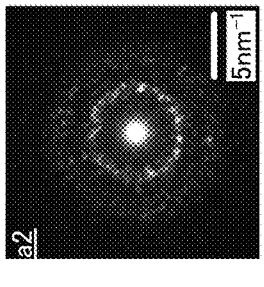
Figure 35L:
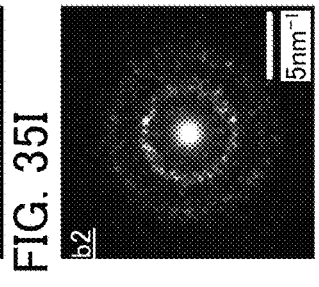

FIG. 35A is a plan-view TEM image of the sample formed at a substrate temperature of R.T. and with an oxygen gas flow rate ratio of 10%. FIG. 35B is a cross-sectional TEM image of the sample formed at a substrate temperature of R.T. and with an oxygen gas flow rate ratio of 10%.

<<Analysis of Electron Diffraction Patterns>>

This section describes electron diffraction patterns obtained by irradiation of the sample formed at a substrate temperature of R.T. and an oxygen gas flow rate ratio of 10% with an electron beam with a probe diameter of 1 nm (also referred to as a nanobeam).

Electron diffraction patterns of points indicated by black dots a1, a2, a3, a4, and a5 in the plan-view TEM image in FIG. 35A of the sample formed at a substrate temperature of R.T. and an oxygen gas flow rate ratio of 10% are observed. Note that the electron diffraction patterns are observed while electron beam irradiation is performed at a constant rate for 35 seconds. FIGS. 35C, 35D, 35E, 35F, and 35G show the results of the points indicated by the black dots a1, a2, a3, a4, and a5, respectively.

In FIGS. 35C, 35D, 35E, 35F, and 35G, regions with high luminance in a circular (ring) pattern can be shown. Furthermore, a plurality of spots can be shown in a ring-like shape.

Electron diffraction patterns of points indicated by black dots b1, b2, b3, b4, and b5 in the cross-sectional TEM image in FIG. 35B of the sample formed at a substrate temperature of R.T. and an oxygen gas flow rate ratio of 10% are observed. FIGS. 35H, 35I, 35J, 35K, and 35L show the results of the points indicated by the black dots b1, b2, b3, b4, and b5, respectively.

In FIGS. 35H, 35I, 35J, 35K, and 35L, regions with high luminance in a ring pattern can be shown. Furthermore, a plurality of spots can be shown in a ring-like shape.

For example, when an electron beam with a probe diameter of 300 nm is incident on a CAAC-OS including an InGaZnO$_4$ crystal in a direction parallel to the sample surface, a diffraction pattern including a spot derived from the (009) plane of the InGaZnO$_4$ crystal is obtained. That is, the CAAC-OS has c-axis alignment and the c-axes are aligned in the direction substantially perpendicular to the formation surface or the top surface of the CAAC-OS. Meanwhile, a ring-like diffraction pattern is shown when an electron beam with a probe diameter of 300 nm is incident on the same sample in a direction perpendicular to the sample surface. That is, it is found that the CAAC-OS has neither a-axis alignment nor b-axis alignment.

Furthermore, a diffraction pattern like a halo pattern is observed when an oxide semiconductor including a nanocrystal (a nanocrystalline oxide semiconductor (nc-OS)) is subjected to electron diffraction using an electron beam with a large probe diameter (e.g., 50 nm or larger). Meanwhile, bright spots are shown in a nanobeam electron diffraction pattern of the nc-OS obtained using an electron beam with a small probe diameter (e.g., smaller than 50 nm). Furthermore, in a nanobeam electron diffraction pattern of the nc-OS, regions with high luminance in a circular (ring) pattern are shown in some cases. Also in a nanobeam electron diffraction pattern of the nc-OS, a plurality of bright spots are shown in a ring-like shape in some cases.

The electron diffraction pattern of the sample formed at a substrate temperature of R.T. and with an oxygen gas flow rate ratio of 10% has regions with high luminance in a ring pattern and a plurality of bright spots appear in the ring-like pattern. Accordingly, the sample formed at a substrate temperature of R.T. and with an oxygen gas flow rate ratio of 10% exhibits an electron diffraction pattern similar to that of the nc-OS and does not show alignment in the plane direction and the cross-sectional direction.

According to what is described above, an oxide semiconductor formed at a low substrate temperature or with a low oxygen gas flow rate ratio is likely to have characteristics distinctly different from those of an oxide semiconductor film having an amorphous structure and an oxide semiconductor film having a single crystal structure.

<<Elementary Analysis>>

This section describes the analysis results of elements included in the sample formed at a substrate temperature of R.T. and with an oxygen gas flow rate ratio of 10%. For the analysis, by energy dispersive X-ray spectroscopy (EDX), EDX mapping images are obtained. An energy dispersive X-ray spectrometer AnalysisStation JED-2300T manufactured by JEOL Ltd. is used as an elementary analysis apparatus in the EDX measurement. A Si drift detector is used to detect an X-ray emitted from the sample.

In the EDX measurement, an EDX spectrum of a point is obtained in such a manner that electron beam irradiation is performed on the point in a detection target region of a sample, and the energy of characteristic X-ray of the sample generated by the irradiation and its frequency are measured. In this embodiment, peaks of an EDX spectrum of the point are attributed to electron transition to the L shell in an In atom, electron transition to the K shell in a Ga atom, and electron transition to the K shell in a Zn atom and the K shell in an O atom, and the proportions of the atoms in the point are calculated. An EDX mapping image indicating distributions of proportions of atoms can be obtained through the process in an analysis target region of a sample.

Figure 36A:
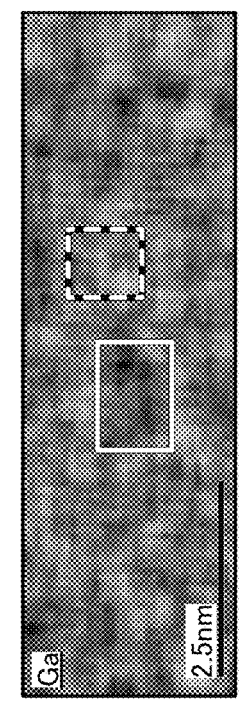
FIGS. 36A to 36C show EDX mapping images of a sample.
Figure 36B:
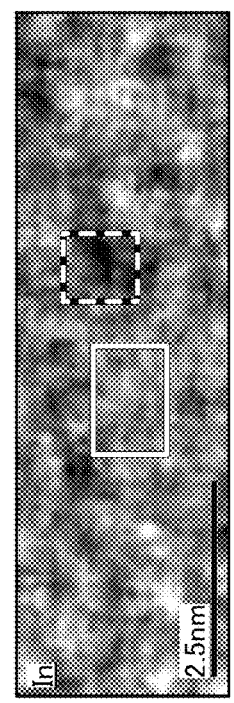
Figure 36C:
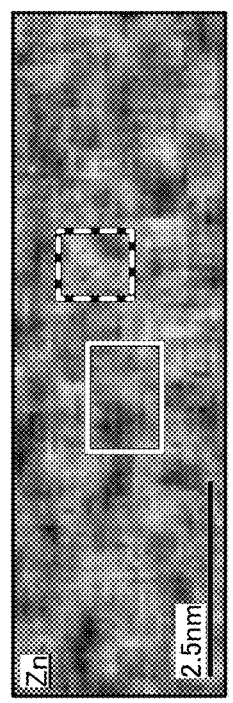

FIGS. 36A to 36C show EDX mapping images in a cross section of the sample formed at a substrate temperature of R.T. and with an oxygen gas flow rate ratio of 10%. FIG. 36A shows an EDX mapping image of Ga atoms. The proportion of the Ga atoms in all the atoms is 1.18 atomic % to 18.64 atomic %. FIG. 36B shows an EDX mapping image of In atoms. The proportion of the In atoms in all the atoms is 9.28 atomic % to 33.74 atomic %. FIG. 36C shows an EDX mapping image of Zn atoms. The proportion of the Zn atoms in all the atoms is 6.69 atomic % to 24.99 atomic %. FIGS. 36A to 36C show the same region in the cross section of the sample formed at a substrate temperature of R.T. and with an oxygen gas flow rate ratio of 10%. In the EDX mapping images, the proportion of an element is indicated by grayscale: the more measured atoms exist in a region, the brighter the region is; the less measured atoms exist in a region, the darker the region is. The magnification of the EDX mapping images in FIGS. 36A to 36C is 7200000 times.

The EDX mapping images in FIGS. 36A to 36C show relative distribution of brightness indicating that each element has a distribution in the sample formed at a substrate temperature of R.T. and with an oxygen gas flow rate ratio of 10%. Areas surrounded by solid lines and areas surrounded by dashed lines in FIGS. 36A to 36C are examined.

In FIG. 36A, a relatively dark region occupies a large area in the area surrounded by the solid line, while a relatively bright region occupies a large area in the area surrounded by the dashed line. In FIG. 36B, a relatively bright region occupies a large area in the area surrounded by the solid line, while a relatively dark region occupies a large area in the area surrounded by the dashed line.

That is, the areas surrounded by the solid lines are regions including a relatively large number of In atoms and the areas surrounded by the dashed lines are regions including a relatively small number of In atoms. In FIG. 36C, the right portion of the area surrounded by the solid line is relatively bright and the left portion thereof is relatively dark. Thus, the area surrounded by the solid line is a region including $In_{X2}Zn_{Y2}O_{Z2}$, $InO_{X1}$, and the like as main components.

The area surrounded by the solid line is a region including a relatively small number of Ga atoms and the area surrounded by the dashed line is a region including a relatively large number of Ga atoms. In FIG. 36C, the upper left portion of the area surrounded by the dashed line is relatively bright and the lower right portion thereof is relatively dark. Thus, the area surrounded by the dashed line is a region including $GaO_{X3}$, $Ga_{X4}Zn_{Y4}O_{Z4}$, and the like as main components.

Furthermore, as shown in FIGS. 36A to 36C, the In atoms are relatively more uniformly distributed than the Ga atoms, and regions including $InO_{X1}$ as a main component is seemingly joined to each other through a region including $In_{X2}Zn_{Y2}O_{Z2}$ as a main component. Thus, the regions including $In_{X2}Zn_{Y2}O_{Z2}$ and $InO_{X1}$ as main components extend like a cloud.

An In—Ga—Zn oxide having a composition in which the regions including $GaO_{X3}$ or the like as a main component and the regions including $In_{X2}Zn_{Y2}O_{Z2}$ or $InO_{X1}$ as a main component are unevenly distributed and mixed can be referred to as a CAC-OS.

The crystal structure of the CAC-OS includes an nc structure. In an electron diffraction pattern of the CAC-OS with the nc structure, several or more bright spots appear in addition to bright sports derived from IGZO including a single crystal, a polycrystal, or a CAAC. Alternatively, the crystal structure is defined as having high luminance regions appearing in a ring pattern in addition to the several or more bright spots.

As shown in FIGS. 36A to 36C, each of the regions including $GaO_{X3}$ or the like as a main component and the regions including $In_{X2}Zn_{Y2}O_{Z2}$ or $InO_{X1}$ as a main component has a size of greater than or equal to 0.5 nm and less than or equal to 10 nm, or greater than or equal to 1 nm and less than or equal to 3 nm. Note that it is preferable that a diameter of a region including each metal element as a main component be greater than or equal to 1 nm and less than or equal to 2 nm in the EDX mapping images.

As described above, the CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of an oxide semiconductor exhibits. Accordingly, when regions including $In_{X2}Zn_{Y2}O_{Z2}$ or $InO_{X1}$ as a main component are distributed in an oxide semiconductor like a cloud, high field-effect mobility ($\mu$) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility ($\mu$) can be achieved.

A semiconductor element including a CAC-OS has high reliability. Thus, the CAC-OS is suitably used in a variety of semiconductor devices typified by a display.

At least part of this embodiment can be implemented in combination with any of the other embodiments and the other examples described in this specification as appropriate.

This application is based on Japanese Patent Application serial no. 2015-157174 filed with Japan Patent Office on Aug. 7, 2015 and Japanese Patent Application serial no.

2016-124397 filed with Japan Patent Office on Jun. 23, 2016, the entire contents of which are hereby incorporated by reference.

What is claimed is:

1. A semiconductor device comprising:
a first transistor;
a second transistor;
a third transistor;
a fourth transistor;
a fifth transistor;
a sixth transistor; and
a capacitor,
wherein one of a source and a drain of the first transistor is electrically connected to a first wiring,
wherein the other of the source and the drain of the first transistor is electrically connected to a first node,
wherein a gate of the first transistor is electrically connected to a second wiring,
wherein one of a source and a drain of the second transistor is electrically connected to the first node,
wherein the other of the source and the drain of the second transistor is electrically connected to a third wiring,
wherein a gate of the second transistor is electrically connected to a fourth wiring,
wherein one of a source and a drain of the third transistor is electrically connected to a fifth wiring,
wherein the other of the source and the drain of the third transistor is electrically connected to a second node,
wherein a gate of the third transistor is electrically connected to the first node,
wherein one of a source and a drain of the fourth transistor is electrically connected to the second node,
wherein the other of the source and the drain of the fourth transistor is electrically connected to a sixth wiring,
wherein a gate of the fourth transistor is electrically connected to a seventh wiring,
wherein one of a source and a drain of the fifth transistor is electrically connected to an eighth wiring,
wherein the other of the source and the drain of the fifth transistor is electrically connected to a ninth wiring,
wherein a gate of the fifth transistor is electrically connected to the second node,
wherein one of a source and a drain of the sixth transistor is electrically connected to the ninth wiring,
wherein the other of the source and the drain of the sixth transistor is electrically connected to a tenth wiring,
wherein a gate of the sixth transistor is electrically connected to the second node, and
wherein one of two electrodes of the capacitor is electrically connected to the first node.

2. The semiconductor device according to claim 1, wherein at least one of the first to sixth transistors comprises an oxide semiconductor.

3. The semiconductor device according to claim 1, further comprising an eleventh wiring, wherein the eleventh wiring is electrically connected to the other of the two electrodes of the capacitor.

4. The semiconductor device according to claim 3, wherein a first signal input to the third wiring, a second signal input to the sixth wiring, a third signal input to the tenth wiring, and a fourth signal input to the eleventh wiring are the same signal.

5. The semiconductor device according to claim 1, further comprising a circuit,
wherein the circuit comprises a seventh transistor,
wherein one of a source and a drain of the seventh transistor is electrically connected to the first wiring.

6. The semiconductor device according to claim 5, wherein the circuit is a pixel circuit.

7. The semiconductor device according to claim 5, wherein the seventh transistor is a driving transistor.

8. An electronic device comprising:
the semiconductor device according to claim 1; and
an antenna, a battery, a housing, a speaker, a microphone, or an operation switch.

9. A semiconductor device comprising:
a first transistor;
a second transistor;
a third transistor;
a fourth transistor;
a fifth transistor;
a sixth transistor;
a seventh transistor;
a capacitor; and
a current source,
wherein one of a source and a drain of the first transistor is electrically connected to a first wiring,
wherein the other of the source and the drain of the first transistor is electrically connected to a first node,
wherein a gate of the first transistor is electrically connected to a second wiring,
wherein one of a source and a drain of the second transistor is electrically connected to the first node,
wherein the other of the source and the drain of the second transistor is electrically connected to a third wiring,
wherein a gate of the second transistor is electrically connected to a fourth wiring,
wherein one of a source and a drain of the third transistor is electrically connected to a fifth wiring,
wherein the other of the source and the drain of the third transistor is electrically connected to a second node,
wherein a gate of the third transistor is electrically connected to the first node,
wherein one of a source and a drain of the fourth transistor is electrically connected to the second node,
wherein the other of the source and the drain of the fourth transistor is electrically connected to a sixth wiring,
wherein a gate of the fourth transistor is electrically connected to a seventh wiring,
wherein one of a source and a drain of the fifth transistor is electrically connected to an eighth wiring,
wherein the other of the source and the drain of the fifth transistor is electrically connected to a ninth wiring,
wherein a gate of the fifth transistor is electrically connected to the second node,
wherein one of a source and a drain of the sixth transistor is electrically connected to the ninth wiring,
wherein the other of the source and the drain of the sixth transistor is electrically connected to a tenth wiring,
wherein a gate of the sixth transistor is electrically connected to the second node,
wherein one of two electrodes of the capacitor is electrically connected to the first node,
wherein one of a source and a drain of the seventh transistor is electrically connected to the current source,
wherein the other of the source and the drain of the seventh transistor is electrically connected to the first node, and
wherein a gate of the seventh transistor is electrically connected to an eleventh wiring.

10. The semiconductor device according to claim 9, wherein at least one of the first to seventh transistors comprises an oxide semiconductor.

11. The semiconductor device according to claim 9, further comprising a twelfth wiring, wherein the twelfth wiring is electrically connected to the other of the two electrodes of the capacitor.

12. The semiconductor device according to claim 11, wherein a first signal input to the third wiring, a second signal input to the sixth wiring, a third signal input to the tenth wiring, and a fourth signal input to the twelfth wiring are the same signal.

13. The semiconductor device according to claim 9, further comprising a circuit,
   wherein the circuit comprises an eighth transistor, and
   wherein one of a source and a drain of the eighth transistor is electrically connected to the first wiring.

14. The semiconductor device according to claim 13, wherein the circuit is a pixel circuit.

15. The semiconductor device according to claim 13, wherein the eighth transistor is a driving transistor.

16. An electronic device comprising:
   the semiconductor device according to claim 9; and
   an antenna, a battery, a housing, a speaker, a microphone, or an operation switch.

* * * * *